(12) United States Patent
Tonami

(10) Patent No.: US 6,876,616 B2
(45) Date of Patent: Apr. 5, 2005

(54) DIGITAL SIGNAL REPRODUCING APPARATUS

(75) Inventor: Junichiro Tonami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 463 days.

(21) Appl. No.: 10/083,494

(22) Filed: Feb. 27, 2002

(65) Prior Publication Data

US 2002/0130798 A1 Sep. 19, 2002

(30) Foreign Application Priority Data

| Mar. 13, 2001 | (JP) | ....................................... 2001-070015 |
| Mar. 21, 2001 | (JP) | ....................................... 2001-080206 |
| Apr. 6, 2001 | (JP) | ....................................... 2001-108236 |
| Apr. 10, 2001 | (JP) | ....................................... 2001-111099 |

(51) Int. Cl.[7] ............................................. G11B 7/005
(52) U.S. Cl. ................................ 369/59.17; 369/59.18; 369/59.21
(58) Field of Search .......................... 369/59.17, 59.18, 369/59.21, 59.1

(56) References Cited

U.S. PATENT DOCUMENTS

| 5,974,088 A | * | 10/1999 | Chang ......................... 375/244 |
| 6,104,682 A | * | 8/2000 | Konishi .................... 369/44.34 |
| 2001/0055251 A1 | * | 12/2001 | Konishi et al. ........... 369/47.17 |

FOREIGN PATENT DOCUMENTS

| JP | 10-106161 | 4/1998 |
| JP | 10-269701 | 10/1998 |

OTHER PUBLICATIONS

"A Study of Digital Auto Equalizer and PLL System Using Maximum Likelihood Error for Digital VCRs" by Tonami et al.; IEEE Transactions on Consumer Electronics, vol. 43, No. 3, Aug. 1997, pp. 934–944.

* cited by examiner

Primary Examiner—Thang V. Tran
Assistant Examiner—Michael V. Battaglia
(74) Attorney, Agent, or Firm—Louis Woo

(57) ABSTRACT

A binarizing device operates for controlling a slice level relative to a DC level of a reproduced signal in response to a slice level control signal to generate a controlling-resultant slice level, and for comparing the reproduced signal with the controlling-resultant slice level to convert the reproduced signal into a binary signal. A signal generating device operates for generating the slice level control signal in response to the binary signal. An offset detecting device operates for detecting an offset in a modulation-resultant-code pattern in response to the binary signal, and for generating code pattern offset information in response to the detected offset. An offset-responsive controlling device operates for implementing one of (1) changing a response characteristic of a loop formed by the binarizing device and the signal generating device and (2) suspending the slice level control by the binarizing device in response to the code pattern offset information.

2 Claims, 42 Drawing Sheets

SLICE LEVEL

SLICE LEVEL

SLICE LEVEL

SLICE LEVEL

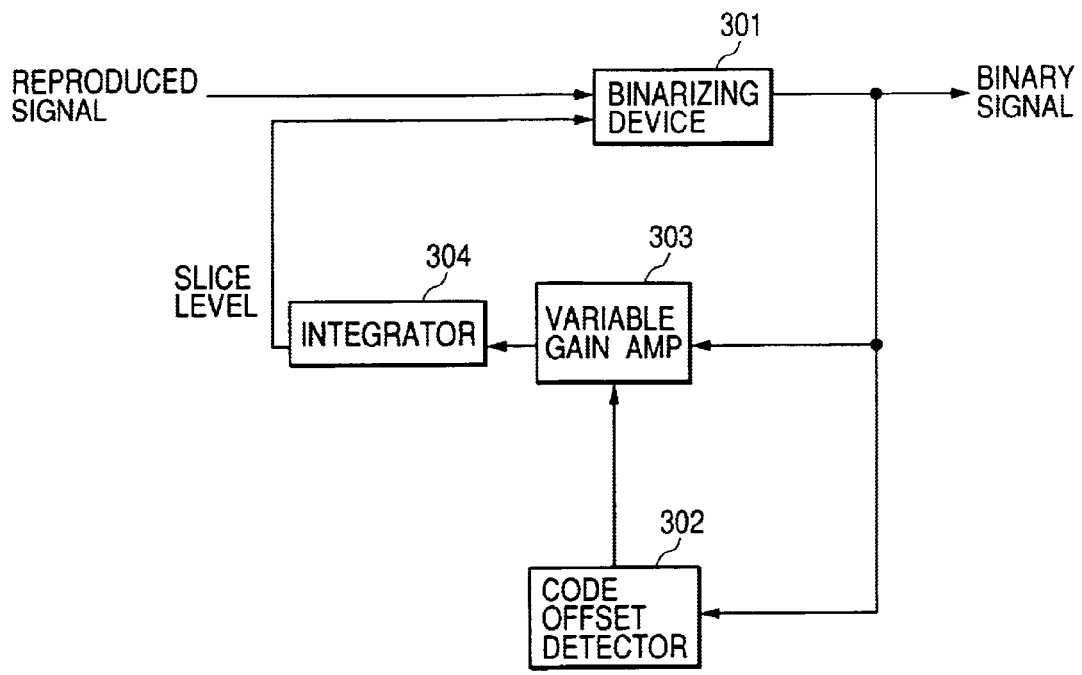
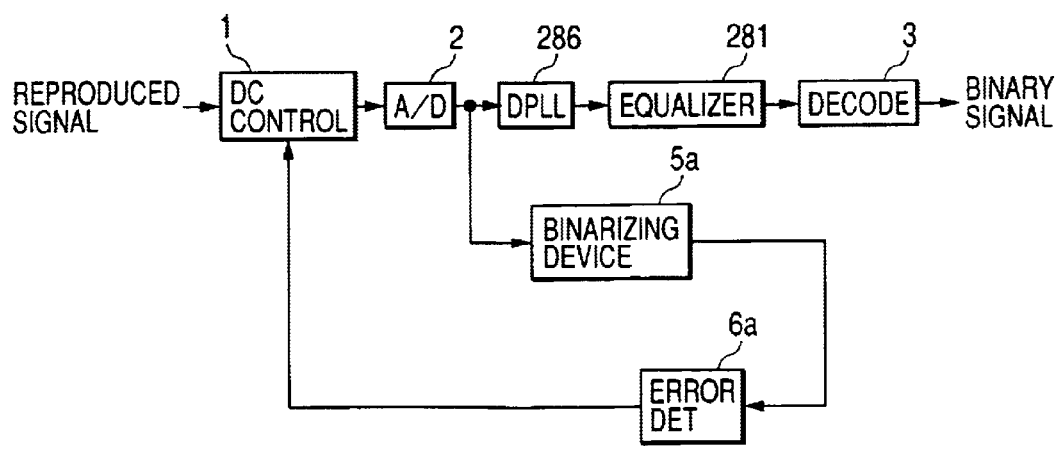

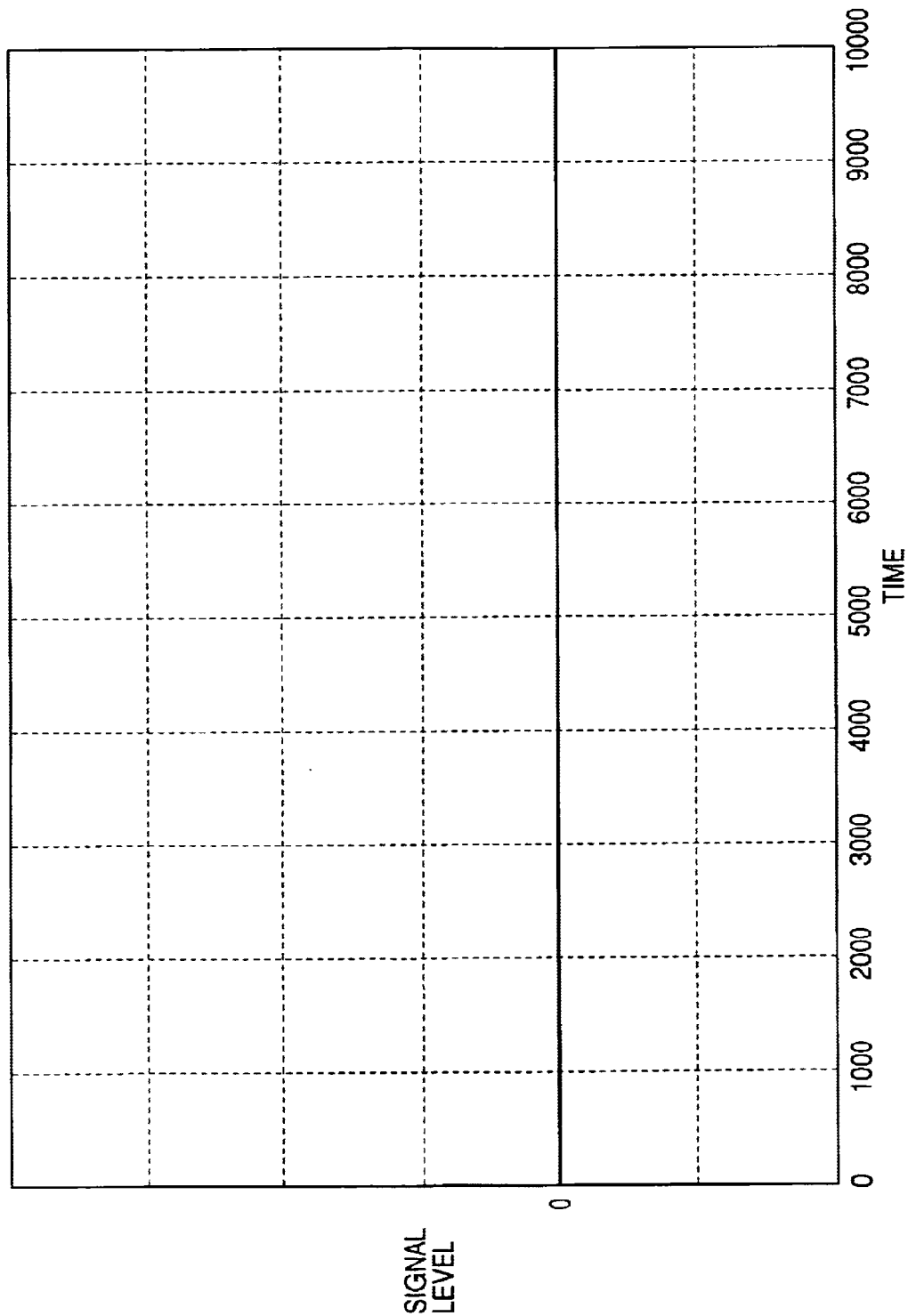

DIGITAL SIGNAL REPRODUCING APPARATUS

BACKGROUND OF THE INVENTION

1. Field of the Invention

This invention generally relates to an apparatus for reproducing a digital signal. This invention particularly relates to an apparatus for processing a signal read out from a recording medium such as an optical disc to reproduce a digital signal therefrom.

2. Description of the Related Art

Some recording mediums such as optical discs store signals representative of digital information or binary information. In general, a signal reproduced from such a recording medium has an analog waveform reflecting a binary digital signal. The reproduced analog-waveform signal is compared with a slice level, being converted into a reproduced binary digital signal indicating a stream of bits each being "0" or "1".

Regarding rewritable optical discs, the recording sensitivity varies from disc to disc. Optical discs are accessed by optical heads using semiconductor lasers. The variation in recording sensitivity and the ageing of semiconductor lasers cause variations in shapes of signals recorded on optical discs. Due to the variations in the recorded signals, analog-waveform signals reproduced from the optical discs tend to change in DC components or to be asymmetric between upper waveform portions and lower waveform portions. In order to compensate for these undesirable changes of the reproduced signals, slice levels for reproducing binary digital signals are controlled.

In a first known control procedure, the DC components of a reproduced analog-waveform signal is detected, and a slice level is controlled in response to the detected DC components. In a second known control procedure, the error of the duty cycle of a binary digital signal reproduced from an analog-waveform signal is detected, and a slice level is controlled in response to the detected error. In a third known control procedure, the DC components of a reproduced analog-waveform signal is detected, and the DC level of the reproduced analog-waveform signal is controlled in response to the detected DC components to implement relative control of a slice level. In a fourth known control procedure, the error of the duty cycle of a binary digital signal reproduced from an analog-waveform signal is detected, and the DC level of the analog-waveform signal is controlled in response to the detected error to implement relative control of a slice level.

According to the DVD (digital versatile disc) standards, the error of the duty cycle of a binary digital signal reproduced from an analog-waveform signal is detected, and a slice level is controlled in response to the detected error.

The slice-level control responsive to the duty-cycle error or the DC signal components tends to be useless in the case where a binary digital signal represented by a reproduced analog-waveform signal has an appreciable difference in number between "0" and "1".

Known DVD recording sides suppress low-frequency components of modulation-resultant recorded signals by using a DSV (digital sum value or digital sum variation) control procedure, a substitute encoding table, a sync pattern, or connection bits. The suppression of the low-frequency signal components is good for control of slice levels in DVD reproducing sides.

SUMMARY OF THE INVENTION

It is an object of this invention to provide an improved apparatus for reproducing a digital signal.

A first aspect of this invention provides a digital signal reproducing apparatus comprising DC controlling means for controlling a DC level of a reproduced signal in response to a DC level control signal; sampling means for sampling an output signal from the DC controlling means to generate a sampling-resultant signal; filtering means for filtering the sampling-resultant signal into a filtering-resultant signal; binarizing means for converting one of (1) the sampling-resultant signal and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; offset-responsive controlling means for implementing one of (1) changing a response characteristic of a loop formed by the DC controlling means, the sampling means, the binarizing means, and the DC level control signal generating means and (2) suspending the DC level control by the DC controlling means in response to the code pattern offset information; subtracting means for subtracting a DC offset signal from one of (1) the reproduced signal, (2) the sampling-resultant signal, and (3) the filtering-resultant signal to generate a subtraction-resultant signal; and DC offset extracting means for extracting low-frequency components from one of (1) the sampling-resultant signal, (2) the filtering-resultant signal, and (3) the subtraction-resultant signal as the DC offset signal, the low-frequency components corresponding to zero-cross sampling points.

A second aspect of this invention provides a digital signal reproducing apparatus comprising sampling means for sampling a reproduced signal to generate a sampling-resultant signal; DC controlling means for controlling a DC level of the sampling-resultant signal in response to a DC level control signal; filtering means for filtering an output signal from the DC controlling means into a filtering-resultant signal; binarizing means for converting one of (1) the output signal from the DC controlling means and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; offset-responsive controlling means for implementing one of (1) changing a response characteristic of a loop formed by the DC controlling means, the binarizing means, and the DC level control signal generating means and (2) suspending the DC level control by the DC controlling means in response to the code pattern offset information; subtracting means for subtracting a DC offset signal from one of (1) the sampling-resultant signal and (2) the filtering-resultant signal to generate a subtraction-resultant signal; and DC offset extracting means for extracting low-frequency components from one of (1) the sampling-resultant signal, (2) the filtering-resultant signal, and (3) the subtraction-resultant signal as the DC offset signal, the low-frequency components corresponding to zero-cross sampling points.

A third aspect of this invention provides a digital signal reproducing apparatus comprising sampling means for sampling a reproduced signal to generate a sampling-resultant signal; filtering means for filtering the sampling-resultant signal into a filtering-resultant signal; DC controlling means for controlling a DC level of the sampling-resultant signal in response to a DC level control signal; binarizing means for converting one of (1) the sampling-resultant signal and (2) the filtering-resultant signal into a binary signal; DC level control signal generating means for generating the DC level control signal in response to the binary signal, and for outputting the DC level control signal to the DC controlling means;

code offset detecting means for detecting an offset in a modulation-resultant-code pattern in response to the binary signal, and for generating code pattern offset information in response to the detected offset in the modulation-resultant-code pattern; offset-responsive controlling means for controlling the DC controlling means in response to the code pattern offset information;

subtracting means for subtracting a DC offset signal from one of (1) the sampling-resultant signal and (2) the filtering-resultant signal to generate a subtraction-resultant signal; and DC offset extracting means for extracting low-frequency components from one of (1) the sampling-resultant signal, (2) the filtering-resultant signal, and (3) the subtraction-resultant signal as the DC offset signal, the low-frequency components corresponding to zero-cross sampling points.

A fourth aspect of this invention provides a digital signal reproducing apparatus comprising DC controlling means for controlling a DC level of a reproduced signal in response to a DC level control signal; sampling means for sampling an output signal from the DC controlling means to generate a sampling-resultant signal; DPLL means for resampling the sampling-resultant signal to generate a resampling-resultant signal having a channel bit rate;

filtering means for filtering the resampling-resultant signal into a filtering-resultant signal; binarizing means for converting one of (1) the resampling-resultant signal and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; offset-responsive controlling means for implementing one of (1) changing a response characteristic of a loop formed by the DC controlling means, the sampling means, the binarizing means, and the DC level control signal generating means and (2) suspending the DC level control by the DC controlling means in response to the code pattern offset information; subtracting means for subtracting a DC offset signal from one of (1) the sampling-resultant signal, (2) the resampling-resultant signal, and (3) the filtering-resultant signal to generate a subtraction-resultant signal; and DC offset extracting means for extracting low-frequency components from one of (1) the resampling-resultant signal, (2) the filtering-resultant signal, and (3) the subtraction-resultant signal as the DC offset signal, the low-frequency components corresponding to zero-cross sampling points.

A fifth aspect of this invention provides a digital signal reproducing apparatus comprising binarizing means for controlling a slice level relative to a DC level of a reproduced signal in response to a slice level control signal to generate a controlling-resultant slice level, and for comparing the reproduced signal with the controlling-resultant slice level to convert the reproduced signal into a binary signal; slice level control signal generating means for generating the slice level control signal in response to the binary signal, and for outputting the slice level control signal to the binarizing means; code offset detecting means for detecting an offset in a modulation-resultant-code pattern in response to the binary signal, and for generating code pattern offset information in response to the detected offset in the modulation-resultant-code pattern; and offset-responsive controlling means for implementing one of (1) changing a response characteristic of a loop formed by the binarizing means and the slice level control signal generating means and (2) suspending the slice level control by the binarizing means in response to the code pattern offset information.

A sixth aspect of this invention provides a digital signal reproducing apparatus comprising DC controlling means for controlling a DC level of a reproduced signal in response to a DC level control signal; sampling means for sampling an output signal from the DC controlling means to generate a sampling-resultant signal; filtering means for filtering the sampling-resultant signal into a filtering-resultant signal; binarizing means for converting one of (1) the sampling-resultant signal and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; and offset-responsive controlling means for implementing one of (1) changing a response characteristic of a loop formed by the DC controlling means, the sampling means, the binarizing means, and the DC level control signal generating means and (2) suspending the DC level control by the DC controlling means in response to the code pattern offset information.

A seventh aspect of this invention provides a digital signal reproducing apparatus comprising sampling means for sampling a reproduced signal to generate a sampling-resultant signal; DC controlling means for controlling a DC level of the sampling-resultant signal in response to a DC level control signal; filtering means for filtering an output signal from the DC controlling means into a filtering-resultant signal; binarizing means for converting one of (1) the output signal from the DC controlling means and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; and offset-responsive controlling means for implementing one of (1) changing a response characteristic of a loop formed by the DC controlling means, the binarizing means, and the DC level control signal generating means and (2) suspending the DC level control by the DC controlling means in response to the code pattern offset information.

An eighth aspect of this invention provides a digital signal reproducing apparatus comprising sampling means for sampling a reproduced signal to generate a sampling-resultant signal; filtering means for filtering the sampling-resultant signal into a filtering-resultant signal; DC controlling means for controlling a DC level of the sampling-resultant signal in response to a DC level control signal; binarizing means for converting one of (1) the sampling-resultant signal and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; and offset-responsive controlling means for controlling the DC controlling means in response to the code pattern offset information.

A ninth aspect of this invention provides a digital signal reproducing apparatus comprising DC controlling means for controlling a DC level of a reproduced signal in response to a DC level control signal; sampling means for sampling an output signal from the DC controlling means to generate a sampling-resultant signal; DPLL means for resampling the sampling-resultant signal to generate a resampling-resultant signal having a channel bit rate; filtering means for filtering the resampling-resultant signal into a filtering-resultant signal; binarizing means for converting one of (1) the resampling-resultant signal and (2) the filtering-resultant signal into a binary signal; DC level control signal generating means for generating the DC level control signal in response to the binary signal, and for outputting the DC level control signal to the DC controlling means; code offset detecting means for detecting an offset in a modulation-resultant-code pattern in response to the binary signal, and for generating code pattern offset information in response to the detected offset in the modulation-resultant-code pattern; and offset-responsive controlling means for implementing one of (1) changing a response characteristic of a loop formed by the DC controlling means, the sampling means, the binarizing means, and the DC level control signal generating means and (2) suspending the DC level control by the DC controlling means in response to the code pattern offset information.

A tenth aspect of this invention is based on the fifth aspect thereof, and provides a digital signal reproducing apparatus wherein the code offset detecting means comprises offset extracting means for extracting one of (1) low-frequency components and (2) a modulation-resultant-code pattern offset from the binary signal;

comparing means for comparing an output signal from the offset extracting means with a prescribed value to generate a comparison-resultant signal; code pattern offset information generating means for generating the code pattern offset information in accordance with one of (1) the output signal from the offset extracting means and (2) the comparison-resultant signal; non-cross detecting means for detecting that one of (1) the reproduced signal and (2) the sampling-resultant signal does not cross the slice level, and for generating non-cross information in response to a result of said detecting; randomness detecting means for detecting a randomness of the modulation-resultant-code pattern in response to the binary signal and the output signal from the offset extracting means, and for generating randomness information representative of the detected randomness; and resetting means for resetting the output signal from the offset extracting means in response to the non-cross information and the randomness information.

An eleventh aspect of this invention is based on the tenth aspect thereof, and provides a digital signal reproducing apparatus wherein the non-cross detecting means comprises means for detecting whether or not a modulation-resultant-code pattern having at least a prescribed run length is contained in the binary signal, and for generating the non-cross information in response to a result of said detecting.

A twelfth aspect of this invention provides a digital signal reproducing apparatus comprising first means for controlling a DC level of a reproduced signal to generate a DC-level-controlled signal in response to a DC level control signal; second means for generating a binary signal in response to the DC-level-controlled signal generated by the first means, the binary signal representing a stream of bits each being "0" or "1"; third means for generating the DC level control signal in response to the binary signal generated by the second means, and for feeding the DC level control signal to the first means; and fourth means for suppressing a variation in the DC level control signal which responds to a difference in number between bits of "0" and bits of "1" in the bit stream represented by the binary signal.

A thirteenth aspect of this invention provides a digital signal reproducing apparatus comprising first means for comparing a reproduced signal representative of binary information with a slice level to convert the reproduced signal into a binary signal representing a stream of bits each being "0" or "1"; second means for generating the slice level in response to the binary signal generated by the first means, and for feeding the slice level to the first means; and third means for suppressing a variation in the slice level which responds to a difference in number between bits of "0" and bits of "1" in the bit stream represented by the binary signal.

BRIEF DESCRIPTION OF THE DRAWINGS

FIG. 42 is a block diagram of a digital signal reproducing apparatus according to an eighteenth embodiment of this invention.

FIG. 43 is a block diagram of a digital signal reproducing apparatus according to a nineteenth embodiment of this invention.

FIG. 61 is a time-domain diagram of a third example of the code pattern offset information.

DETAILED DESCRIPTION OF THE INVENTION

A prior-art digital signal reproducing apparatus will be explained below for a better understanding of this invention.

Figure 1:
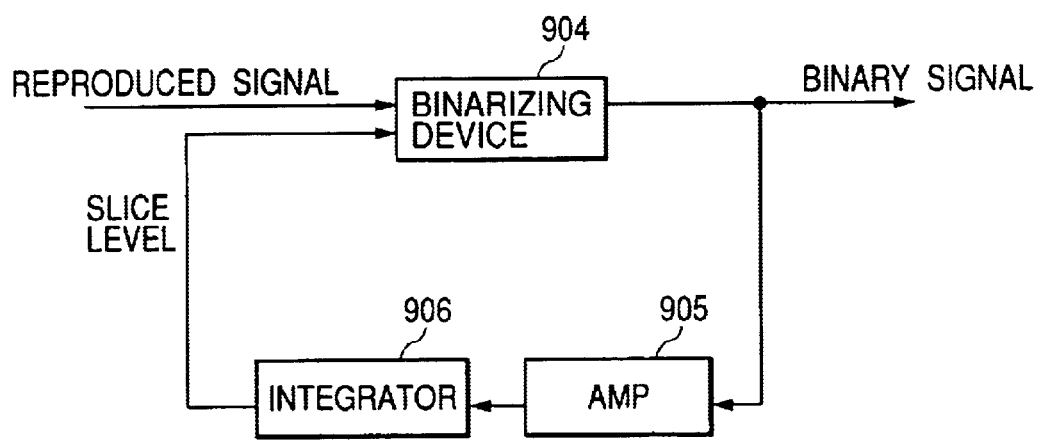
FIG. 1 is a block diagram of a prior-art digital signal reproducing apparatus.

FIG. 1 shows a prior-art apparatus which includes a binarizing device 904, an amplifier 905, and an integrator 906. The binarizing device 904 includes a comparator. The binarizing device 904 compares a reproduced analog-waveform signal with a slice level, thereby converting the reproduced analog-waveform signal into a binary digital signal. The binary digital signal is fed from the binarizing device 904 to the integrator 906 via the amplifier 905. The integrator 906 includes a low pass filter. The integrator 906 processes the binary digital signal into the slice level. The integrator 906 feeds the slice level to the binarizing device 904. Thus, the slice level is feedback-controlled in response to the binary digital signal. The feedback control of the slice level regulates the duty cycle of the binary digital signal at about 50% on a time average basis.

In the case where a binary digital signal represented by a reproduced analog-waveform signal is random in run length and has equal probabilities of occurrence of "0" and "1", the previously-mentioned prior-art feedback control provides a correct slice level independent of an asymmetry between an upper waveform portion and a lower waveform portion.

Figure 2:
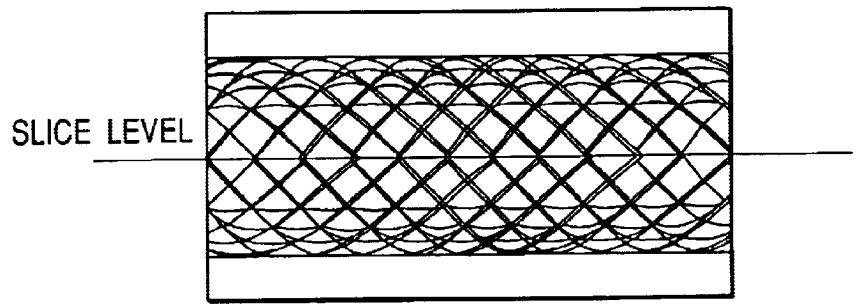
FIG. 2 is a diagram of an eye pattern related to a normal reproduced analog-waveform signal.
Figure 3:
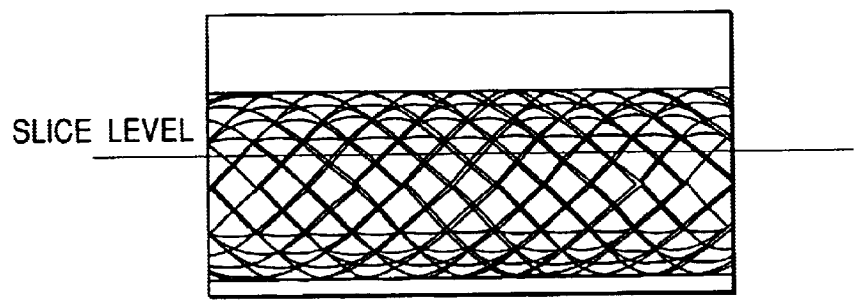
FIG. 3 is a diagram of an eye pattern related to a reproduced analog-waveform signal having a DC level offset.
Figure 4:
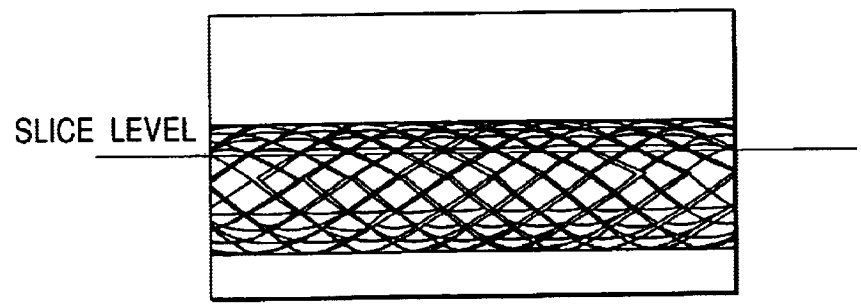
FIG. 4 is a diagram of an eye pattern related to a reproduced analog-waveform signal having an asymmetry between an upper waveform portion and a lower waveform portion.

FIG. 2 shows an eye pattern related to a normal reproduced analog-waveform signal. As shown in FIG. 2, a proper slice level is centered at the eye pattern. FIG. 3 shows an eye pattern related to a reproduced analog-waveform signal having a DC level offset. FIG. 4 shows an eye pattern related to a reproduced analog-waveform signal having an asymmetry between an upper waveform portion and a lower waveform portion. A proper slice level for the eye pattern of FIG. 3 or FIG. 4 is lower than that for the eye pattern of FIG. 2. The previously-mentioned prior-art feedback control acts to decrease the slice level to the proper level for the eye pattern of FIG. 3 or FIG. 4.

Figure 5:
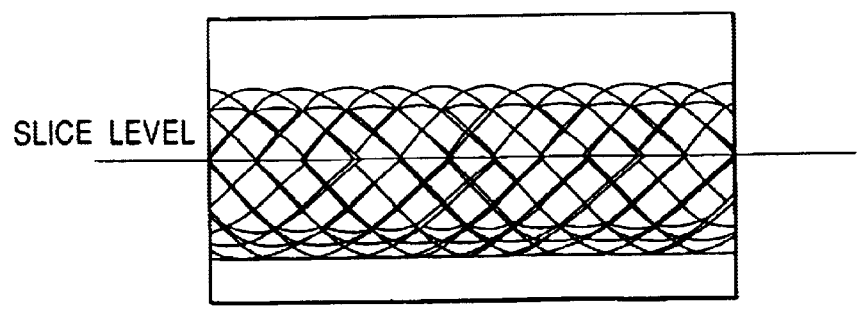
FIG. 5 is a diagram of an eye pattern related to a reproduced analog-waveform signal representative of a binary digital signal having an appreciable code pattern offset (an appreciable difference in number between "0" and "1").

FIG. 5 shows an eye pattern related to a reproduced analog-waveform signal representative of a binary digital signal having an appreciable difference in number between bits of "0" and bits of "1", that is, an appreciable code pattern offset. A proper slice level for the eye pattern of FIG. 5 is the same as that for the eye pattern of FIG. 2. However, the previously-mentioned prior-art feedback control acts to decrease the slice level from the proper level for the eye pattern of FIG. 5. Thus, in this case, it is difficult to accurately reproduce the binary digital signal.

First Embodiment

Figure 6:
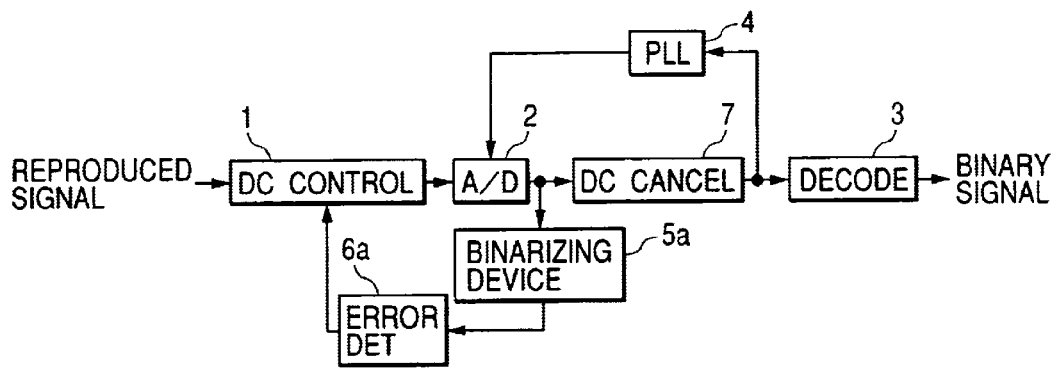
FIG. 6 is a block diagram of a digital signal reproducing apparatus according to a first embodiment of this invention.

FIG. 6 shows a digital signal reproducing apparatus according to a first embodiment of this invention. The apparatus of FIG. 6 includes a DC (direct current) controller 1, an A/D (analog-to-digital) converter 2, a decoder 3, a PLL (phase locked loop) circuit 4, a binarizing device 5a, an error detector 6a, and a DC offset canceler 7.

The DC controller 1 is connected with the A/D converter 2 and the error detector 6a. The A/D converter 2 is connected with the PLL circuit 4, the binarizing device 5a, and the DC offset canceler 7. The binarizing circuit 5a is connected with the error detector 6a. The DC offset canceler 7 is connected with the decoder 3 and the PLL circuit 4.

A reproduced analog-waveform signal representative of a binary digital signal is inputted into the DC controller 1. The binary digital signal has a stream of bits each being "0" or "1". The DC controller 1 adjusts the DC level of the reproduced analog-waveform signal in response to a DC error signal fed from the error detector 6a. Thus, the DC controller 1 generates an analog DC-controlled signal from the reproduced analog-waveform signal. The DC controller 1 outputs the analog DC-controlled signal to the A/D converter 2.

The A/D converter 2 periodically samples the analog DC-controlled signal in response to a clock signal fed from the PLL circuit 4. The A/D converter 2 changes every resultant analog sample into a corresponding digital sample. Accordingly, the A/D converter 2 changes the analog DC-controlled signal into a digital DC-controlled signal.

The A/D converter 2 feeds the digital DC-controlled signal to the binarizing device 5a and the DC offset canceler 7.

The DC offset canceler 7 subjects the digital DC-controlled signal to a DC offset cancel procedure to get a digital DC-offset-canceled signal. The DC offset canceler 7 feeds the digital DC-offset-canceled signal to the decoder 3 and the PLL circuit 4.

The device 3 decodes the digital DC-offset-canceled signal into a binary digital signal according to a decoding procedure based on Viterbi decoding and slicing decision. The decoder 3 outputs the binary digital signal to a next stage having, for example, an error correction circuit. The binary digital signal has a stream of bits each being "0" or "1".

The binarizing device 5a converts the digital DC-controlled signal into a bi-level DC-controlled signal (a binary DC-controlled signal). Specifically, the binarizing device 5a compares the digital DC-controlled signal with a digital signal representative of a slice level, thereby generating the bi-level DC-controlled signal. The binarizing device 5a feeds the bi-level DC-controlled signal to the error detector 6a.

The error detector 6a extracts low-frequency components from the bi-level DC-controlled signal, and makes the extracted low-frequency components into the DC error signal. The error detector 6a feeds the DC error signal to the DC controller 1.

Figure 7:
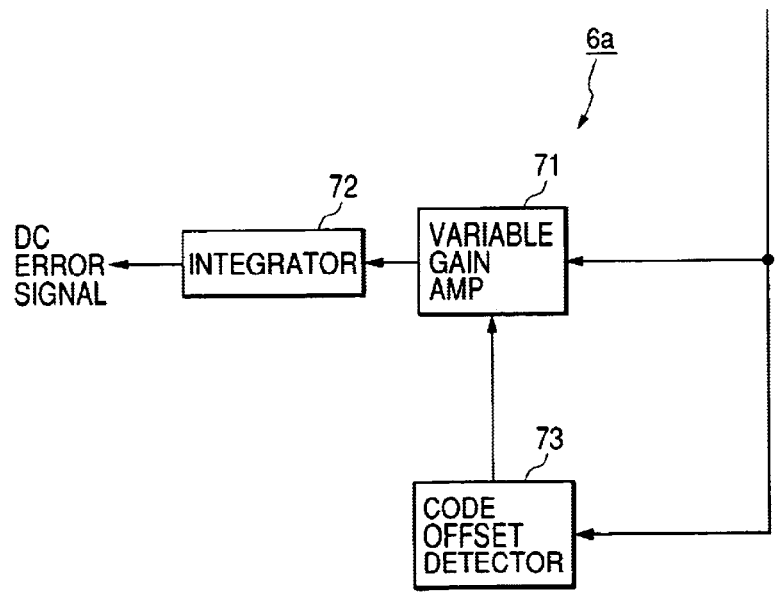
FIG. 7 is a block diagram of an error detector in FIG. 6.

As shown in FIG. 7, the error detector 6a includes a variable-gain amplifier 71, an integrator 72, and a code offset detector 73.

Here, "code offset" means a difference in number between bits of "0" and bits of "1". The variable-gain amplifier 71 receives the bi-level DC-controlled signal from the binarizing device 5a (see FIG. 6), and amplifies the bi-level DC-controlled signal at a gain determined by an output signal from the code offset detector 73. The variable-gain amplifier 71 outputs the amplification-resultant signal to the integrator 72. The integrator 72 extracts low-frequency components from the output signal of the variable-gain amplifier 71, and makes the extracted low-frequency components into the DC error signal. The integrator 72 feeds the DC error signal to the DC controller 1 (see FIG. 6). The code offset detector 73 receives the bi-level DC-controlled signal from the binarizing device 5a (see FIG. 6). The device 73 detects a difference in number between bits of "0" and bits of "1" represented by a modulation-resultant code in the bi-level DC-controlled signal. The code offset detector 73 generates code pattern offset information (modulation-resultant-code pattern offset information) in accordance with the detected number difference between bits of "0" and bits of "1". The code offset detector 73 outputs a signal representative of the code pattern offset information to the variable-gain amplifier 71. The gain of the variable-gain amplifier 71 depends on the code pattern offset information.

Figure 8:
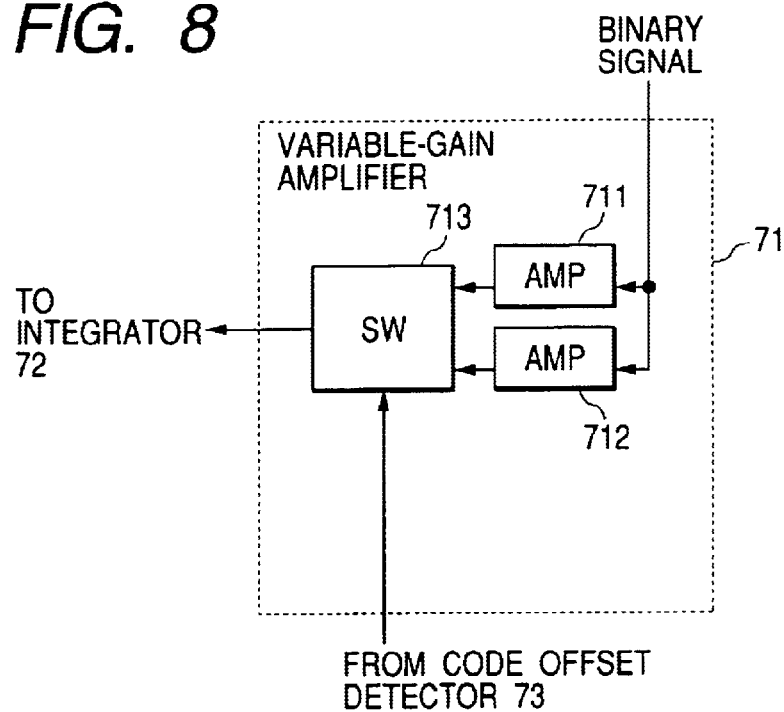
FIG. 8 is a block diagram of a first example of a variable-gain amplifier in FIG. 7.

FIG. 8 shows a first example of the variable-gain amplifier 71. The variable-gain amplifier 71 in FIG. 8 includes amplifiers 711 and 712, and a switch 713. The amplifier 711 has a first preset gain. The amplifier 712 has a second preset gain different from the first preset gain. The amplifiers 711 receive the bi-level DC-controlled signal from the binarizing device 5a (see FIG. 6). The device 711 amplifies the bi-level DC-controlled signal at the first preset gain, and outputs the amplification-resultant signal to the switch 713. The device 712 amplifies the bi-level DC-controlled signal at the second preset gain, and outputs the amplification-resultant signal to the switch 713. The switch 713 receives the code pattern offset information from the code offset detector 73 (see FIG. 7). The switch 713 selects either the output signal of the amplifier 711 or the output signal of the amplifier 712 in response to the code pattern offset information. The switch 713 transmits the selected signal to the integrator 72 (see FIG. 7).

It should be noted that the amplifiers 711 and 712 may be replaced by three or more amplifiers with different gains to implement finer gain control.

Figure 9:
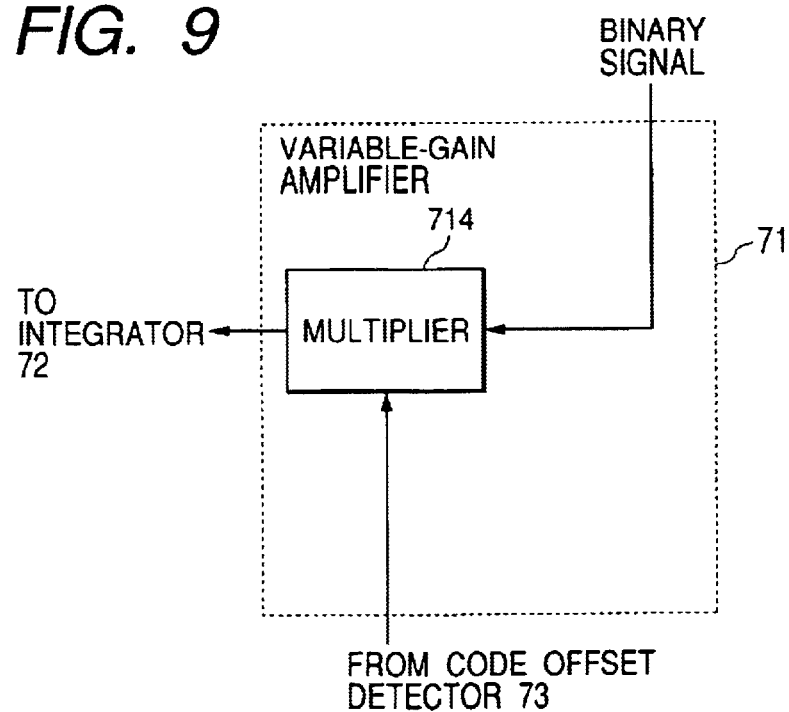
FIG. 9 is a block diagram of a second example of the variable-gain amplifier in FIG. 7.

FIG. 9 shows a second example of the variable-gain amplifier 71. The variable-gain amplifier 71 in FIG. 9 includes a multiplier 714. The multiplier 714 receives the bi-level DC-controlled signal from the binarizing device 5a (see FIG. 6). The multiplier 714 receives the code pattern offset information from the code offset detector 73 (see FIG. 7). The device 714 multiplies the bi-level DC-controlled signal by a coefficient depending on the code pattern offset information. The multiplier 714 outputs the multiplication-resultant signal to the integrator 72 (see FIG. 7).

Preferably, the code offset detector 73 decides whether or not there is an appreciable modulation-resultant-code offset greater than a threshold, that is, an appreciable difference in number between "0" and "1" represented by a modulation-resultant code in the bi-level DC-controlled signal. When the code offset detector 73 decides that there is an appreciable modulation-resultant-code offset, the variable-gain amplifier 71 decreases its gain. Thus, in this case, a variation in the DC error signal is relatively suppressed. It should be noted that a lower gain of the variable-gain amplifier 71 causes a greater time constant of the feedback loop and hence a slower response thereof. Accordingly, the response characteristic of the feedback loop is controlled in response to the result of the decision by the code offset detector 73. When the code offset detector 73 decides that there is an appreciable modulation-resultant-code offset, the variable-gain amplifier 71 may set its gain to zero to assume an insensitive state or a disabled state.

Figure 10:
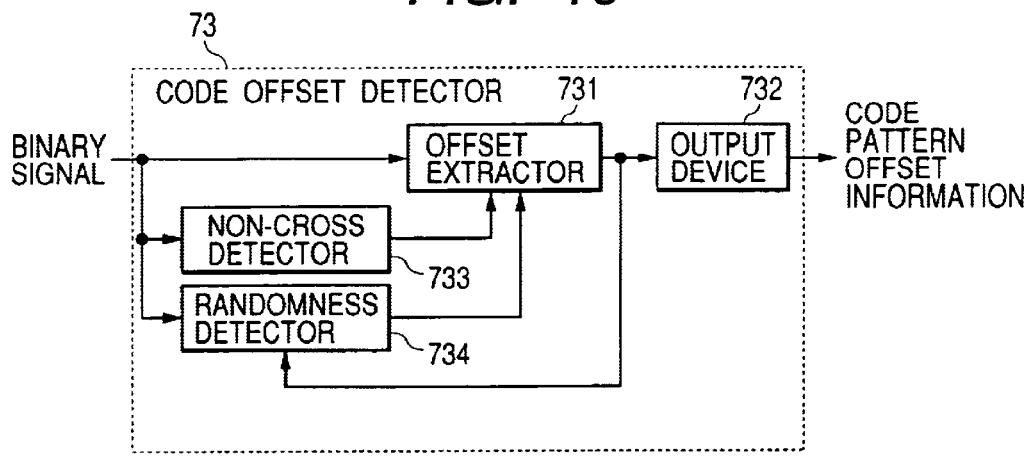
FIG. 10 is a block diagram of a code offset detector in FIG. 7.

As shown in FIG. 10, the code offset detector 73 includes an offset extractor 731, an output device 732, a non-cross detector 733, and a randomness detector 734. The offset extractor 731, the non-cross detector 733, and the randomness detector 734 receive the bi-level DC-controlled signal from the binarizing device 5a (see FIG. 6). The non-cross detector 733 decides whether a code pattern (a bit pattern) having at least a prescribed run length is present in or absent from the bi-level DC-controlled signal. The non-cross detector 733 feeds the result of the decision to the offset extractor 731 as non-cross information. The randomness detector 734 receives an output signal from the offset extractor 731. The randomness detector 734 decides whether a code pattern (a bit pattern) having at least a prescribed run length and a polarity opposite to that of the output signal from the offset extractor 731 is present in or absent from the bi-level DC-controlled signal. The randomness detector 734 feeds the result of the decision to the offset extractor 731 as randomness information.

The device 731 extracts low-frequency components or a code pattern offset (a modulation-resultant-code pattern offset) from the bi-level DC-controlled signal, and outputs a signal representative of the extracted information to the output device 732 and the randomness detector 734. The offset extractor 731 resets the extracted information signal in response to the non-cross information and the randomness information.

The output device 732 compares the value represented by the output signal from the offset extractor 731 with a prescribed value, and feeds the result of the comparison to the variable-gain amplifier 71 (see FIG. 7) as the code pattern offset information.

Figure 11:
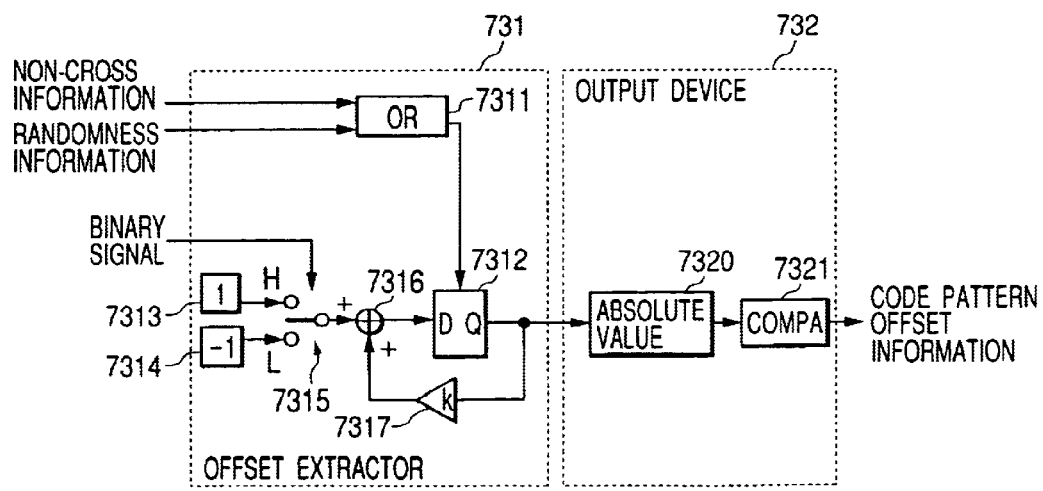
FIG. 11 is a block diagram of an offset extractor and an output device in FIG. 10.

As shown in FIG. 11, the offset extractor 731 includes an OR circuit 7311, a D flip-flop 7312, signal generators 7313 and 7314, a switch 7315, an adder 7316, and a coefficient generator 7317. The signal generator 7313 produces a signal indicative of "+1", and outputs the "+1" signal to the switch 7315. The signal generator 7314 produces a signal indicative of "−1", and outputs the "−1" signal to the switch 7315. The bi-level DC-controlled signal outputted from the binarizing device 5a (see FIG. 6) is applied to the switch 7315 as a switch control signal. When the bi-level DC-controlled signal is in its high level state (its logical state of "1"), the switch 7315 selects the "+1" signal. When the bi-level DC-controlled signal is in its low level state (its logical state of "0"), the switch 7315 selects the "−1" signal. The switch 7315 outputs the selected signal to the adder 7316. The adder 7316 receives an output signal from the coefficient generator 7317 which represents a coefficient. The adder 7316 combines the output signals of the switch 7315 and the coefficient generator 7317 into an addition-resultant signal. The adder 7316 outputs the addition-resultant signal to the D flip-flop 7312. The D flip-flop 7312 receives a bit clock signal from a suitable device (not shown) which has a period corresponding to a channel bit rate. The D flip-flop 7312 samples and holds the addition-resultant signal in response to the bit clock signal, thereby delaying the addition-resultant signal by a time corresponding to one clock pulse or one bit. The D flip-flop 7312 outputs the delayed signal to the coefficient generator 7317 and the output device 732. The coefficient generator 7317 multiplies the output signal of the D flip-flop 7317 by a preset gain factor "k", and feeds the multiplication-resultant signal to the adder 7316 as an indication of the coefficient.

The OR circuit 7311 in the offset extractor 731 receives the non-cross information from the non-cross detector 733 (see FIG. 10). The OR circuit 7311 receives the randomness information from the randomness detector 734 (see FIG. 10). The OR circuit 7311 executes OR operation between the non-cross information and the randomness information, thereby generating a reset signal. The OR circuit 7311 feeds the reset signal to the D flip-flop 7312. The D flip-flop 7312 resets in response to the reset signal.

As shown in FIG. 11, the output device 732 includes an absolute-value circuit 7320 and a comparator 7321. The absolute-value circuit 7320 receives the output signal of the D flip-flop 7312 in the offset extractor 731. The absolute-value circuit 7320 calculates the absolute value of the output signal of the D flip-flop 7312. The absolute-value circuit 7320 notifies the comparator 7321 of the calculated absolute value. The device 7321 compares the absolute value with a prescribed value, and generates the code pattern offset information from the comparison result. The comparator 7321 outputs the code pattern offset information to the variable-gain amplifier 71 (see FIG. 7).

Low-frequency components extracted from the bi-level DC-controlled signal appear at the output terminal of the D flip-flop 7312. As the extracted low-frequency components are smaller, the output signal of the D flip-flop 7312 is closer to a mean value, that is, zero. As the extracted low-frequency components are greater, the output signal of the D flip-flop 7312 takes a positive value or a negative value more distant from the mean value (zero). Thus, the absolute value of the output signal of the D flip-flop 7312 increases in accordance with an increase of the code offset. When the comparator 7321 detects that the absolute value exceeds the prescribed value, it is decided that the modulation-resultant code has an appreciable offset.

Although the output signal of the A/D converter 2 has only a small code offset, the absolute value of the output signal of the D flip-flop 7312 would be great if the value represented by the output signal of the A/D converter 2 remains not crossing or hardly crosses the slice level for a long time interval. These conditions correspond to the eye patterns of FIGS. 3 and 4. In these conditions, the resetting of the D flip-flop 7312 by the OR circuit 7311 avoids the absolute value of the output signal of the D flip-flop 7312 from becoming great. This function prevents a wrong decision for providing a decoding result.

The non-cross information fed from the non-cross detector 733 to the OR circuit 7311 represents whether a code pattern (a bit pattern) having at least a prescribed run length is present in or absent from the bi-level DC-controlled signal, that is, whether or not the output signal of the A/D converter 2 remains not crossing the slice level for a long time interval. The randomness information fed from the randomness detector 734 to the OR circuit 7311 represents whether a code pattern (a bit pattern) having at least a prescribed run length and a polarity opposite to that of the output signal from the offset extractor 731 is present in or absent from the bi-level DC-controlled signal. Thus, the randomness information indicates the degree of the randomness in the output signal of the A/D converter 2. When the non-cross information represents that the output signal of the A/D converter 2 remains not crossing the slice level for a long time interval or when the randomness information indicates a relatively low degree of the randomness, the OR circuit 7311 resets the D flip-flop 7312 and thereby forcedly equalizes the value of the output signal of the D flip-flop 7312 to zero.

Specifically, the non-cross information is "1" when the output signal of the A/D converter 2 remains not crossing the slice level for a long time interval. Otherwise, the non-cross information is "0". The randomness information is "0" when the degree of the randomness exceeds a threshold. Otherwise, the randomness information is "1". The non-cross information of "1" propagates through the OR circuit 731 and reaches the D flip-flop 7312 as a reset signal. Similarly, the randomness information of "1" propagates through the OR circuit 731 and reaches the D flip-flop 7312 as a reset signal.

Figure 12:
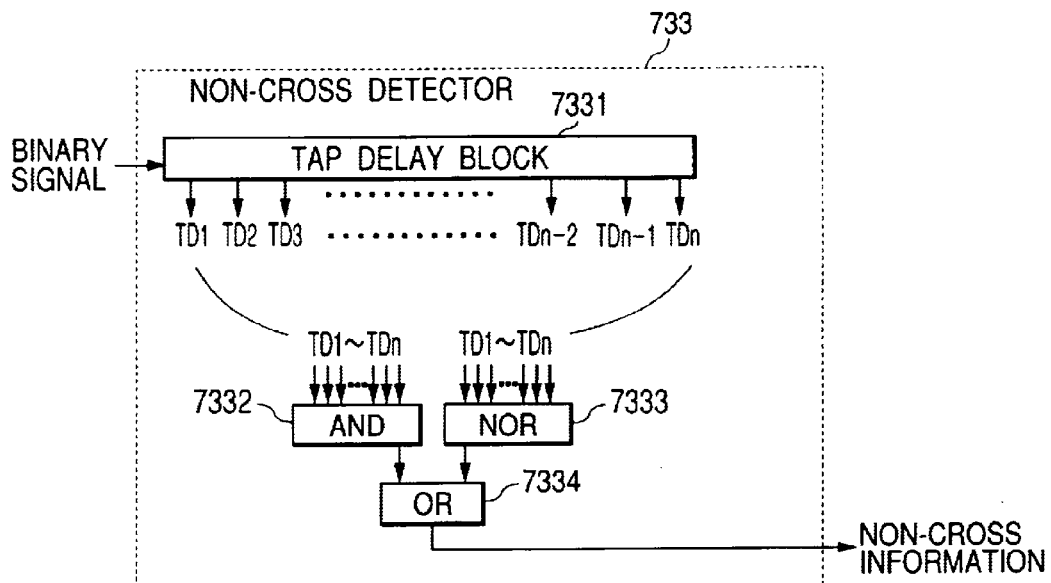
FIG. 12 is a block diagram of a non-cross detector in FIG. 10.

As shown in FIG. 12, the non-cross detector 733 includes a tap delay block 7331, an AND block 7332, a NOR block 7333, and an OR block 7334. The tap delay block 7331 is composed of "n" delay elements connected in cascade (series), where "n" denotes a predetermined natural number. Each of the delay elements has, for example, a D flip-flop. Each of the delay elements responds to the bit clock signal, and provides a signal delay corresponding to one bit. The bi-level DC-controlled signal outputted from the binarizing device 5a (see FIG. 6) propagates through the delay elements in the tap delay block 7331 while being delayed thereby. The resultant delayed signals (the tap signals) TD1, TD2, . . . , and TDn appear at taps in the tap delay block 7331 which are formed by the junctions among the delay elements, respectively. The first tap signal TD1 may be non-delayed. The delays between the neighboring tap signals TD1-TDn correspond to one bit. Preferably, the number "n" is greater than a value corresponding to the maximum run length of the modulation-resultant code which is determined by run length limiting rules used in a modulation side (an encoding side). The AND block 7332 and the NOR block 7333 receive the tap signals TD1-TDn from the tap delay block 7331. The AND block 7332 executes AND operation with respect to the tap signals TD1-TDn to detect that all the tap signals TD1-TDn are "1". The AND block 7332 outputs the AND-operation-resultant signal to the OR block 7334. The NOR block 7333 executes NOR operation with respect to the tap signals TD1-TDn to detect that all the tap signals TD1-TDn are "0". The NOR block 7333 outputs the NOR-operation-resultant signal to the OR block 7334. The OR block 7334 executes OR operation between the AND-operation-resultant signal and the NOR-operation-resultant signal, thereby generating the non-cross information. The OR block 7334 outputs the non-cross information to the offset extractor 731 (see FIG. 10). The non-cross information being "1" indicates that the output signal of the A/D converter 2 remains not crossing the slice level for a time interval corresponding to "n" successive bits. The non-cross information being "0" indicates that the output signal of the A/D converter 2 crosses the slice level at least once for a time interval corresponding to "n" successive bits. The non-cross information being "1" resets the D flip-flop 7312. Therefore, it is possible to prevent the condition corresponding to the eye pattern of FIG. 3 from being mistaken for that corresponding to the eye pattern of FIG. 5.

Figure 13:
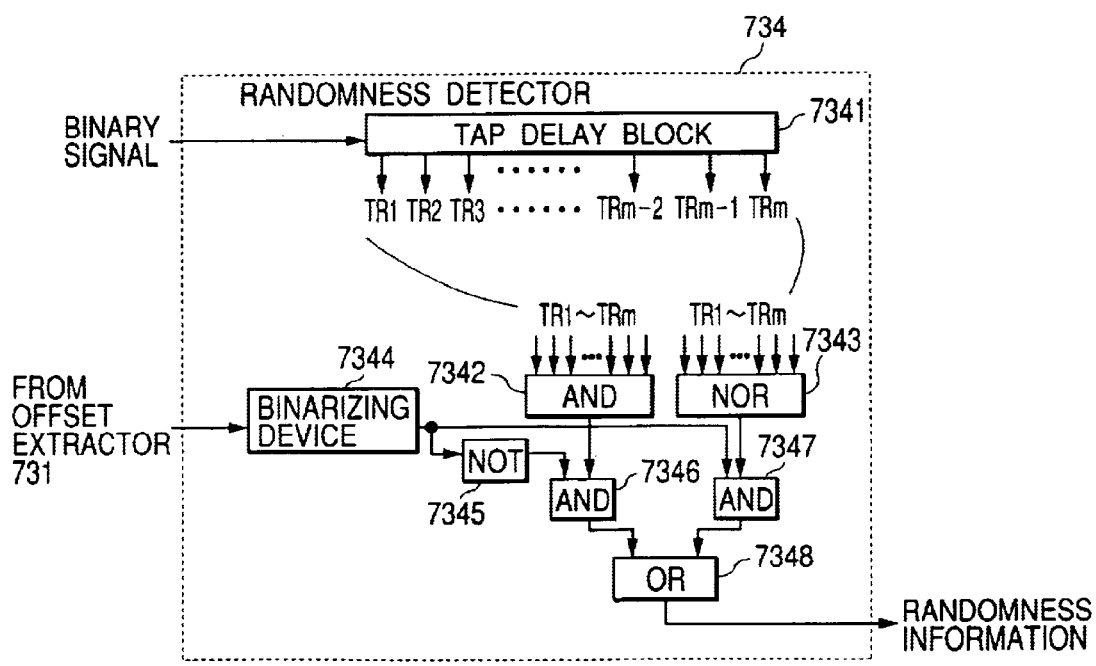
FIG. 13 is a block diagram of a randomness detector in FIG. 10.

As shown in FIG. 13, the randomness detector 734 includes a tap delay block 7341, an AND block 7342, a NOR block 7343, a binarizing block 7344, a NOT block 7345, AND blocks 7346 and 7347, and an OR block 7348. The tap delay block 7341 is composed of "m" delay elements connected in cascade (series), where "m" denotes a predetermined natural number. Each of the delay elements has, for example, a D flip-flop. Each of the delay elements responds to the bit clock signal, and provides a signal delay corresponding to one bit. The bi-level DC-controlled signal outputted from the binarizing device 5a (see FIG. 6) propagates through the delay elements in the tap delay block 7341 while being delayed thereby. The resultant delayed signals (the tap signals) TR1, TR2, . . . , and TRm appear at taps in the tap delay block 7341 which are formed by the junctions among the delay elements, respectively. The first tap signal TR1 may be non-delayed. The delays between the neighboring tap signals TR1-TRm correspond to one bit. Preferably, the number "m" is equal to or slightly greater than a value corresponding to a mean run length expected under the run length limiting rules. The AND block 7342 and the NOR block 7343 receive the tap signals TR1-TRm from the tap delay block 7341. The AND block 7342 executes AND operation with respect to the tap signals TR1-TRm to detect that all the tap signals TR1-TRm are "1". The AND block 7342 outputs the AND-operation-resultant signal to the AND block 7346. The NOR block 7343 executes NOR operation with respect to the tap signals TR1-TRm to detect that all the tap signals TR1-TRm are "0". The NOR block 7343 outputs the NOR-operation-resultant signal to the AND block 7347.

The binarizing block 7344 receives the output signal from the offset extractor 731 (see FIG. 10), and converts the received signal into a binary signal. When the polarity of the value represented by the output signal from the offset extractor 731 is negative, the binarizing block 7344 sets the binary signal to "0". Otherwise, the binarizing block 7344 sets the binary signal to "1". The binarizing block 7344 outputs the binary signal to the NOT block 7345 and the AND block 7347. The NOT block 7345 inverts the output signal from the binarizing block 7344. The NOT block 7345 outputs the inversion-resultant signal to the AND block 7346. The AND block 7346 executes AND operation between the output signal from the AND block 7342 and the output signal from the NOT block 7345. The AND block 7346 outputs the AND-operation-resultant signal to the OR block 7348. The AND block 7347 executes AND operation between the output signal from the NOR block 7343 and the output signal from the binarizing block 7344. The AND block 7347 outputs the AND-operation-resultant signal to the OR block 7348. The OR block 7334 executes OR operation between the output signals from the AND blocks 7346 and 7347, thereby generating the randomness information. The OR block 7348 outputs the randomness information to the offset extractor 731 (see FIG. 10).

In the condition corresponding to the eye pattern of FIG. 5, the polarity of the output signal from the offset extractor 731 is negative, and runs equal to or longer than "m" are absent from the upper side (the positive side) in FIG. 5. Accordingly, in this case, the randomness information is "0". On the other hand, in the condition corresponding to the eye pattern of FIG. 3 or FIG. 4, the polarity of the output signal from the offset extractor 731 is negative, and runs equal to or longer than "m" are present in the upper side (the positive side) in FIG. 3 or FIG. 4. When such a long run length occurs, the randomness information takes "1". The randomness information being "1" resets the D flip-flop 7312. Therefore, it is possible to prevent the condition corresponding to the eye pattern of FIG. 3 or FIG. 4 from being mistaken for that corresponding to the eye pattern of FIG. 5.

Figure 14:
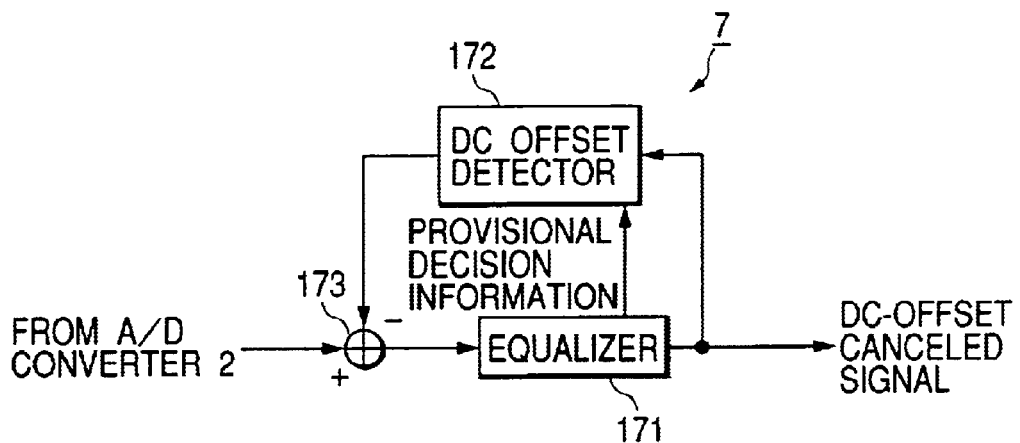
FIG. 14 is a block diagram of a first example of a DC offset canceler in FIG. 6.

FIG. 14 shows a first example of the DC offset canceler 7. The DC offset canceler 7 of FIG. 14 includes an equalizer 171, a DC offset detector 172, and a subtracter 173. The subtracter 173 receives the output signal of the A/D converter 2 (see FIG. 6) and also an output signal of the DC offset detector 172. The device 173 subtracts the output signal of the DC offset detector 172 from the output signal of the A/D converter 2. The subtracter 173 outputs the subtraction-resultant signal to the equalizer 171. The equalizer 171 is of a known adaptive type used for implementing PRML (partial response maximum likelihood). The equalizer 171 subjects the output signal of the subtracter 173 to an equalization procedure based on, for example, an LMS (least mean square) method to minimize the equalization error between an actual value and a provisionally-decided target value. The equalizer 171 feeds the equalization-resultant signal to the DC offset detector 172. In addition, the equalizer 171 feeds the equalization-resultant signal to the decoder 3 and the PLL circuit 4 as the digital DC-offset-canceled signal. The equalization procedure executed by the equalizer 171 includes provisional decision about a signal value. The equalizer 171 feeds the DC offset detector 172 with provisional decision information, that is, information representative of the result of the provisional decision. The provisional decision information indicates zero-cross points. The DC offset detector 172 selects every zero-cross point of the equalization-resultant signal in response to the provisional decision information, thereby extracting low-frequency components from the equalization-resultant signal and making the extracted low-frequency components into a signal representative of a detected DC offset. The DC offset detector 172 outputs the detected DC offset signal to the subtracter 173.

Figure 15:
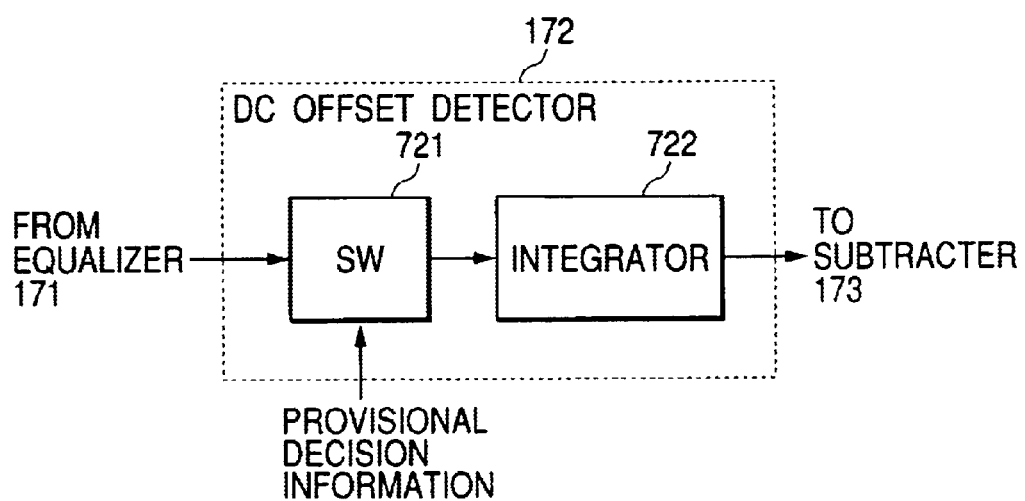
FIG. 15 is a block diagram of a DC offset detector in FIG. 14.

As shown in FIG. 15, the DC offset detector 172 includes a switch 721 and an integrator 722. The switch 721 receives a stream of samples of the equalization-resultant signal from the equalizer 171 (see FIG. 14). Also, the switch 721 receives the provisional decision information from the equalizer 171. In response to the provisional decision information, the switch 721 transmits only samples of the equalization-resultant signal to the integrator 722 which correspond to zero-cross points. The switch 721 inhibits the transmission of other samples to the integrator 722. The device 722 integrates the received samples, thereby extracting low-frequency components therefrom. The extracted low-frequency components compose the detected DC offset signal. The integrator 722 outputs the detected DC offset signal to the subtracter 173 (see FIG. 14). Preferably, the integrator 722 has an additional function of limiting the value of the detected DC offset signal to within a suitable range.

The DC offset canceler 7 removes a variation in zero level (zero DC level) from the signal inputted into and processed by the decoder 3. Thus, the DC offset canceler 7 shapes the signal into a waveform optimum for Viterbi decoding.

Figure 16:
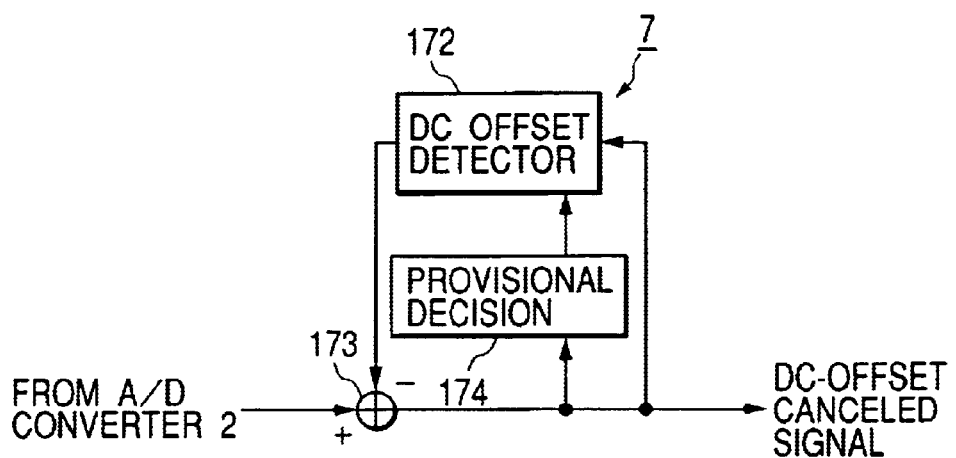
FIG. 16 is a block diagram of a second example of the DC offset canceler in FIG. 6.

FIG. 16 shows a second example of the DC offset canceler 7. The DC offset canceler 7 of FIG. 16 includes a DC offset detector 172, a subtracter 173, and a provisional decision device 174. The DC offset canceler 7 of FIG. 16 is similar to that of FIG. 14 except for design changes mentioned hereafter. The provisional decision device 174 executes provisional decision in response to the output signal from the subtracter 173, thereby generating provisional decision information. The provisional decision includes a step of comparing the output signal from the subtracter 173 with a fixed threshold value, or a step of selecting every sample point closest to zero level. The provisional decision device 174 feeds the provisional decision information to the DC offset detector 172. The output signal from the subtracter 173 is fed to the DC offset detector 172, the decoder 3, and the PLL circuit 4 (see FIG. 6) as the digital DC-offset-canceled signal.

Figure 17:
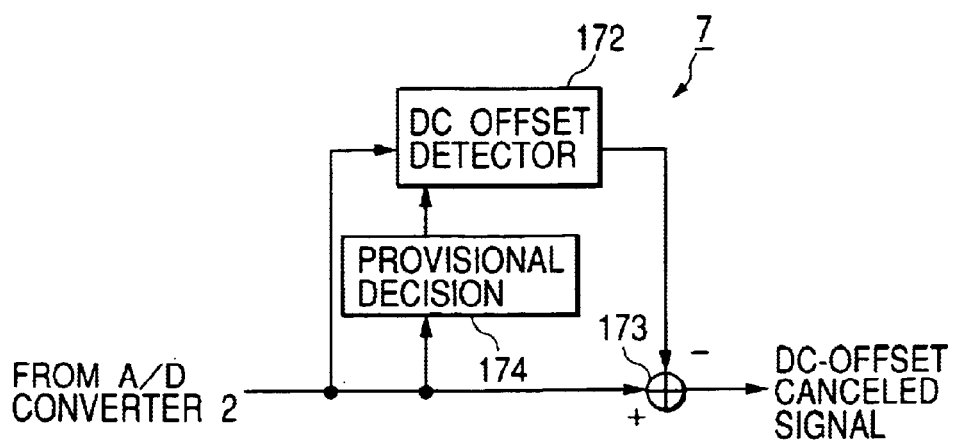
FIG. 17 is a block diagram of a third example of the DC offset canceler in FIG. 6.

FIG. 17 shows a third example of the DC offset canceler 7. The DC offset canceler 7 in FIG. 17 is of a feedforward type rather than a feedback type. The DC offset canceler 7 in FIG. 17 includes a DC offset detector 172, a subtracter 173, and a provisional decision device 174. The DC offset canceler 7 of FIG. 17 is similar to that of FIG. 16 except for design changes mentioned hereafter. The DC offset detector 172 operates on the output signal of the A/D converter 2 (see FIG. 6). The provisional decision device 174 executes provisional decision in response to the output signal from the A/D converter 2, thereby generating provisional decision information. The provisional decision device 174 feeds the provisional decision information to the DC offset detector 172. The DC offset detector 172 generates a detected DC offset signal in response to the output signal of the A/D converter 2 and the provisional decision information. The DC offset detector 172 outputs the detected DC offset signal to the subtracter 173. The output signal of the A/D converter 2 is applied to the subtracter 173. The device 173 subtracts the detected DC offset signal from the output signal of the A/D converter 2, thereby generating a digital DC-offset-canceled signal. The subtracter 173 feeds the digital DC-offset-canceled signal to the decoder 3 and the PLL circuit 4 (see FIG. 6).

Second Embodiment

Figure 18:
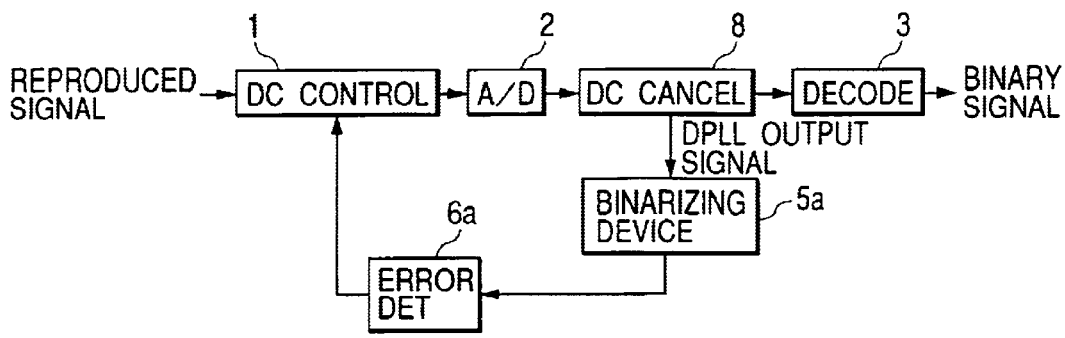
FIG. 18 is a block diagram of a digital signal reproducing apparatus according to a second embodiment of this invention.

FIG. 18 shows a digital signal reproducing apparatus according to a second embodiment of this invention. The apparatus of FIG. 18 includes a DC controller 1, an A/D converter 2, a decoder 3, a binarizing device 5a, an error detector 6a, and a DC offset canceler 8. The apparatus of FIG. 18 is similar to the apparatus of FIG. 6 except for design changes mentioned hereafter. The DC offset canceler 8 replaces the DC offset canceler 7 in FIG. 6. The binarizing device 5a is connected with the DC offset canceler 8. The A/D converter 2 changes the analog output signal from the DC controller 1 into a corresponding digital signal. The A/D converter 2 outputs the digital signal to the DC offset canceler 8. The DC offset canceler 8 generates a digital DC-offset-canceled signal and a DPLL (digital phase locked loop) signal in response to the output signal from the A/D converter 2. The DC offset canceler 8 outputs the digital DC-offset-canceled signal to the decoder 3. The DC offset canceler 8 outputs the DPLL signal to the binarizing device 5a. The binarizing device 5a converts the DPLL signal into a bi-level signal (a binary signal). The binarizing device 5a feeds the bi-level signal to the error detector 6a.

Figure 19:
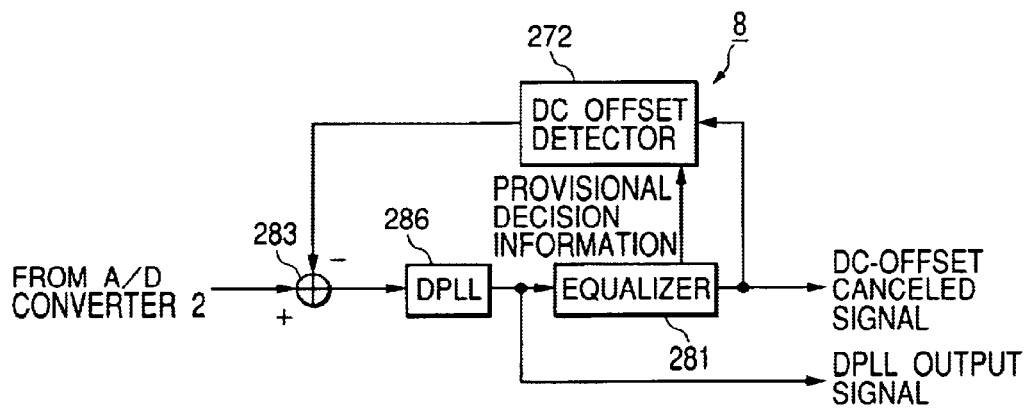
FIG. 19 is a block diagram of a first example of a DC offset canceler in FIG. 18.

FIG. 19 shows a first example of the DC offset canceler 8. The DC offset canceler 8 of FIG. 19 includes a DC offset detector 272, an equalizer 281, a subtracter 283, and a DPLL circuit 286. The subtracter 283 receives the output signal of the A/D converter 2 (see FIG. 18) and also an output signal of the DC offset detector 272. The device 283 subtracts the output signal of the DC offset detector 272 from the output signal of the A/D converter 2. The subtracter 283 outputs the subtraction-resultant signal to the DPLL circuit 286. The DPLL circuit 286 resamples the output signal of the subtracter 283 through at least one of interpolation and decimation, thereby generating a resampling-resultant signal having a bit rate equal to a prescribed channel bit rate and also generating a bit clock signal. Stages following the DPLL circuit 286 operate in response to the bit clock signal generated thereby. The DPLL circuit 286 outputs the resampling-resultant signal to the equalizer 281. In addition, the DPLL circuit 286 outputs the resampling-resultant signal to the binarizing device 5a (see FIG. 18) as the DPLL signal. The equalizer 281 is of a known adaptive type used for implementing PRML (partial response maximum likelihood). The equalizer 281 subjects the output signal of the DPLL circuit 286 to an equalization procedure based on, for example, an LMS (least mean square) method to minimize the equalization error between an actual value and a provisionally-decided target value. The equalizer 281 feeds the equalization-resultant signal to the DC offset detector 272. In addition, the equalizer 281 feeds the equalization-resultant signal to the decoder 3 as the digital DC-offset-canceled signal. The equalization procedure executed by the equalizer 281 includes provisional decision about a signal value. The equalizer 281 feeds the DC offset detector 272 with provisional decision information, that is, information representative of the result of the provisional decision. The provisional decision information indicates zero-cross points. The DC offset detector 272 selects every zero-corss point of the equalization-resultant signal in response to the provisional decision information, thereby extracting low-frequency components from the equalization-resultant signal and making the extracted low-frequency components into a signal representative of a detected DC offset. The DC offset detector 272 outputs the detected DC offset signal to the subtracter 283. The operation of the DC offset detector 272 is responsive to the bit clock signal. The DC offset detector 272 has a structure similar to that in FIG. 15.

The DPLL circuit 286 may be one shown in, for example, U.S. patent application Ser. No. 09/903,566 filed on Jul. 13, 2001 or European patent application EP 1014363 A2, the disclosure of which is hereby incorporated by reference.

Figure 20:
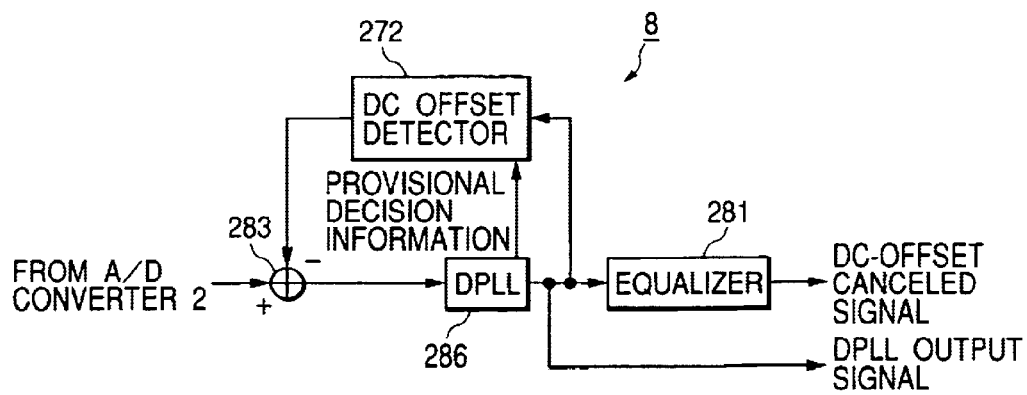
FIG. 20 is a block diagram of a second example of the DC offset canceler in FIG. 18.

FIG. 20 shows a second example of the DC offset canceler 8. The DC offset canceler 8 of FIG. 19 includes a DC offset detector 272, an equalizer 281, a subtracter 283, and a DPLL circuit 286. The DC offset canceler 8 of FIG. 20 is similar to that of FIG. 19 except for design changes mentioned hereafter. The DC offset detector 272 operates on the resampling-resultant signal outputted from the DPLL circuit 286. The DPLL circuit 286 generates 0-point information during calculation of a phase error. The DPLL circuit 286 feeds the 0-point information to the DC offset detector 272 as provisional decision information. The DC offset detector 272 generates a detected DC offset signal in response to the resampling-resultant signal and the provisional decision information.

Third Embodiment

Figure 21:
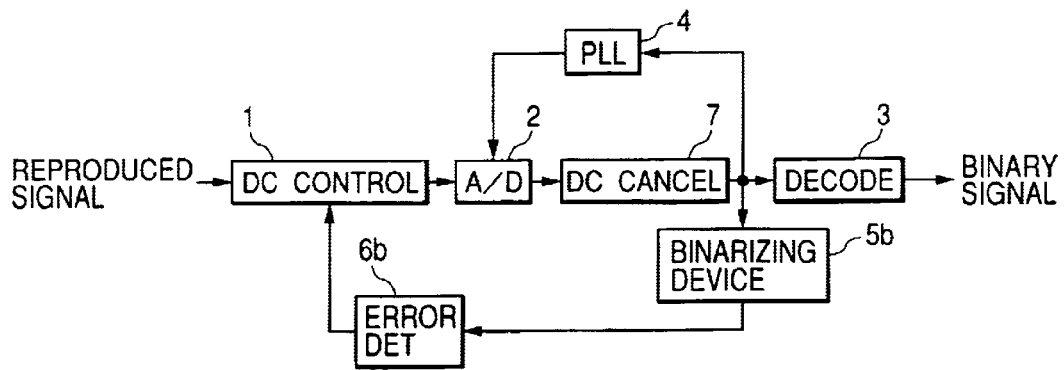
FIG. 21 is a block diagram of a digital signal reproducing apparatus according to a third embodiment of this invention.

FIG. 21 shows a digital signal reproducing apparatus according to a third embodiment of this invention. The apparatus of FIG. 21 includes a DC controller 1, an A/D converter 2, a decoder 3, a PLL circuit 4, a binarizing device 5b, an error detector 6b, and a DC offset canceler 7. The apparatus of FIG. 21 is similar to the apparatus of FIG. 6 except for design changes mentioned hereafter. The binarizing device 5b is connected between the DC offset canceler 7 and the error detector 6b. The error detector 6b is connected with the DC controller 1. The binarizing device 5b is similar to the binarizing device 5a in FIG. 6. The error detector 6b is similar to the error detector 6a in FIG. 6.

The binarizing device 5b operates on the digital DC-offset-canceled signal outputted from the DC offset canceler 7. The binarizing device 5b converts the output signal of the DC offset canceler 7 into a bi-level signal (a binary signal). The binarizing device 5b feeds the bi-level signal to the error detector 6b. The error detector 6b extracts low-frequency components from the bi-level signal, and generates a DC error signal from the extracted low-frequency components. The error detector 6b feeds the DC error signal to the DC controller 1.

Fourth Embodiment

Figure 22:
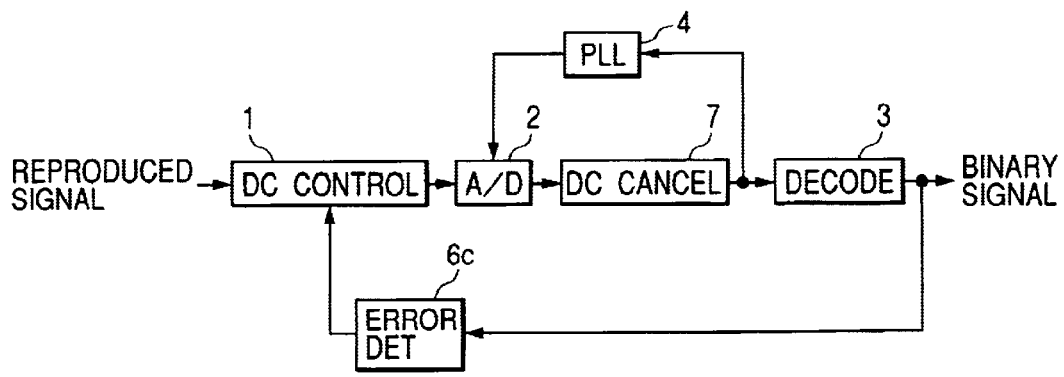
FIG. 22 is a block diagram of a digital signal reproducing apparatus according to a fourth embodiment of this invention.

FIG. 22 shows a digital signal reproducing apparatus according to a fourth embodiment of this invention. The apparatus of FIG. 22 includes a DC controller 1, an A/D converter 2, a decoder 3, a PLL circuit 4, an error detector 6c, and a DC offset canceler 7. The apparatus of FIG. 22 is similar to the apparatus of FIG. 6 except for design changes mentioned hereafter. The binarizing device 5a (see FIG. 6) is omitted from the apparatus of FIG. 22. The error detector 6c is connected with the DC controller 1 and the decoder 3. The error detector 6c is similar to the error detector 6a in FIG. 6.

The error detector 6c operates on a binary digital signal outputted from the decoder 3. The error detector 6c extracts low-frequency components from the binary digital signal, and generates a DC error signal from the extracted low-frequency components. The error detector 6c feeds the DC error signal to the DC controller 1.

Fifth Embodiment

Figure 23:
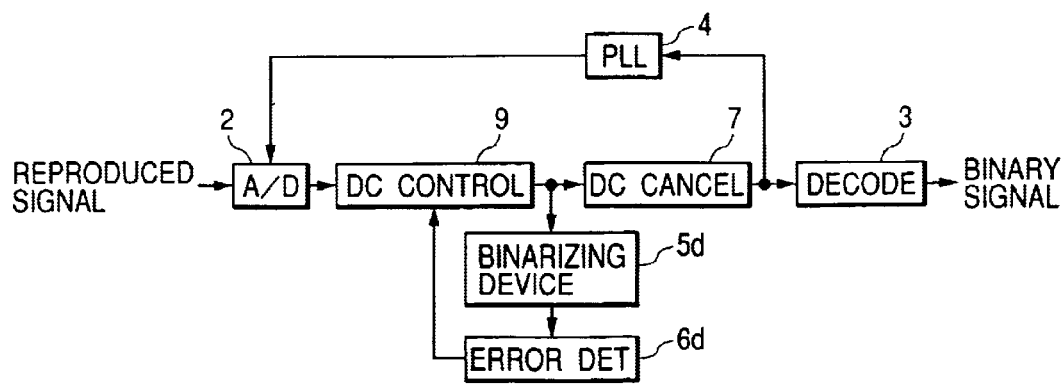
FIG. 23 is a block diagram of a digital signal reproducing apparatus according to a fifth embodiment of this invention.

FIG. 23 shows a digital signal reproducing apparatus according to a fifth embodiment of this invention. The apparatus of FIG. 23 includes an A/D converter 2, a decoder 3, a PLL circuit 4, a binarizing device 5d, an error detector 6d, a DC offset canceler 7, and a DC controller 9. The apparatus of FIG. 23 is similar to the apparatus of FIG. 6 except for design changes mentioned hereafter. The DC controller 9 is connected between the A/D converter 2 and the DC offset canceler 7. The binarizing device 5d is connected with the DC controller 9. The error detector 6d is connected with the binarizing device 5d and the DC controller 9.

The A/D converter 2 receives a reproduced analog-waveform signal representative of a binary digital signal.

The A/D converter 2 periodically samples the reproduced analog-waveform signal in response to a clock signal fed from the PLL circuit 4. The A/D converter 2 changes every resultant analog sample into a corresponding digital sample. Accordingly, the A/D converter 2 changes the reproduced analog-waveform signal into a corresponding digital signal. The A/D converter 2 outputs the digital signal to the DC controller 9.

The DC controller 9 adjusts the DC level represented by the output signal of the A/D converter 2 in response to a DC error signal fed from the error detector 6d. Thus, the DC controller 9 generates a digital DC-controlled signal from the output signal of the A/D converter 2. The DC controller 9 outputs the digital DC-controlled signal to the binarizing device 5d and the DC offset canceler 7.

The binarizing device 5d converts the digital DC-controlled signal into a bi-level DC-controlled signal (a binary DC-controlled signal). The binarizing device 5d feeds the bi-level DC-controlled signal to the error detector 6d. The binarizing device 5d is similar to the binarizing device 5a in FIG. 6.

The error detector 6d extracts low-frequency components from the bi-level DC-controlled signal, and generates the DC error signal from the extracted low-frequency components. The error detector 6d feeds the DC error signal to the DC controller 9. The error detector 6d is similar to the error detector 6a in FIG. 6.

Sixth Embodiment

Figure 24:
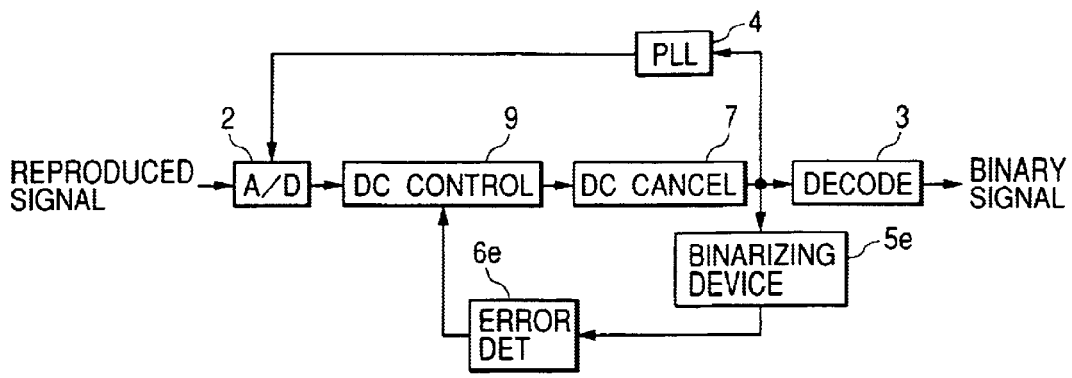
FIG. 24 is a block diagram of a digital signal reproducing apparatus according to a sixth embodiment of this invention.

FIG. 24 shows a digital signal reproducing apparatus according to a sixth embodiment of this invention. The apparatus of FIG. 24 includes an A/D converter 2, a decoder 3, a PLL circuit 4, a binarizing device 5e, an error detector 6e, a DC offset canceler 7, and a DC controller 9. The apparatus of FIG. 24 is similar to the apparatus of FIG. 23 except for design changes mentioned hereafter. The binarizing device 5e is connected between the DC offset canceler 7 and the error detector 6e. The error detector 6e is connected with the DC controller 9. The binarizing device 5e is similar to the binarizing device 5d in FIG. 23. The error detector 6e is similar to the error detector 6d in FIG. 23.

The binarizing device 5e operates on the digital DC-offset-canceled signal outputted from the DC offset canceler 7. The binarizing device 5e converts the output signal of the DC offset canceler 7 into a bi-level signal (a binary signal). The binarizing device 5e feeds the bi-level signal to the error detector 6e. The error detector 6e extracts low-frequency components from the bi-level signal, and generates a DC error signal from the extracted low-frequency components. The error detector 6e feeds the DC error signal to the DC controller 9.

Seventh Embodiment

Figure 25:
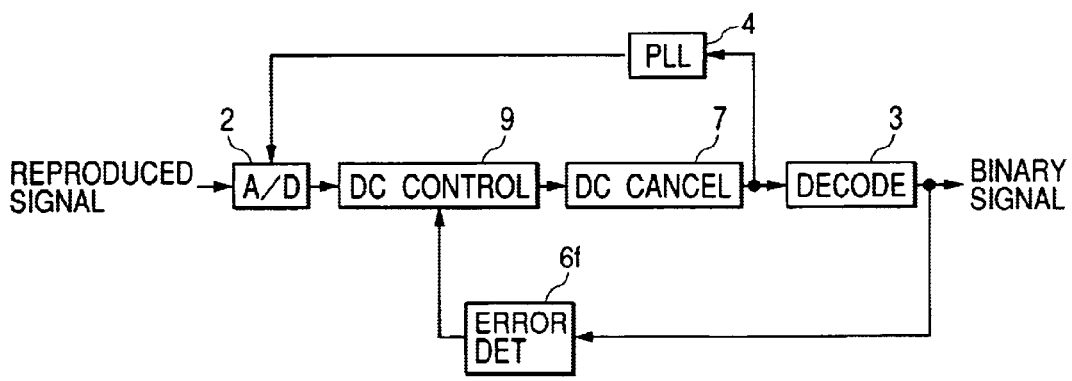
FIG. 25 is a block diagram of a digital signal reproducing apparatus according to a seventh embodiment of this invention.

FIG. 25 shows a digital signal reproducing apparatus according to a seventh embodiment of this invention. The apparatus of FIG. 25 includes an A/D converter 2, a decoder 3, a PLL circuit 4, an error detector 6f, a DC offset canceler 7, and a DC controller 9. The apparatus of FIG. 25 is similar to the apparatus of FIG. 23 except for design changes mentioned hereafter. The binarizing device 5d (see FIG. 23) is omitted from the apparatus of FIG. 25. The error detector 6f is connected with the DC controller 9 and the decoder 3. The error detector 6f is similar to the error detector 6d in FIG. 23.

The error detector 6f operates on a binary digital signal outputted from the decoder 3. The error detector 6f extracts low-frequency components from the binary digital signal, and generates a DC error signal from the extracted low-frequency components. The error detector 6f feeds the DC error signal to the DC controller 9.

Eighth Embodiment

Figure 26:
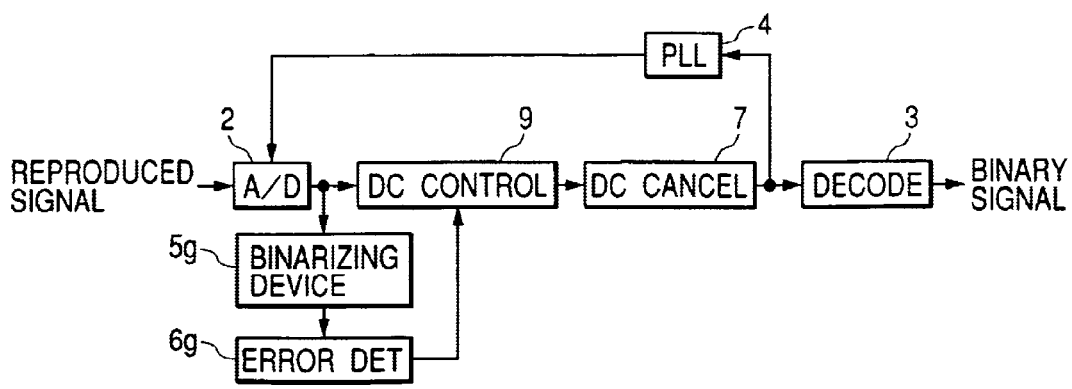
FIG. 26 is a block diagram of a digital signal reproducing apparatus according to an eighth embodiment of this invention.

FIG. 26 shows a digital signal reproducing apparatus according to an eighth embodiment of this invention. The apparatus of FIG. 26 includes an A/D converter 2, a decoder 3, a PLL circuit 4, a binarizing device 5g, an error detector 6g, a DC offset canceler 7, and a DC controller 9. The apparatus of FIG. 26 is similar to the apparatus of FIG. 23 except for design changes mentioned hereafter. The apparatus of FIG. 26 implements DC control of a feedforward type rather than a feedback type. The binarizing device 5g is connected between the A/D converter 2 and the error detector 6g. The error detector 6g is connected with the DC controller 9. The binarizing device 5g is similar to the binarizing device 5d in FIG. 23. The error detector 6g is similar to the error detector 6d in FIG. 23.

The binarizing device 5g operates on the digital signal outputted from the A/D converter 2. The binarizing device 5g converts the output signal of the A/D converter 2 into a bi-level signal (a binary signal). The binarizing device 5g feeds the bi-level signal to the error detector 6g. The error detector 6g extracts low-frequency components from the bi-level signal, and generates a DC error signal from the extracted low-frequency components. The error detector 6g feeds the DC error signal to the DC controller 9.

Ninth Embodiment

Figure 27:
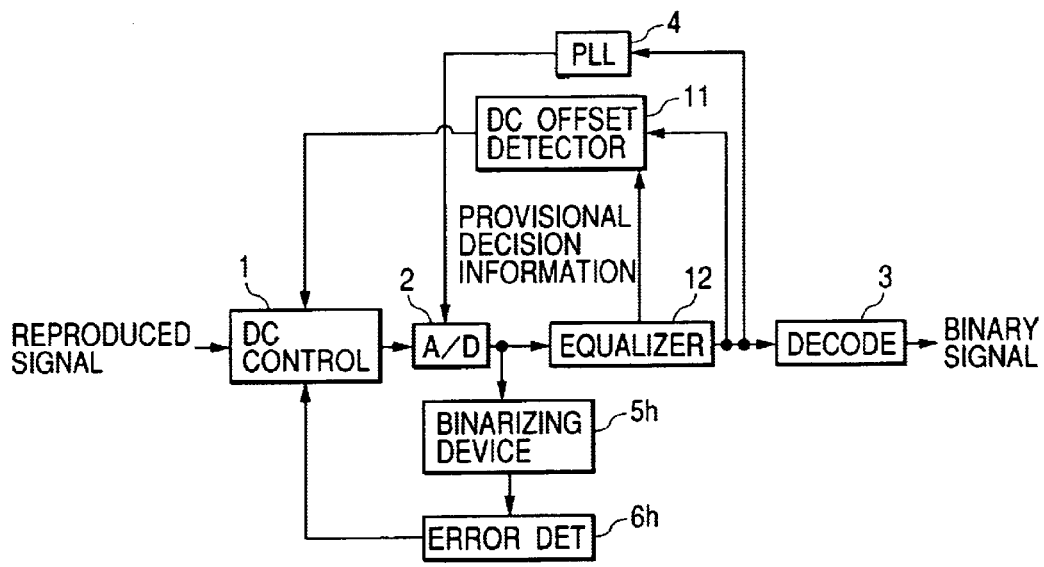
FIG. 27 is a block diagram of a digital signal reproducing apparatus according to a ninth embodiment of this invention.

FIG. 27 shows a digital signal reproducing apparatus according to a ninth embodiment of this invention. The apparatus of FIG. 27 includes a DC controller 1, an A/D converter 2, a decoder 3, a PLL circuit 4, a binarizing device 5a, an error detector 6a, a DC offset detector 11, and an equalizer 12. The apparatus of FIG. 27 is similar to the apparatus of FIG. 6 except for design changes mentioned hereafter. The equalizer 12 replaces the DC offset canceler 7 (see FIG. 6). The DC offset detector 11 is connected with the equalizer 12 and the DC controller 1.

The equalizer 12 subjects the output signal of the A/D converter 2 to an equalization procedure based on, for example, an LMS (least mean square) method to minimize the equalization error between an actual value and a provisionally-decided target value. The equalizer 12 feeds the equalization-resultant signal to the DC offset detector 11. In addition, the equalizer 12 feeds the equalization-resultant signal to the decoder 3 and the PLL circuit 4 as an equivalence to the digital DC-offset-canceled signal. The equalization procedure executed by the equalizer 12 includes provisional decision about a signal value. The equalizer 12 feeds the DC offset detector 11 with provisional decision information, that is, information representative of the result of the provisional decision. The provisional decision information indicates zero-cross points. The DC offset detector 11 selects every zero-corss point of the equalization-resultant signal in response to the provisional decision information, thereby extracting low-frequency components from the equalization-resultant signal and making the extracted low-frequency components into a signal representative of a detected DC offset. The DC offset detector 11 outputs the detected DC offset signal to the DC controller 1. The DC controller 1 adjusts the DC level of the reproduced analog-waveform signal in response to both the detected DC offset signal and the DC error signal fed from the error detector 6a.

Tenth Embodiment

Figure 28:
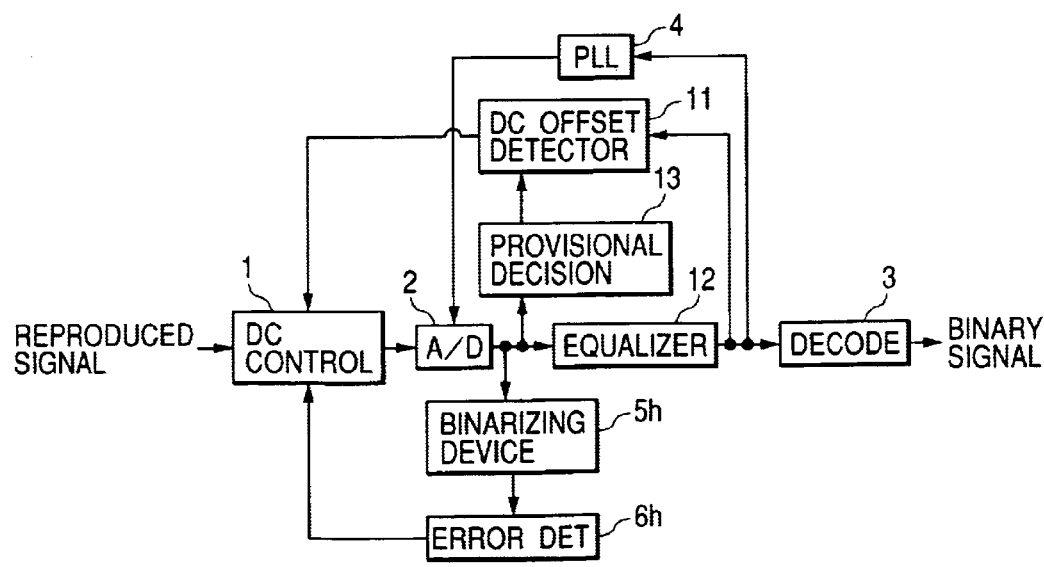
FIG. 28 is a block diagram of a digital signal reproducing apparatus according to a tenth embodiment of this invention.

FIG. 28 shows a digital signal reproducing apparatus according to a tenth embodiment of this invention. The apparatus of FIG. 28 includes a DC controller 1, an A/D converter 2, a decoder 3, a PLL circuit 4, a binarizing device 5a, an error detector 6a, a DC offset detector 11, an equalizer 12, and a provisional decision device 13.

The apparatus of FIG. 28 is similar to the apparatus of FIG. 27 except for design changes mentioned hereafter. The provisional decision device 13 is connected between the A/D converter 2 and the DC offset detector 11. The provisional decision device 13 is similar to the provisional decision device 174 in FIG. 16.

The provisional decision device 13 executes provisional decision in response to the output signal from the A/D converter 2, thereby generating provisional decision information. The provisional decision device 13 feeds the provisional decision information to the DC offset detector 11.

Eleventh Embodiment

Figure 29:
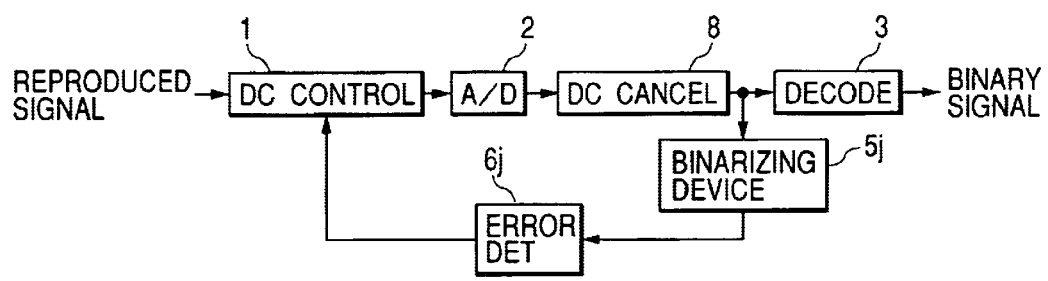
FIG. 29 is a block diagram of a digital signal reproducing apparatus according to an eleventh embodiment of this invention.

FIG. 29 shows a digital signal reproducing apparatus according to an eleventh embodiment of this invention. The apparatus of FIG. 29 includes a DC controller 1, an A/D converter 2, a decoder 3, a binarizing device 5j, an error detector 6j, and a DC offset canceler 8. The apparatus of FIG. 29 is similar to the apparatus of FIG. 18 except for design changes mentioned hereafter. The binarizing device 5j and the error detector 6j replace the binarizing device 5a and the error detector 6a of FIG. 18, respectively. The binarizing device 5j and the error detector 6j are similar to the binarizing device 5a and the error detector 6a of FIG. 18, respectively.

The binarizing device 5j operates on the digital DC-offset-canceled signal outputted from the DC offset canceler 8. The binarizing device 5j converts the digital DC-offset-canceled signal into a bi-level signal (a binary signal). The binarizing device 5j feeds the bi-level signal to the error detector 6j. The error detector 6j extracts low-frequency components from the bi-level signal, and generates a DC error signal from the extracted low-frequency components. The error detector 6j feeds the DC error signal to the DC controller 1.

Twelfth Embodiment

Figure 30:
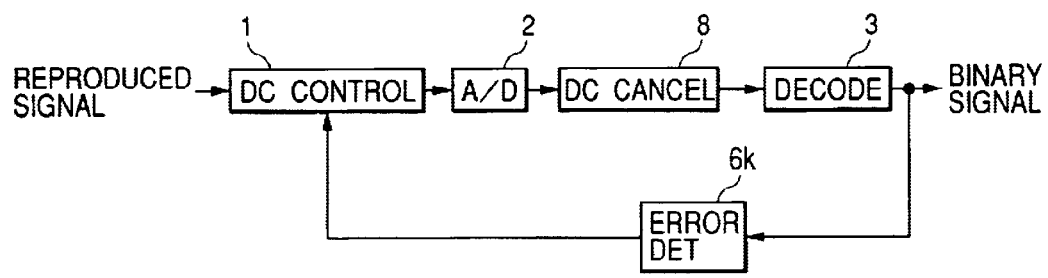
FIG. 30 is a block diagram of a digital signal reproducing apparatus according to a twelfth embodiment of this invention.

FIG. 30 shows a digital signal reproducing apparatus according to a twelfth embodiment of this invention. The apparatus of FIG. 30 includes a DC controller 1, an A/D converter 2, a decoder 3, an error detector 6k, and a DC offset canceler 8. The apparatus of FIG. 30 is similar to the apparatus of FIG. 18 except for design changes mentioned hereafter. The binarizing device 5a (see FIG. 18) is omitted from the apparatus of FIG. 30. The error detector 6k is connected with the DC controller 1 and the decoder 3. The error detector 6k is similar to the error detector 6a in FIG. 18.

The error detector 6k operates on a binary digital signal outputted from the decoder 3. The error detector 6k extracts low-frequency components from the binary digital signal, and generates a DC error signal from the extracted low-frequency components. The error detector 6k feeds the DC error signal to the DC controller 1.

Thirteenth Embodiment

Figure 31:
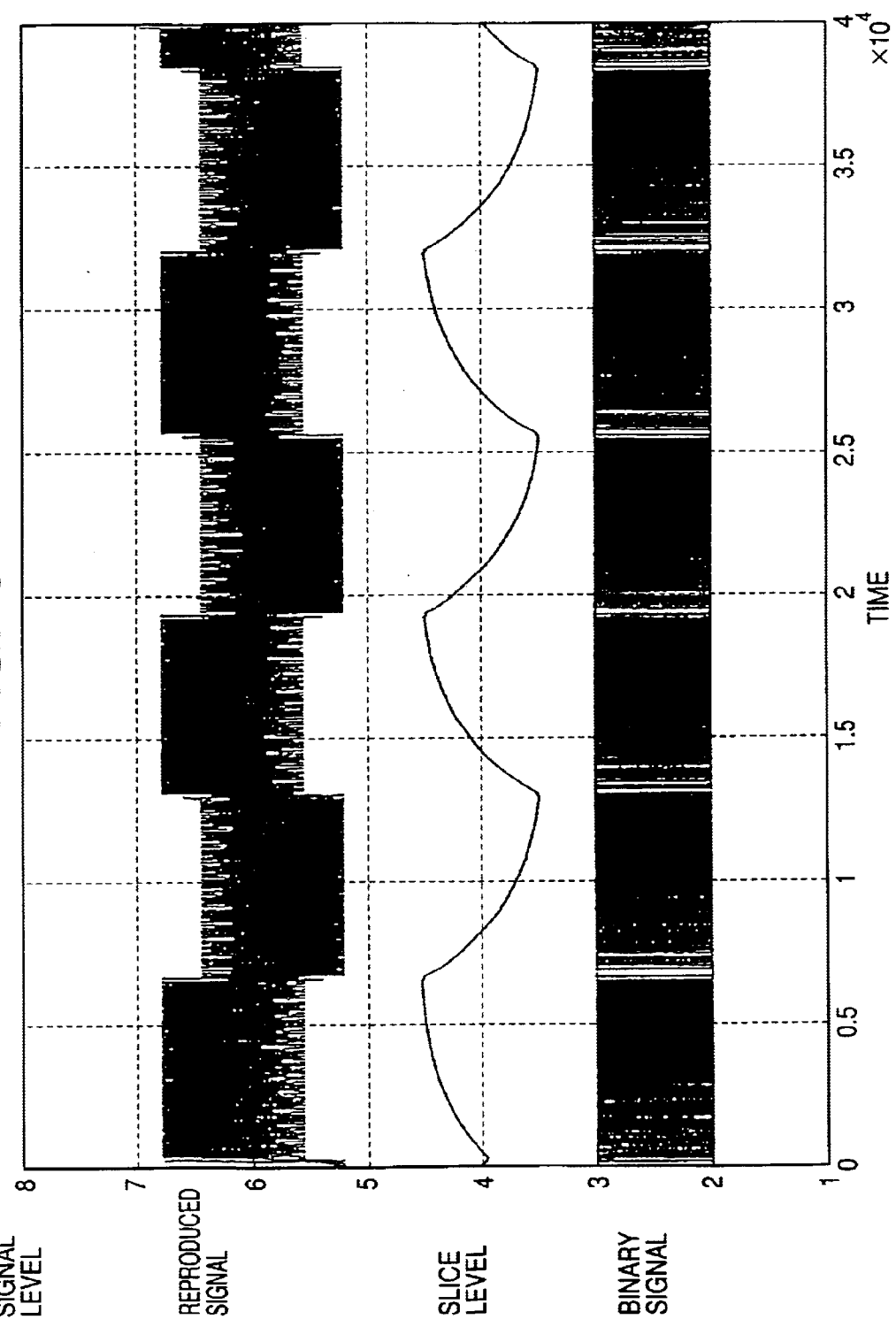
FIG. 31 is a time-domain diagram of a first example of a reproduced analog-waveform signal, a slice level, and a decoding-resultant binary signal.

A thirteenth embodiment of this invention relates to simulation which was made as to conditions where a reproduced analog-waveform signal representative of a binary digital signal of a modulation-resultant-code pattern having an appreciable offset was inputted into the prior-art apparatus of FIG. 1. FIG. 31 shows the results of the simulation which indicates time-domain variations in the reproduced analog-waveform signal, a slice level, and a decoding-resultant binary signal. In FIG. 31, the abscissa denotes time, and the ordinate denotes signal level. The reproduced analog-waveform signal cyclically changed at a period of 6000–7000 time units which corresponded to one sync block. The periodic change of the reproduced analog-waveform signal was caused by the fact that its original was generated by an encoding and modulating procedure including DSV (digital sum value or digital sum variation) control of decreasing a DSV value. In the presence of such an appreciable code-pattern offset, it is desirable that the slice level remains unchanged. FIG. 31 shows that the slice level greatly varied. The great variation in the slice level caused inaccurate recovery of the binary digital signal.

Figure 32:
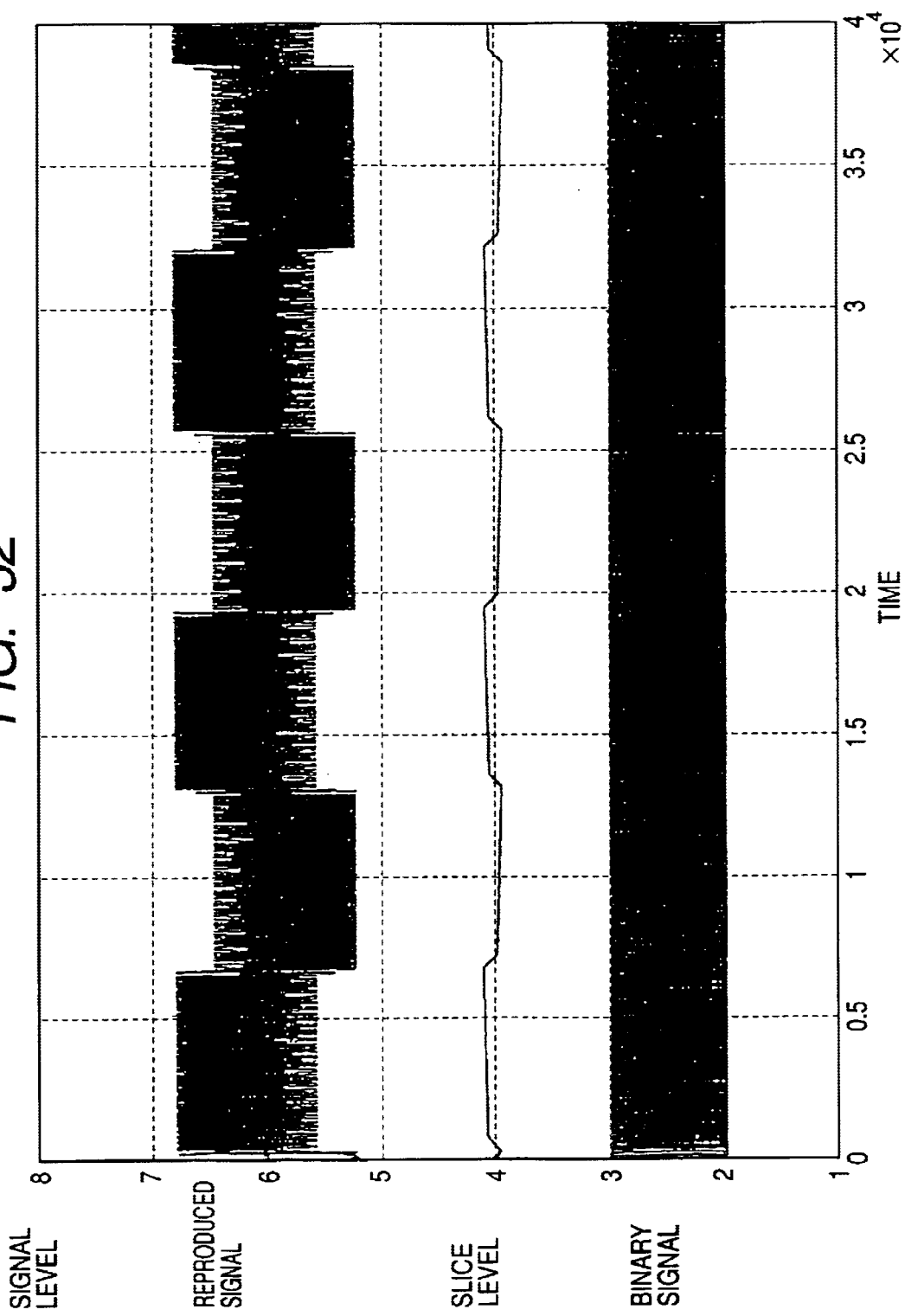
FIG. 32 is a time-domain diagram of a second example of a reproduced analog-waveform signal, a slice level, and a decoding-resultant binary signal.

A comparative apparatus was made on the basis of the prior-art apparatus in FIG. 1. The comparative apparatus included a variable-gain amplifier instead of the amplifier 905 (see FIG. 1). The comparative apparatus included the code offset detector 73 (see FIGS. 7 and 10) which was connected with the binarizing device 904 (see FIG. 1) and the variable-gain amplifier. The device 73 detected a code-pattern offset in the output signal from the binarizing device 904, and changed the gain of the variable-gain amplifier in response to the detected code-pattern offset. Simulation was made as to conditions where a reproduced analog-waveform signal representative of a binary digital signal of a modulation-resultant-code pattern having an appreciable offset was inputted into the comparative apparatus. FIG. 32 shows the results of the simulation which indicates time-domain variations in the reproduced analog-waveform signal, a slice level, and a decoding-resultant binary signal. In FIG. 32, the abscissa denotes time, and the ordinate denotes signal level. FIG. 32 shows that the slice level was prevented from greatly varying. Therefore, the binary digital signal was accurately recovered. This advantage was provided by the combination of the code offset detector 73 and the variable-gain amplifier.

Figure 33:
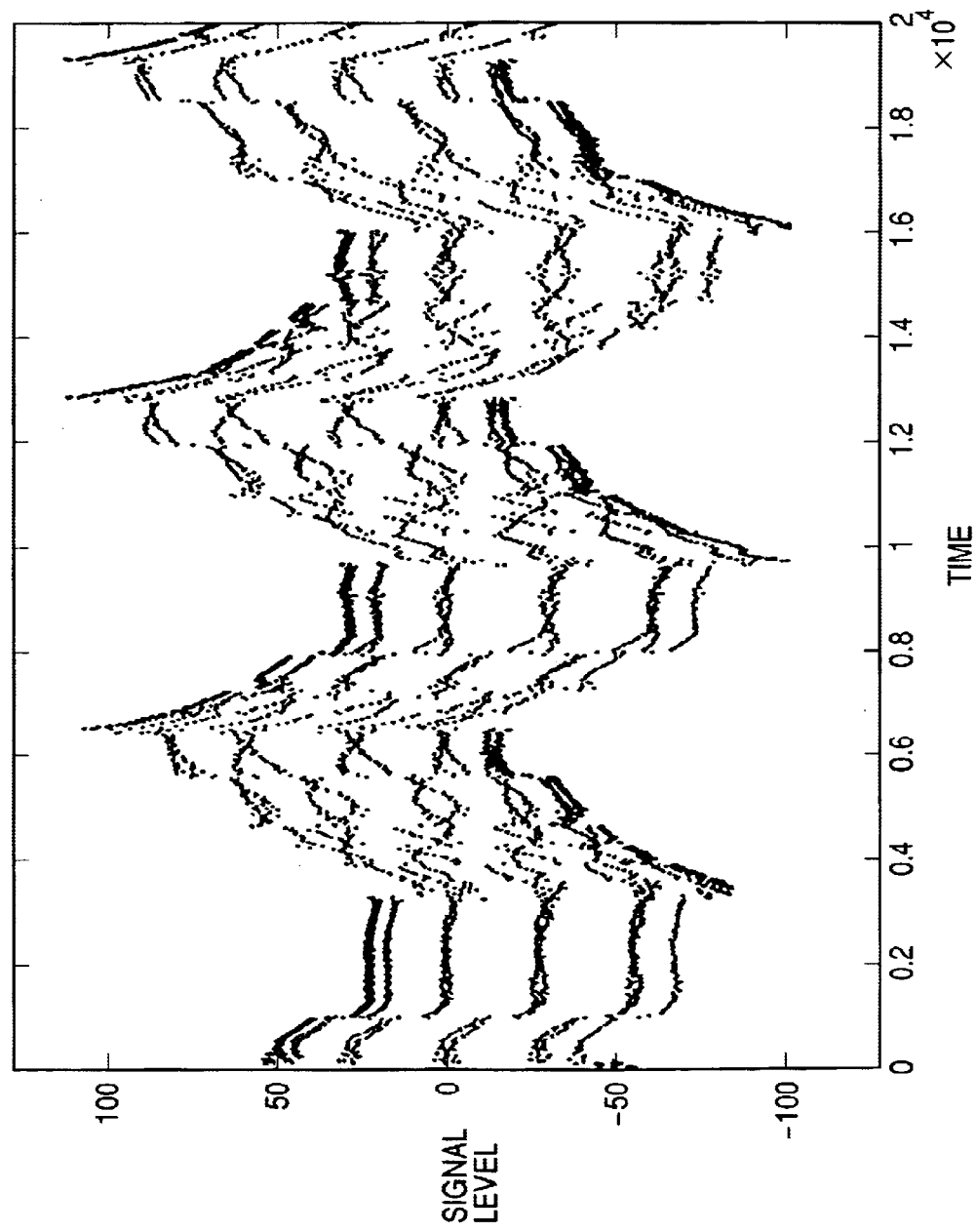
FIG. 33 is a time-domain diagram of a first example of an eye pattern formed by the output signal from a DC offset canceler.
Figure 34:
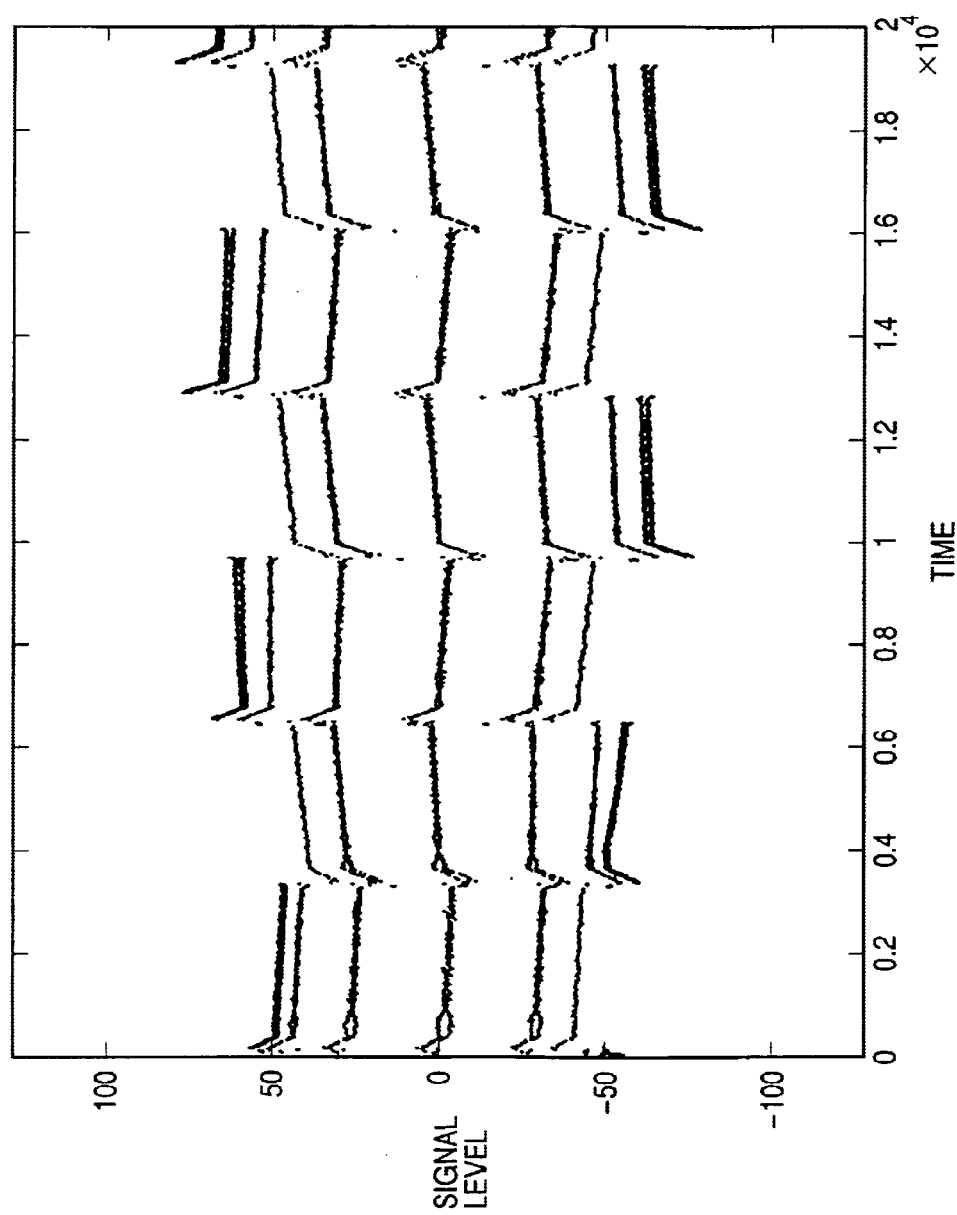
FIG. 34 is a time-domain diagram of a second example of the eye pattern formed by the output signal from the DC offset canceler.
Figure 35:
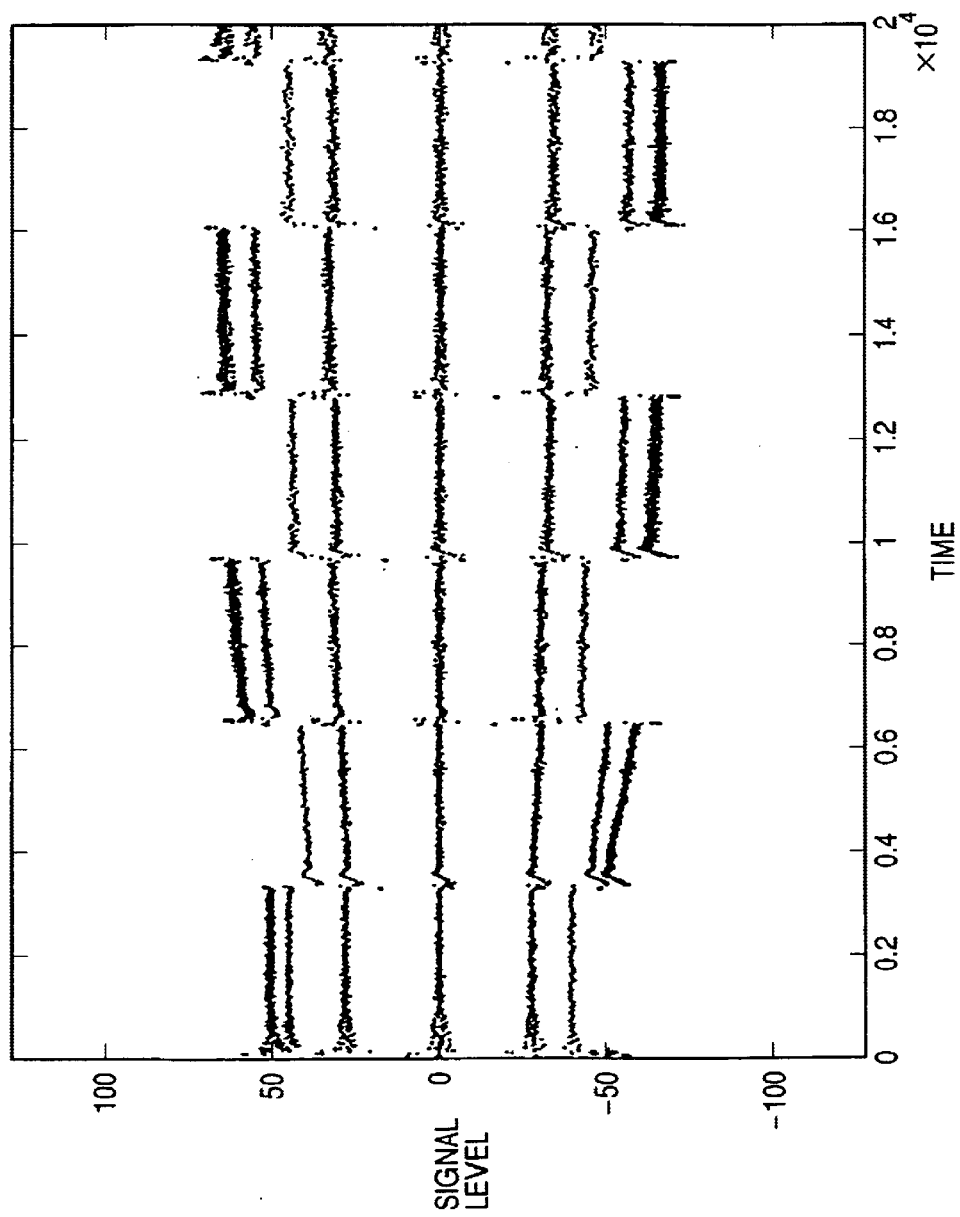
FIG. 35 is a time-domain diagram of a third example of the eye pattern formed by the output signal from the DC offset canceler.

Simulation was made as to the apparatus of FIG. 18 which was designed to implement equalization accorded with PR(1, 1, 1, 1). Here, "PR" means "partial response". FIG. 33 shows an example of the eye pattern formed by the output signal from the DC offset canceler 8 under the condition that the output signal of the DC offset detector 272 and also the output signal of the code offset detector 73 were fixed to their OFF states (their ineffective states). In FIG. 33, signal samples greatly deviated from target convergence values (±64, ±32, 0). This fact indicated that the PLL was out of its locked-up state, and the PR equalization was not correctly performed. FIG. 34 shows an example of the eye pattern formed by the output signal from the DC offset canceler 8 under the condition that the output signal of the DC offset detector 272 was fixed to its OFF state while the output signal of the code offset detector 73 was set to its ON state (its effective state). In FIG. 34, signal samples flocked to the target convergence values (±64, ±32, 0). Therefore, the PLL was in its locked-up state, and the PR equalization was correctly performed. FIG. 35 shows an example of the eye pattern formed by the output signal from the DC offset canceler 8 under the condition that the output signal of the DC offset detector 272 and also the output signal of the code offset detector 73 were set to their ON states. In FIG. 35, signal samples flocked to the target convergence values (±64, +32, 0). Therefore, the PLL was in its locked-up state, and the PR equalization was correctly performed. Furthermore, disorders in signal samples at the boundaries between sync blocks were suppressed. This suppression was provided by the DC offset detector 272.

Figure 36:
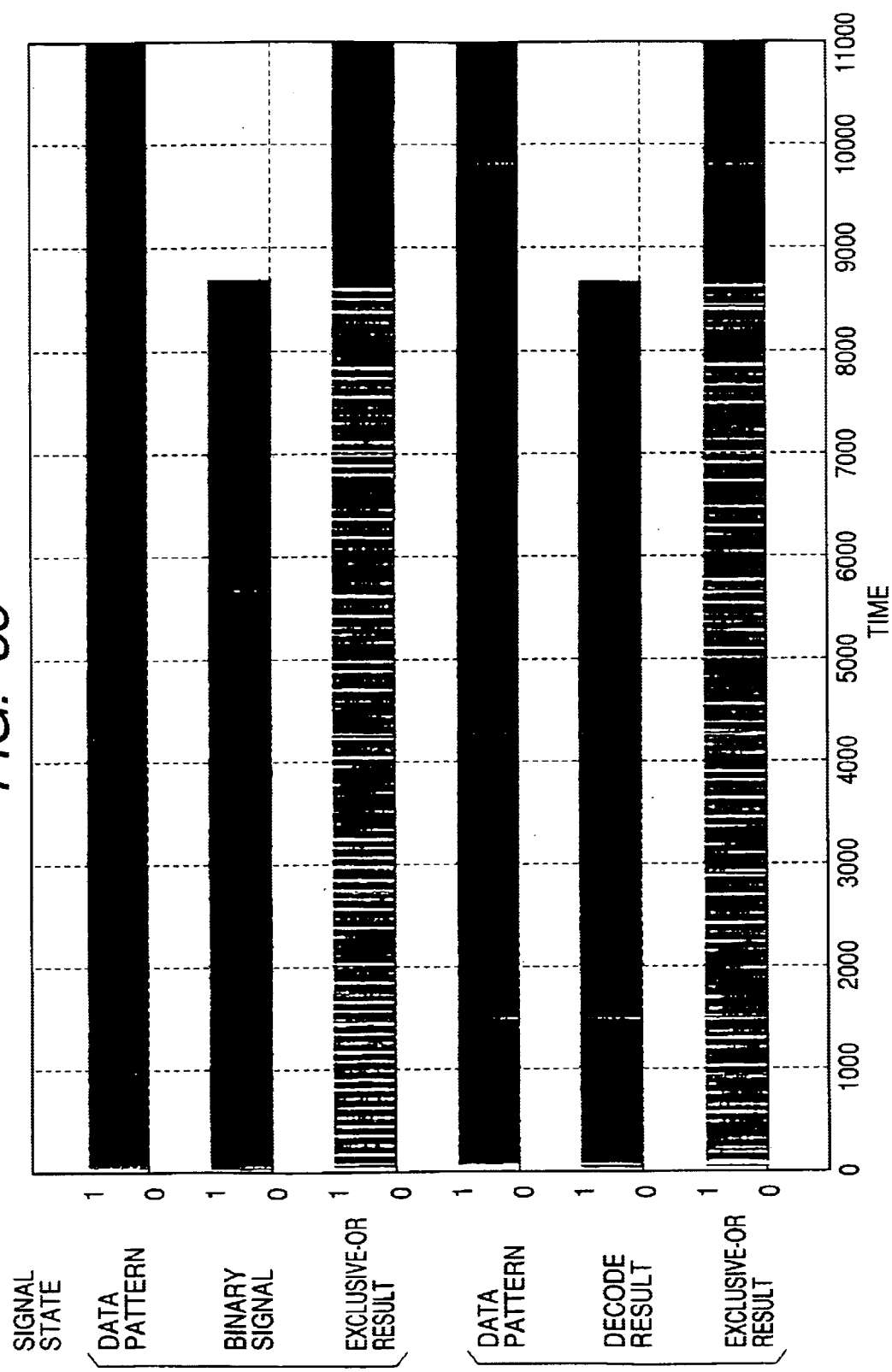
FIG. 36 is a time-domain diagram of first examples of a data pattern, a binary signal, and the result of Exclusive-OR operation between the data pattern and the binary signal.

FIG. 36 shows an example of a data pattern represented by a reproduced analog-waveform signal, a time-domain change in a binary signal derived from the output signal of the DPLL circuit 286, and a time-domain change in the result of Exclusive-OR operation between the data pattern and the binary signal (that is, the result of comparison between the data pattern and the binary signal) which occurred under the condition that the output signal of the DC offset detector 272 and also the output signal of the code offset detector 73 were fixed to their OFF states. The result of Exclusive-OR operation was "1" at almost all points. Thus, the binary signal was inaccurate. In addition, FIG. 36 shows an example of a data pattern represented by a reproduced analog-waveform signal, a time-domain change in a binary signal generated by the decoder 3, and a time-domain change in the result of Exclusive-OR operation between the data pattern and the binary signal (that is, the result of comparison between the data pattern and the binary signal) which occurred under the condition that the output signal of the DC offset detector 272 and also the output signal of the code offset detector 73 were fixed to their OFF states. The result of Exclusive-OR operation was "1" at almost all points. Thus, the binary signal was inaccurate.

Figure 37:
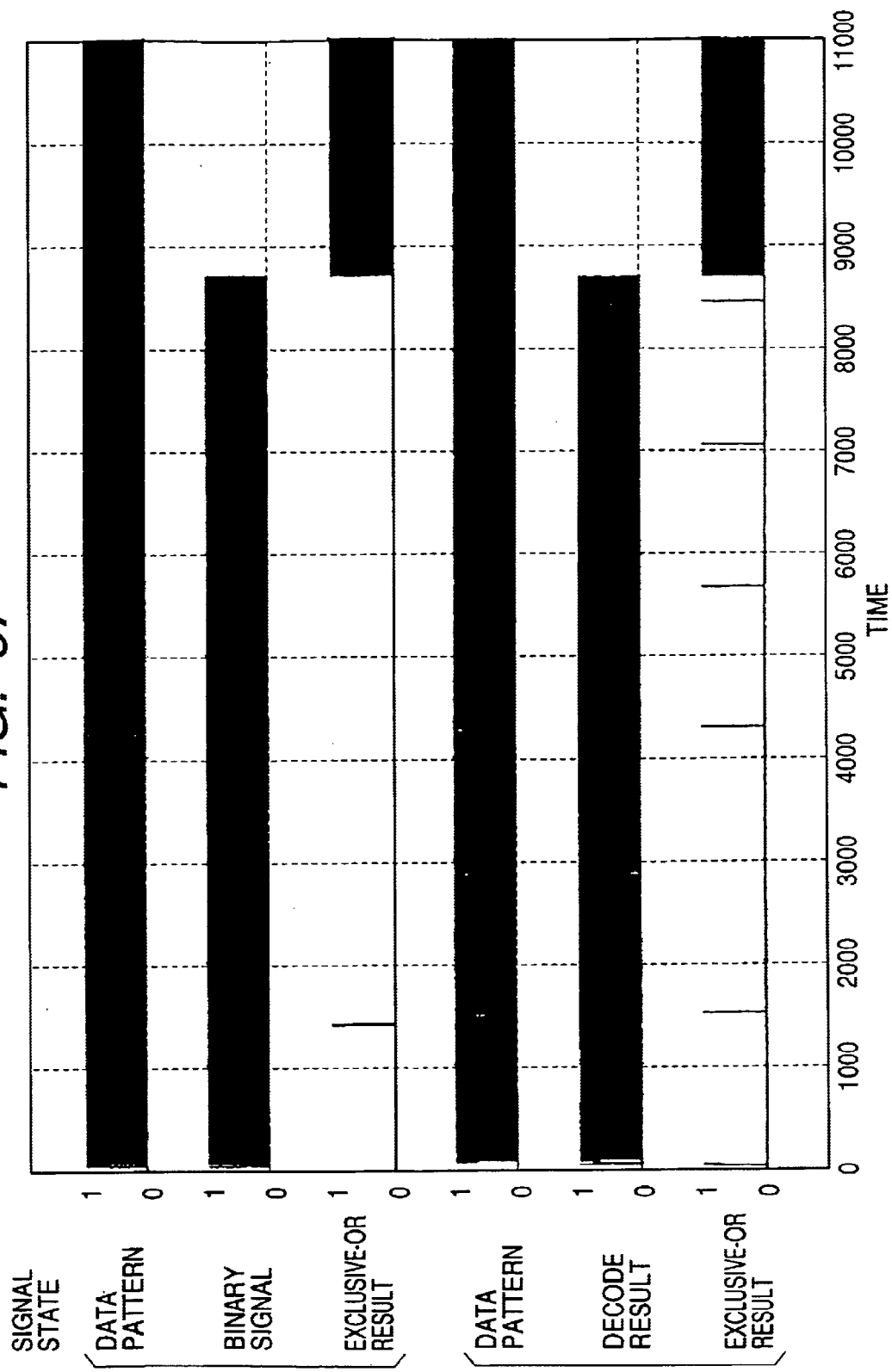
FIG. 37 is a time-domain diagram of second examples of a data pattern, a binary signal, and the result of Exclusive-OR operation between the data pattern and the binary signal.

FIG. 37 shows an example of a data pattern represented by a reproduced analog-waveform signal, a time-domain change in a binary signal derived from the output signal of the DPLL circuit 286, and a time-domain change in the result of Exclusive-OR operation between the data pattern and the binary signal which occurred under the condition that the output signal of the DC offset detector 272 was fixed to its OFF state while the output signal of the code offset detector 73 was set to its ON state. The result of Exclusive-OR operation was "0" at almost all points. Thus, the binary signal was accurate. In addition, FIG. 37 shows an example of a data pattern represented by a reproduced analog-waveform signal, a time-domain change in a binary signal generated by the decoder 3, and a time-domain change in the result of Exclusive-OR operation between the data pattern and the binary signal which occurred under the condition that the output signal of the DC offset detector 272 was fixed to its OFF state while the output signal of the code offset detector 73 was set to its ON state. The result of Exclusive-OR operation was "0" at almost all points. Thus, the binary signal was accurate.

Figure 38:
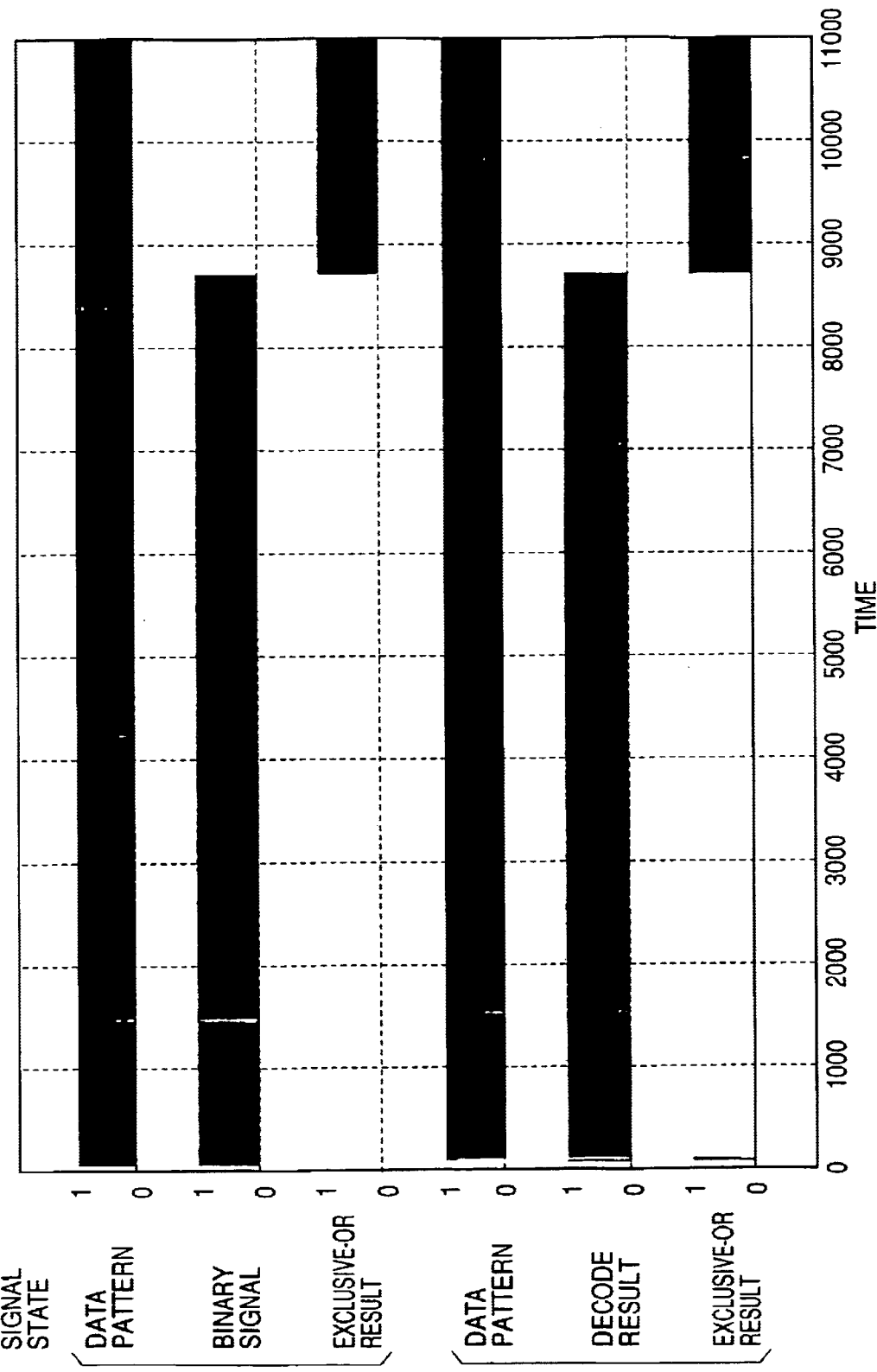
FIG. 38 is a time-domain diagram of third examples of a data pattern, a binary signal, and the result of Exclusive-OR operation between the data pattern and the binary signal.

FIG. 38 shows an example of a data pattern represented by a reproduced analog-waveform signal, a time-domain change in a binary signal derived from the output signal of the DPLL circuit 286, and a time-domain change in the result of Exclusive-OR operation between the data pattern and the binary signal which occurred under the condition that the output signal of the DC offset detector 272 and also the output signal of the code offset detector 73 were set to their ON states. The result of Exclusive-OR operation was "0" at almost all points. Thus, the binary signal was accurate. The degree of accuracy of the binary signal was higher than that of accuracy of the binary signal in FIG. 37. This advantage was provided by the the DC offset detector 272. In addition, FIG. 38 shows an example of a data pattern represented by a reproduced analog-waveform signal, a time-domain change in a binary signal generated by the decoder 3, and a time-domain change in the result of Exclusive-OR operation between the data pattern and the binary signal which occurred under the condition that the output signal of the DC offset detector 272 and also the output signal of the code offset detector 73 were set to their ON states. The result of Exclusive-OR operation was "0" at almost all points. Thus, the binary signal was accurate. The degree of accuracy of the binary signal was higher than that of accuracy of the binary signal in FIG. 37. This advantage was provided by the the DC offset detector 272.

Fourteenth Embodiment

Figure 39:
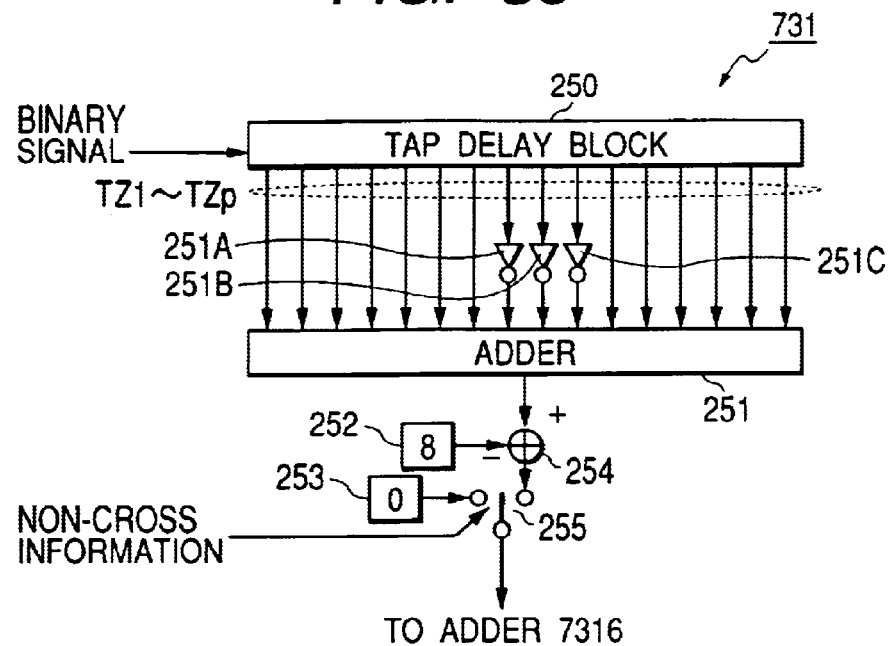
FIG. 39 is a block diagram of an offset extractor according to a fourteenth embodiment of this invention.

FIG. 39 shows an offset extractor 731 according to a fourteenth embodiment of this invention. The offset extractor 731 is similar to that in FIG. 11 except for design changes mentioned hereafter. The signal generators 7313 and 7314, and the switch 7315 (see FIG. 11) are omitted from the offset extractor 731 in FIG. 39.

As shown in FIG. 39, the offset extractor 731 includes a tap delay block 250, NOT blocks 251A, 251B, and 251C, an Exclusive-OR and adder block 251D, signal generators 252 and 253, a subtracter 254, and a switch 255. The tap delay block 250 is composed of "p" delay elements connected in cascade (series), where "p" denotes a predetermined natural number. Each of the delay elements has, for example, a D flip-flop. Each of the delay elements responds to the bit clock signal, and provides a signal delay corresponding to one bit. The bi-level DC-controlled signal outputted from the binarizing device 5a (see FIG. 6) propagates through the delay elements in the tap delay block 250 while being delayed thereby. The resultant delayed signals (the tap signals) TZ1, TZ2, . . . , and TZp appear at taps in the tap delay block 250 which are formed by the junctions among the delay elements, respectively. The first tap signal TZ1 may be non-delayed. The delays between the neighboring tap signals TZ1–TZp correspond to one bit. For example, the number "p" is equal to 16. The tap signals TZ1–TZ7 and TZ1–TZ16 are applied to the Exclusive-OR and adder block 251D. The tap signals TZ8, TZ9, and TZ10 are applied to the NOT blocks 251A, 251B, and 251C, respectively. The tap signals TZ8, TZ9, and TZ10 are inverted by the NOT blocks 251A, 251B, and 251C, being made into inversion-resultant tap signals TZIN8, TZIN9, and TZIN10, respectively. The inversion-resultant tape signals TZIN8, TZIN9, and TZIN10 are applied to the Exclusive-OR and adder block 251D. The Exclusive-OR and adder block 251D executes Exclusive-OR operation between a bit code pattern of "0000000000000000" and the tap signals TZ1–TZ7, TZIN8–TZIN10, and TZ11–TZ16 on a bit-by-bit basis. Since the NOT blocks 251A–251C invert the tap signals TZ8–TZ10, calculation is made as to a correlation between the bi-level DC-controlled signal and a predetermined code pattern ("0000000111000000") chosen in consideration of run length limiting rules providing a minimum inversion period of "3". The Exclusive-OR and adder block 251D adds all the bits of the Exclusive-OR operation result. The Exclusive-OR and adder block 251D outputs a signal representative of the addition result to the subtracter 254. The signal generator 252 outputs a signal to the subtracter 254 which represents a value of "8" equal to "p/2". The device 254 subtracts "8" from the addition result. The subtracter 254 outputs a signal representative of the subtraction result to the switch 255. The signal generator 253 outputs a signal to the switch 255 which represents a value of "0". The switch 255 responds to the non-cross information fed from the non-cross detector 733 (see FIG. 10). When the non-cross information is "1", the switch 255 selects the output signal of the signal generator 253. When the non-cross information is "0", the switch 255 selects the output signal of the subtracter 254. The switch 255 transmits the selected signal to the adder 7316 (see FIG. 11).

Fifteenth Embodiment

Figure 40:
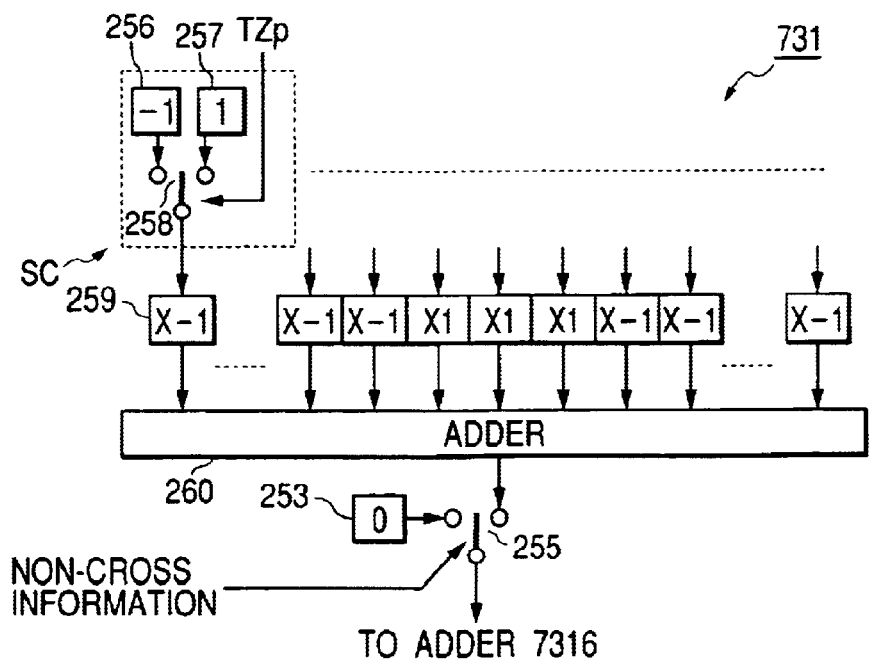
FIG. 40 is a block diagram of an offset extractor according to a fifteenth embodiment of this invention.

FIG. 40 shows an offset extractor 731 according to a fifteenth embodiment of this invention. The offset extractor 731 is similar to that in FIG. 39 except for design changes mentioned hereafter.

As shown in FIG. 40, the offset extractor 731 includes a signal converter SC for each of the tap signals TZ1–TZp. The signal converter SC for each of the tap signals TZ1–TZ7 and TZ11–TZ16 includes signal generators 256 and 257, a switch 259, and an Exclusive-OR circuit 259. The signal generator 256 outputs a signal to the switch 258 which represents a value of "−1". The signal generator 257 outputs a signal to the switch 258 which represents a value of "+1". The switch 258 responds to the related tap signal TZ. When the tap signal TZ is "0", the switch 258 selects the "−1" signal. When the tap signal TZ is "1", the switch 258 selects the "+1" signal. The switch 258 outputs the selected signal to the Exclusive-OR circuit 259. The device 259 executes Exclusive-OR operation between the output signal of the switch 258 and a signal of "−1". The device 259 outputs a signal representative of the Exclusive-OR operation result to an adder block 260.

The signal converter SC for each of the tap signals TZ8–TZ10 includes signal generators 256 and 257, a switch 259, and an Exclusive-OR circuit 259. The signal generator 256 outputs a signal to the switch 258 which represents a value of "−1". The signal generator 257 outputs a signal to the switch 258 which represents a value of "+1". The switch 258 responds to the related tap signal TZ. When the tap signal TZ is "0", the switch 258 selects the "−1" signal. When the tap signal TZ is "1", the switch 258 selects the "+1" signal. The switch 258 outputs the selected signal to the Exclusive-OR circuit 259. The device 259 executes Exclusive-OR operation between the output signal of the switch 258 and a signal of "+1". The device 259 outputs a signal representative of the Exclusive-OR operation result to the adder block 260.

The adder block 260 adds all the Exclusive-OR operation results. The adder block 260 outputs a signal representative of the addition result to the switch 255. The signal generator 253 outputs a signal to the switch 255 which represents a value of "0". The switch 255 responds to the non-cross information fed from the non-cross detector 733 (see FIG. 10). When the non-cross information is "1", the switch 255 selects the output signal of the signal generator 253. When the non-cross information is "0", the switch 255 selects the output signal of the subtracter 254. The switch 255 transmits the selected signal to the adder 7316 (see FIG. 11).

Sixteenth Embodiment

A sixteenth embodiment of this invention is a modification of the fourteenth embodiment or the fifteenth embodiment thereof. In the sixteenth embodiment of this invention, a correlation between an 8-bit reproduced signal and a predetermined code pattern is calculated by using multipliers. The predetermined code pattern may be close to a partial response related to a reproduced signal.

Seventeenth Embodiment

Figure 41:
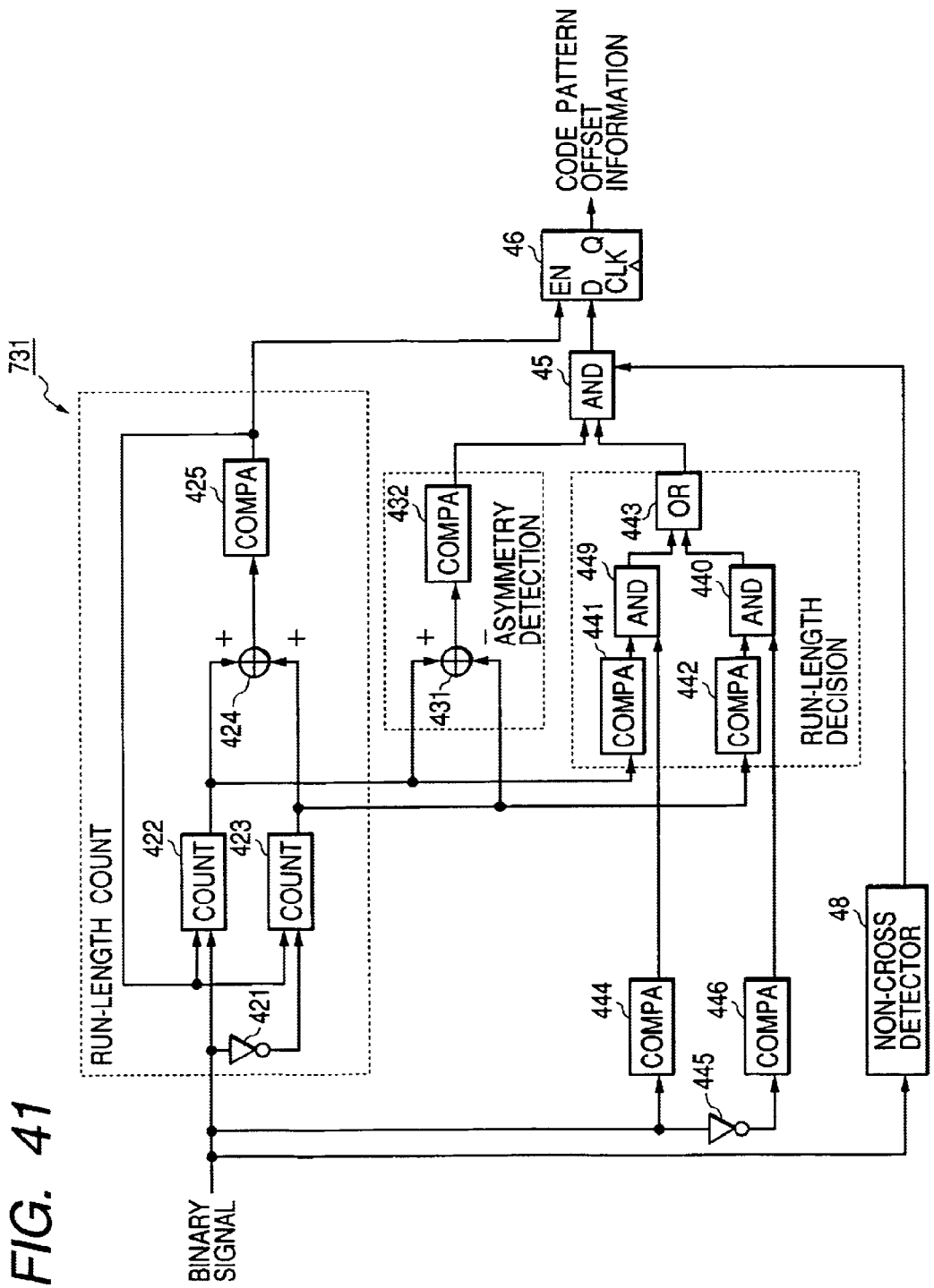
FIG. 41 is a block diagram of an offset extractor according to a seventeenth embodiment of this invention.

FIG. 41 shows an offset extractor 731 according to a seventeenth embodiment of this invention. The offset extractor 731 in FIG. 41 includes a run length count block 42, an upper/lower-asymmetry detection block 43, and a run length decision block 44. The run length count block 42 has a NOT circuit 421, counters 422 and 423, an adder 424, and a comparator 425. The upper/lower-asymmetry detection block 43 has a subtracter 431 and a comparator 432. The run length decision block 44 has an AND circuit 440, comparators 441 and 442, an OR circuit 443, and an AND circuit 449.

The bi-level DC-controlled signal outputted from the binarizing device 5a (see FIG. 6) is fed to the counter 422 and the NOT circuit 421 in the run length count block 42. The NOT circuit 421 inverts the bi-level DC-controlled signal. The NOT circuit 421 outputs the inversion-resultant signal to the counter 423. The counters 422 and 423 are similar in structure. The counter 422 measures the length of every time interval during which the bi-level DC-controlled signal remains "1" by counting pulses of the bit clock signal or a system clock signal. The counter 422 outputs a signal representative of the measured time interval as a 1-run length signal. The combination of the NOT circuit 421 and the counter 423 measures the length of every time interval during which the bi-level DC-controlled signal remains "0" by counting pulses of the bit clock signal or the system clock signal. The combination of the NOT circuit 421 and the counter 423 outputs a signal representative of the measured time interval as a 0-run length signal. The adder 424 adds the 1-run length signal and the 0-run length signal. The adder 424 outputs a signal representative of the addition result to the comparator 425. The device 425 compares the addition result with a prescribed value. When the addition result exceeds the prescribed value, the comparator 425 sets an initial signal to "1". Otherwise, the comparator 425 sets the initial signal to "0". The comparator 425 applies the initial signal to the counters 422 and 423. The counters 422 and 423 are reset by the initial signal being "1". The addition result generated by the adder 424 indicates a counting-based measured lapse of time with respect to the bi-level DC-controlled signal. Accordingly, the initial signal repetitively assumes "1" and hence the counters 422 and 423 are cyclically reset at a constant period measured by the bit cock signal or the system clock signal.

The 1-run length signal and the 0-run length signal are fed from the run length count block 42 to the subtracter 431 in the upper/lower-asymmetry detection block 43. The device 431 subtracts the 0-run length signal from the 1-run length signal. The subtracter 431 outputs a signal representative of the subtraction result to the comparator 432. The device 432 compares the absolute value of the subtraction result with a prescribed value. When the absolute value of the subtraction result exceeds the prescribed value, the comparator 432 sets an upper/lower-asymmetry information to "1". Otherwise, the comparator 432 sets the upper/lower-asymmetry information to "0". In this way, the upper/lower-asymmetry detection block 43 senses an appreciable asymmetry between 1-run lengths and 0-run lengths, that is, an appreciable asymmetry between upper waveform portions and lower waveform portions.

The 1-run length signal is fed from the run length count block 42 to the comparator 441 in the run length decision block 44. The 0-run length signal is fed from the run length count block 42 to the comparator 442 in the run length decision block 44. The comparators 441 and 442 are similar in structure. The device 441 compares the value represented by the 1-run length signal with a prescribed value. When the value represented by the 1-run length signal is smaller than the prescribed value, the comparator 441 outputs a signal of "1" to the AND circuit 449. Otherwise, the comparator 441 outputs a signal of "0" to the AND circuit 449. The device 442 compares the value represented by the 0-run length signal with a prescribed value. When the value represented by the 0-run length signal is smaller than the prescribed value, the comparator 442 outputs a signal of "1" to the AND circuit 440. Otherwise, the comparator 442 outputs a signal of "0" to the AND circuit 440.

The offset extractor 731 in FIG. 41 includes a comparator 444, a NOT circuit 445, and a comparator 446. The comparators 444 and 446 are similar in structure. The comparator 444 and the NOT circuit 445 receive the bi-level DC-controlled signal from the binarizing device 5a (see FIG. 6). The device 444 compares the value represented by the bi-level DC-controlled signal with a prescribed value. When the value represented by the bi-level DC-controlled signal is smaller than the prescribed value, the comparator 444 outputs a signal of "1" to the AND circuit 449 in the run length decision block 44. Otherwise, the comparator 444 outputs a signal of "0" to the AND circuit 449. The output signal of the comparator 444 remains in the same state until the initial signal assumes "1" next. The NOT circuit 445 inverts the bi-level DC-controlled signal. The NOT circuit 445 outputs the inversion-resultant signal to the comparator 446. The device 446 compares the value represented by the output signal of the NOT circuit 445 with a prescribed value. When the value represented by the output signal of the NOT circuit 445 is smaller than the prescribed value, the comparator 446 outputs a signal of "1" to the AND circuit 440 in the run length decision block 44. Otherwise, the comparator 446 outputs a signal of "0" to the AND circuit 440. The output signal of the comparator 446 remains in the same state until the initial signal assumes "1" next.

The AND circuit 449 executes AND operation between the output signals of the comparators 441 and 444. The AND circuit 449 outputs a signal representative of the AND operation result to the OR circuit 443. The AND circuit 440 executes AND operation between the output signals of the comparators 442 and 446. The AND circuit 440 outputs a signal representative of the AND operation result to the OR circuit 443. The OR circuit 443 executes OR operation between the output signals of the AND circuits 440 and 449. The OR circuit 443 outputs a signal representative of the OR operation result as run length decision information.

The run length decision block 44 detects that 1-run lengths or 0-run lengths are extremely short, and that long run lengths are absent from an extremely-short run length side. The result of the detection is reflected in the run length decision information outputted from the OR circuit 443.

The offset extractor 731 in FIG. 41 includes a non-cross detector 48 similar to the non-cross detector 733 of FIGS. 10 and 12. The non-cross detector 48 receives the bi-level DC-controlled signal from the binarizing device 5a (see FIG. 6). The non-cross detector 48 generates non-cross information in response to the bi-level DC-controlled signal.

The offset extractor 731 in FIG. 41 further includes an AND circuit 45 and a D flip-flop 46. The AND circuit 45 receives the upper/lower-asymmetry information from the upper/lower-asymmetry detection block 43. The AND circuit 45 receives the run length decision information from the run length decision block 44. The AND circuit 45 receives the non-cross information from the non-cross detector 48. The AND circuit 45 executes AND operation among the upper/lower-asymmetry information, the run length decision information, and the non-cross information. The AND circuit 45 outputs a signal representative of the AND operation result to a D input terminal of the D flip-flop 46. The D flip-flop 46 has an enable terminal receiving the initial signal from the run length count block 42. The D flip-flop 46 has a clock input terminal receiving the bit clock signal or the system clock signal. The D flip-flop 46 samples and holds the output signal of the AND circuit 45 in response to the bit clock signal or the system clock signal when being enabled by the initial signal of "1". The D flip-flop 46 outputs the held signal as an extracted information signal. The offset extractor 731 in FIG. 41 can reliably detect the reproduced-signal condition corresponding to the eye pattern of FIG. 5. In more detail, the offset extractor 731 in FIG. 41 can reliably discriminate the reproduced-signal condition corresponding to the eye pattern of FIG. 5 from that corresponding to the eye pattern of FIG. 3. The extracted information signal outputted from the D flip-flop 46 indicates whether or not the reproduced-signal condition corresponding to the eye pattern of FIG. 5 currently occurs.

Eighteenth Embodiment

FIG. 42 shows a digital signal reproducing apparatus according to an eighteenth embodiment of this invention. The apparatus of FIG. 42 includes a binarizing device 301, a code offset detector 302, a variable-gain amplifier 303, and an integrator 304.

The binarizing device 301 is connected with the code offset detector 302, the variable-gain amplifier 303, and the integrator 304. The code offset detector 302 is connected with the variable-gain amplifier 303. The variable-gain amplifier 303 is connected with the integrator 304.

An analog-waveform signal reproduced from a recording medium such as an optical disc represents a binary digital signal being a stream of bits. The reproduced analog-waveform signal is fed via a preamplifier (not shown) to the binarizing device 301. The binarizing device 301 includes a comparator. The binarizing device 301 compares the reproduced analog-waveform signal with a slice level or a threshold level, thereby converting the reproduced analog-waveform signal into a bi-level signal (a binary digital signal). The binarizing device 301 outputs the bi-level signal to an external device (not shown) as a demodulated digital signal. In addition, the binarizing device 301 feeds the bi-level signal to the code offset detector 302 and the variable-gain amplifier 303.

The code offset detector 302 is similar to the code offset detector 73 in FIGS. 7 and 10. The variable-gain amplifier 303 is similar to one of the variable-gain amplifiers 71 in FIGS. 7, 8, and 9. The variable-gain amplifier 303 amplifies the bi-level signal at a gain determined by an output signal from the code offset detector 302. The variable-gain amplifier 303 outputs the amplification-resultant signal to the integrator 304. The integrator 304 extracts low-frequency components from the output signal of the variable-gain amplifier 303, and makes the extracted low-frequency components into the slice level (the threshold level). The integrator 304 feeds the slice level to the binarizing device 301. The code offset detector 302 detects a difference in number between bits of "0" and bits of "1" represented by a modulation-resultant code in the bi-level signal. The code offset detector 302 generates code pattern offset information (modulation-resultant-code pattern offset information) from the detected difference. The code offset detector 302 outputs a signal representative of the code pattern offset information to the variable-gain amplifier 303. The gain of the variable-gain amplifier 303 depends on the code pattern offset information. In more detail, when the code offset detector 302 decides that there is an appreciable modulation-resultantcode offset, the variable-gain amplifier 303 decreases its gain. Thus, in this case, a variation in the slice level is relatively suppressed.

Nineteenth Embodiment

FIG. 43 shows a digital signal reproducing apparatus according to a nineteenth embodiment of this invention. The apparatus of FIG. 43 includes a DC controller 1, an A/D converter 2, a decoder 3, a binarizing device 5a, an error detector 6a, an equalizer 281, and a DPLL circuit 286. The apparatus of FIG. 43 is similar to the apparatus of FIG. 6 except for design changes mentioned hereafter. A combination of the equalizer 281 and the DPLL circuit 286 replaces the DC offset canceler 7 in FIG. 6. The DPLL circuit 286 is connected with the A/D converter 2 and the equalizer 281. The equalizer 281 is connected with the decoder 3.

The A/D converter 2 changes the analog output signal from the DC controller 1 into a corresponding digital signal. The A/D converter 2 outputs the digital signal to the binarizing device 5a and the DPLL circuit 286. The DPLL circuit 286 is the same as that in FIG. 19 or FIG. 20. The DPLL circuit 286 resamples the output signal of the A/D converter 2 through at least one of interpolation and decimation, thereby generating a resampling-resultant signal having a bit rate equal to a prescribed channel bit rate and also generating a bit clock signal. Stages following the DPLL circuit 286 operate in response to the bit clock signal generated thereby. The DPLL circuit 286 outputs the resampling-resultant signal to the equalizer 281. The equalizer 281 is the same as that in FIG. 19 or FIG. 20. The equalizer 281 subjects the output signal of the DPLL circuit 286 to an equalization procedure. The equalizer 281 feeds the equalization-resultant signal to the decoder 3 as a digital DC-offset-canceled signal.

It should be noted that the equalizer 281 may be omitted from the apparatus of FIG. 43.

Figure 44:
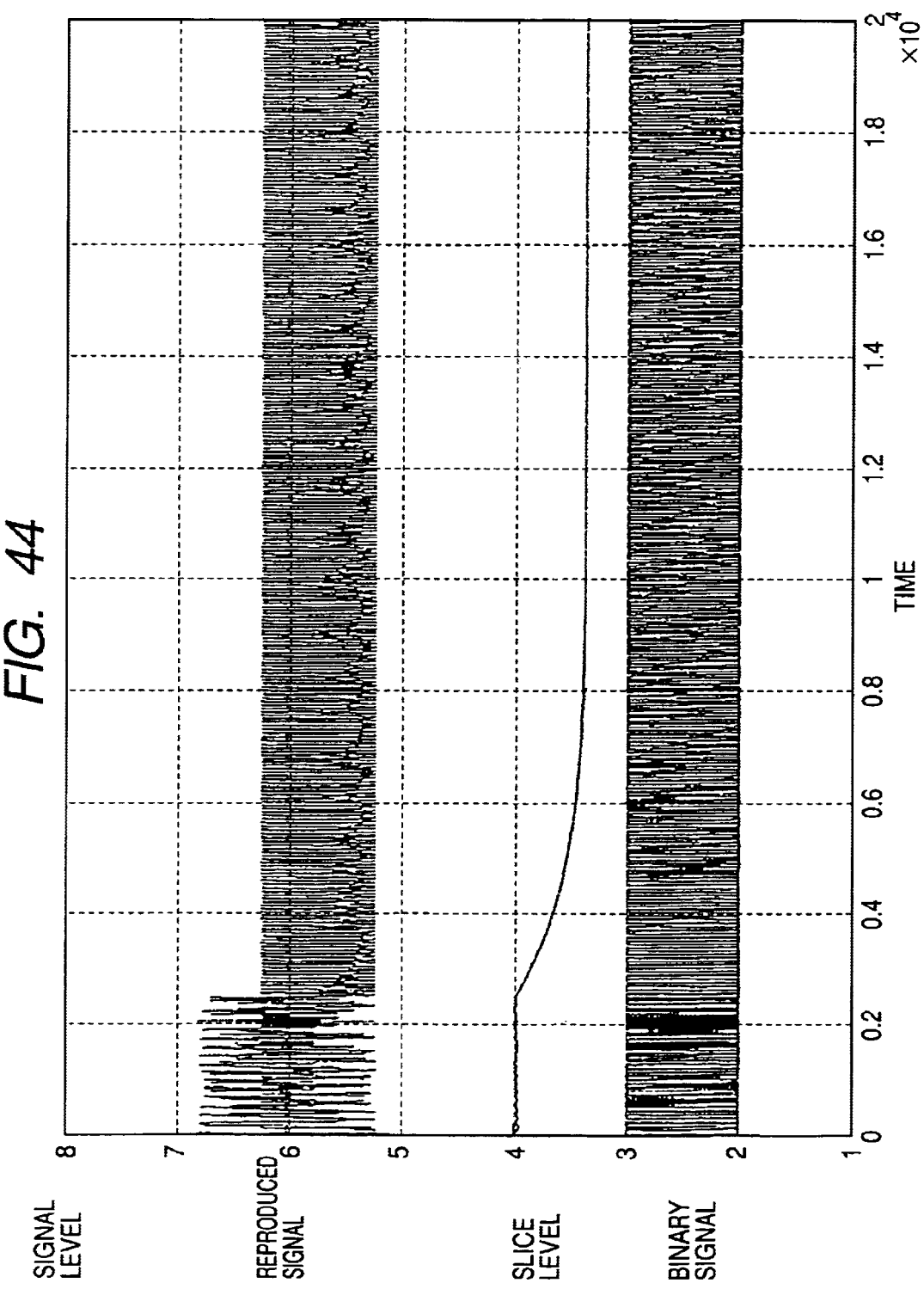
FIG. 44 is a time-domain diagram of a first example of a reproduced analog-waveform signal, a slice level, and a decoding-resultant binary signal.
Figure 45:
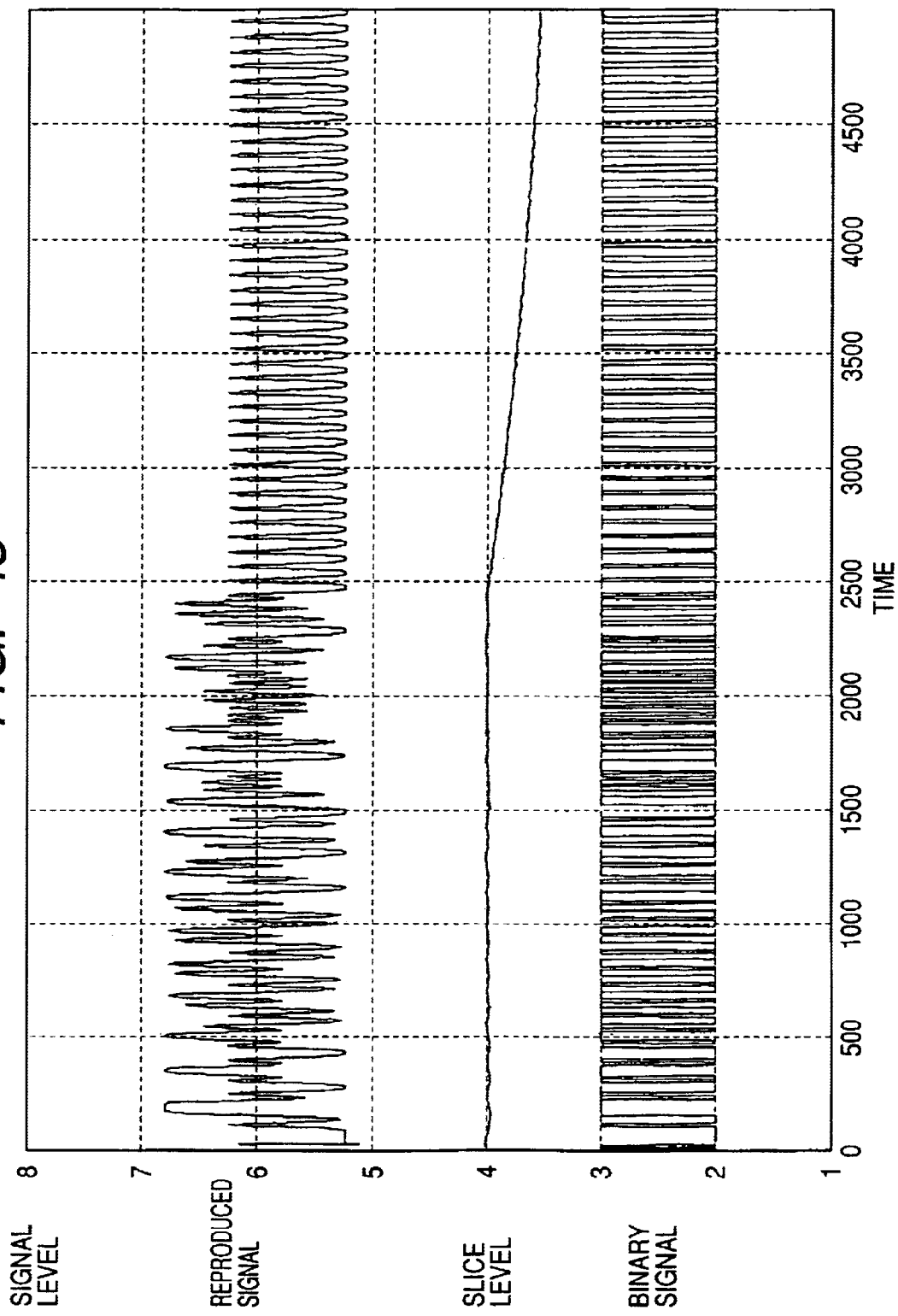
FIG. 45 is a temporally-elongated diagram of a portion of FIG. 44.

Simulation was made as to conditions where a reproduced analog-waveform signal representative of a binary digital signal was inputted into the prior-art apparatus of FIG. 1. FIGS. 44 and 45 show the results of the simulation which indicate time-domain variations in the reproduced analog-waveform signal, a slice level, and a decoding-resultant binary signal. In each of FIGS. 44 and 45, the abscissa denotes time, and the ordinate denotes signal level. At a time point of 2400 time units, the reproduced analog-waveform signal was changed from a state corresponding to the eye pattern of FIG. 2 to a state corresponding to the eye pattern of FIG. 5. At that time point, the slice level started dropping. Finally, the slice level reached a bottom signal value (a lowermost signal value). As a result of the low slice level, the decoding-resultant binary signal was inaccurate.

Figure 46:
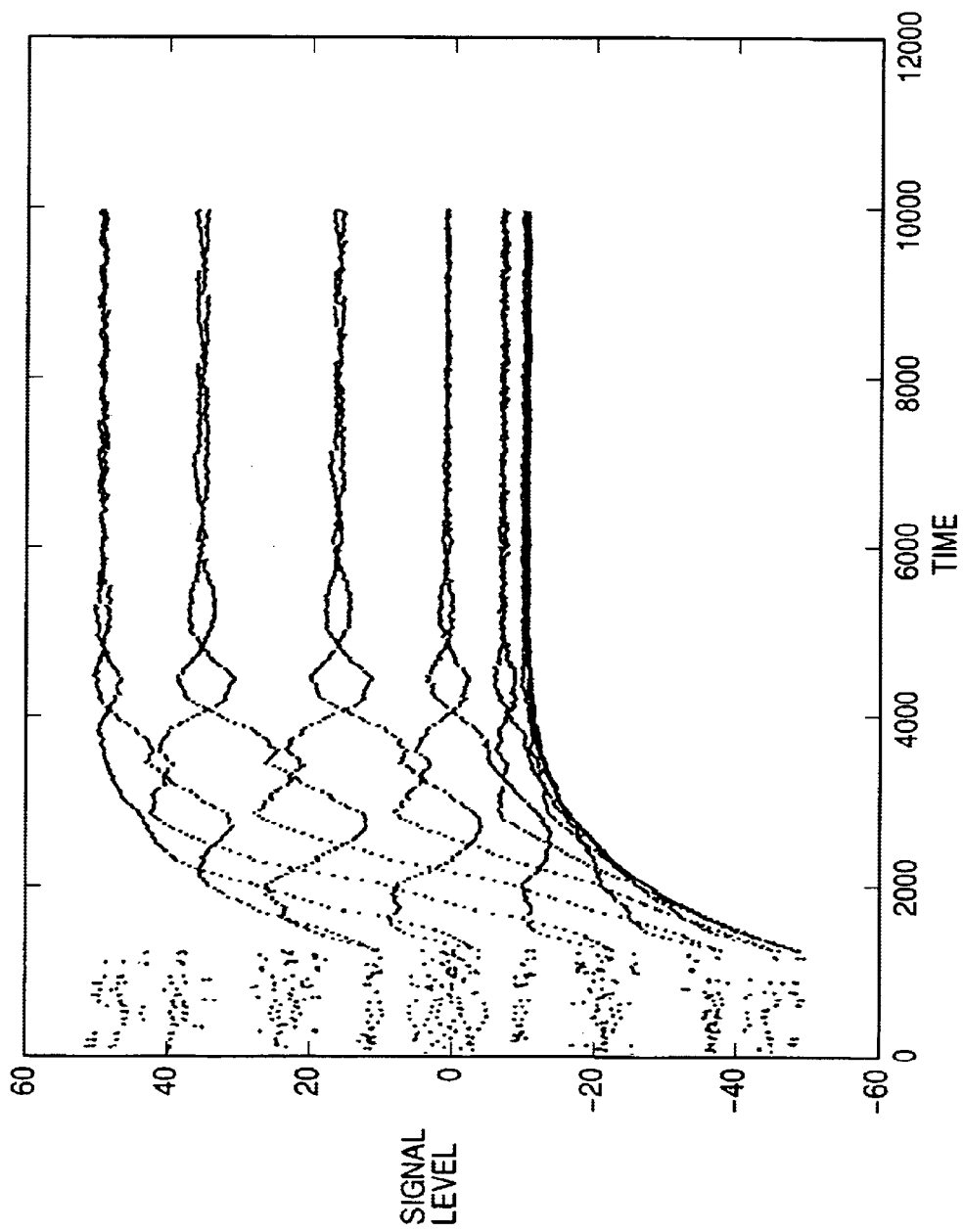
FIG. 46 is a time-domain diagram of a first example of an eye pattern formed by the output signal from a DPLL circuit.
Figure 47:
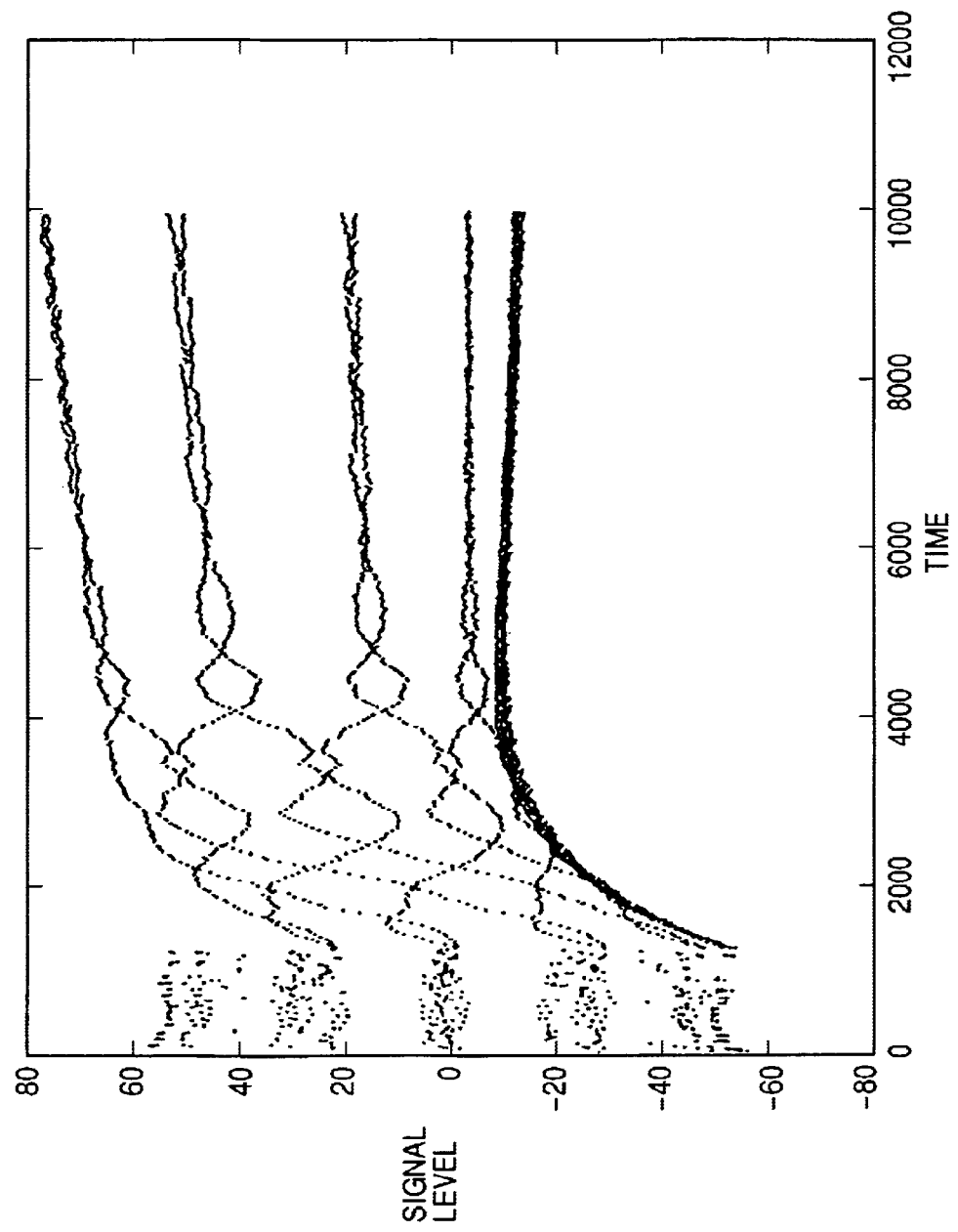
FIG. 47 is a time-domain diagram a first example of an eye pattern formed by the output signal from an equalizer.

Simulation was made as to the apparatus of FIG. 43 which was designed to implement PR-based equalization. FIG. 46 shows an example of the eye pattern formed by the output signal from the DPLL circuit 286 under the condition that the output signal of the code offset detector 73 in the error detector 6a was fixed to its OFF state (its ineffective state). The eye pattern of FIG. 46 indicates that the signal DC level greatly varied and the PLL was out of its locked-up state. FIG. 47 shows an example of the eye pattern formed by the output signal from the equalizer 281 under the condition that the output signal of the code offset detector 73 was fixed to its OFF state. The eye pattern of FIG. 47 also indicates that the signal DC level greatly varied and the PLL was out of its locked-up state.

Figure 48:
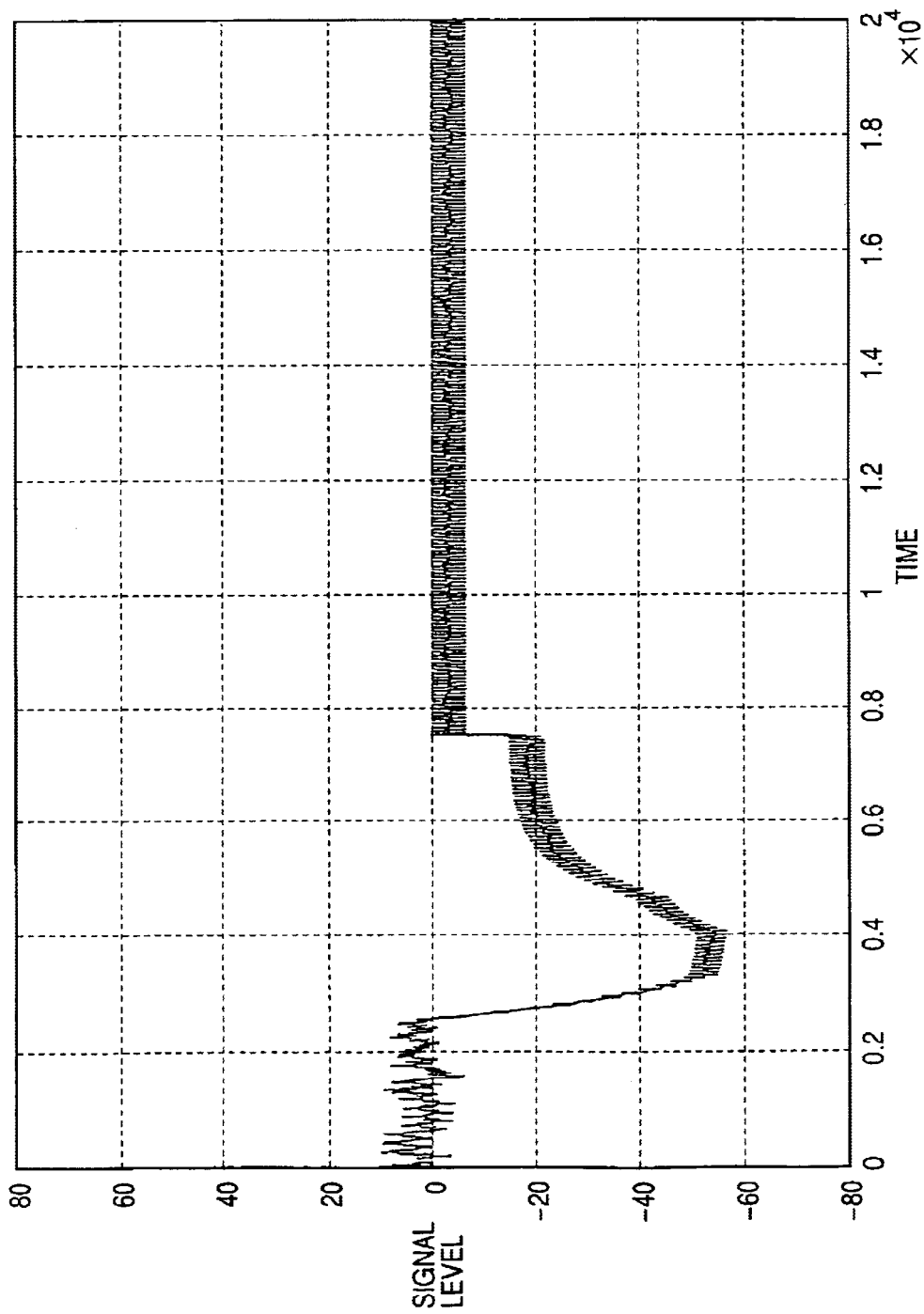
FIG. 48 is a time-domain diagram of a first example of the output signal of a D flip-flop in an error detector.
Figure 49:
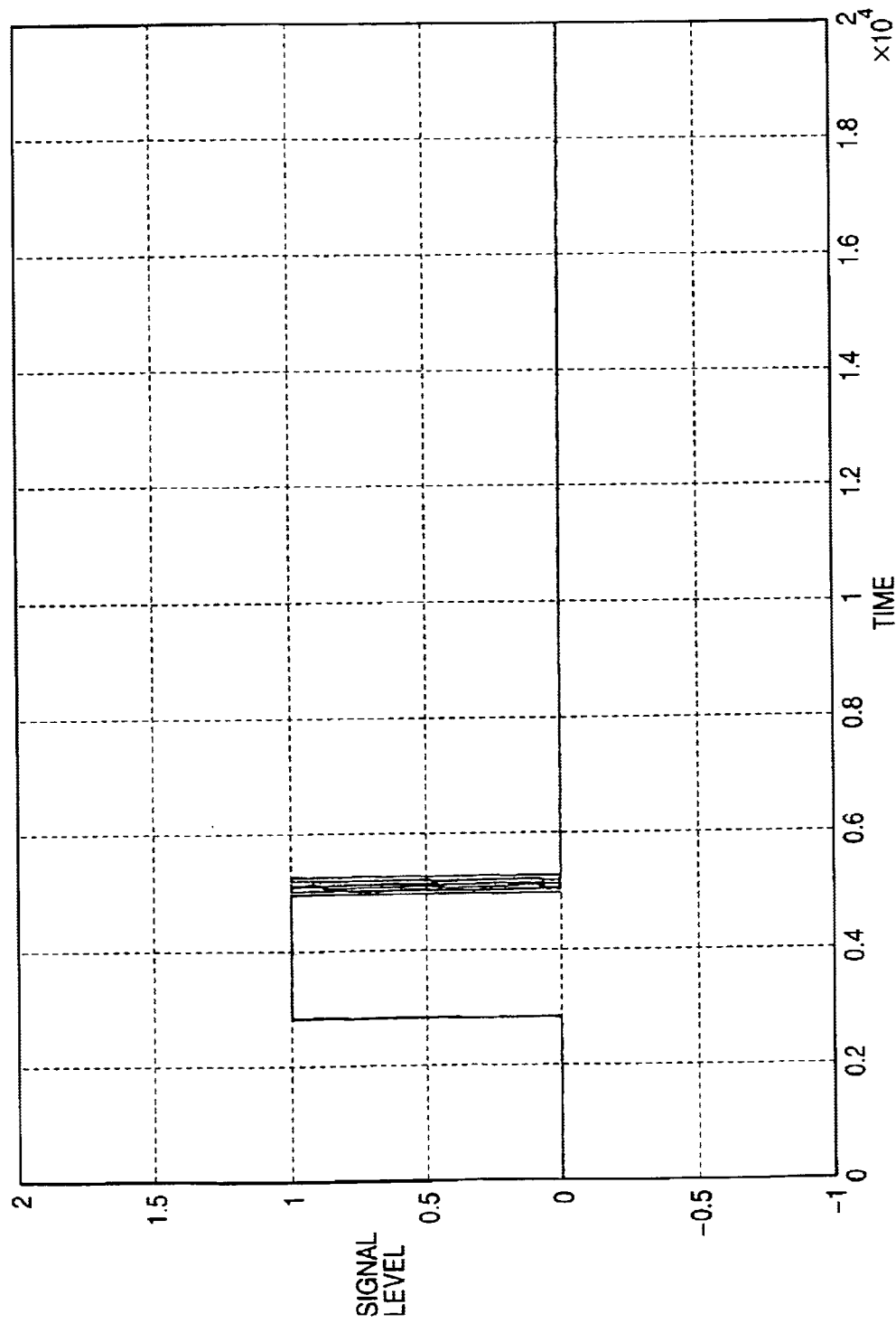
FIG. 49 is a time-domain diagram of a first example of code pattern offset information.

Simulation was made as to conditions where a reproduced analog-waveform signal representative of a binary digital signal was inputted into the apparatus of FIG. 43, and where the reproduced analog-waveform signal was changed from a state corresponding to the eye pattern of FIG. 2 to a state corresponding to the eye pattern of FIG. 5 at a time point of 2400 time units. FIG. 48 shows an example of a time-domain variation in the output signal of the D flip-flop 7312 (see FIG. 11) in the error detector 6a. The output signal of the D flip-flop 7312 varied in response to the state change of the reproduced analog-waveform signal. The absolute value represented by the output signal of the D flip-flop 7312 was relatively great during a time interval immediately following the time point of the state change of the reproduced analog-waveform signal. FIG. 49 shows an example of a time-domain variation in the code pattern offset information generated by the code offset detector 73. The code pattern offset information correctly followed the state change of the reproduced analog-waveform signal.

Twentieth Embodiment

Figure 50:
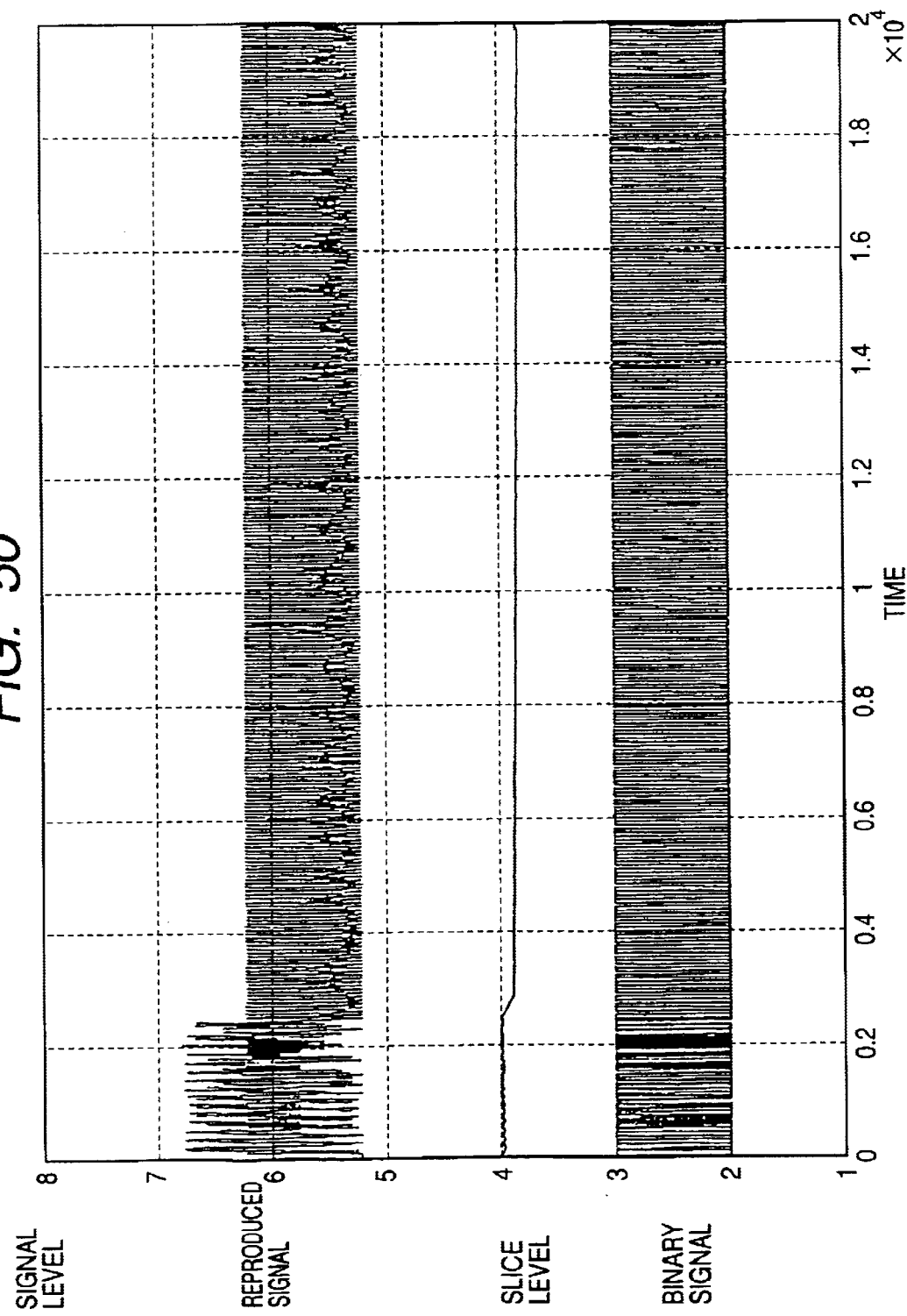
FIG. 50 is a time-domain diagram of a second example of the reproduced analog-waveform signal, the slice level, and the decoding-resultant binary signal.
Figure 51:
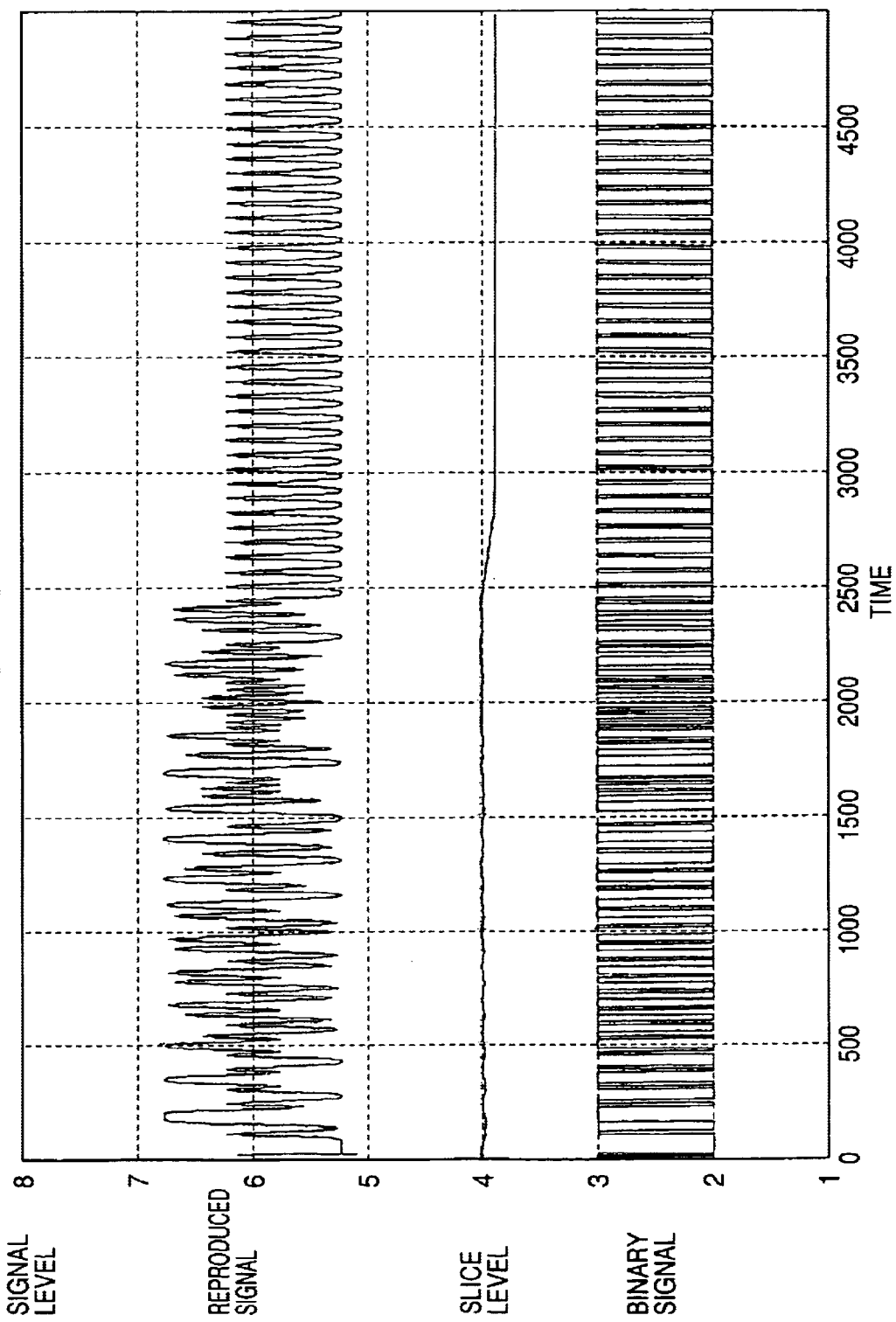
FIG. 51 is a temporally-elongated diagram of a portion of FIG. 50.

A twentieth embodiment of this invention relates to simulation which was made as to conditions where a reproduced analog-waveform signal representative of a binary digital signal was inputted into the apparatus of FIG. 42, and where the reproduced analog-waveform signal was changed from a state corresponding to the eye pattern of FIG. 2 to a state corresponding to the eye pattern of FIG. 5 at a time point of 2400 time units. FIGS. 50 and 51 show the results of the simulation which indicate time-domain variations in the reproduced analog-waveform signal, a slice level, and a decoding-resultant binary signal. In each of FIGS. 50 and 51, the abscissa denotes time, and the ordinate denotes signal level. The slice level hardly dropped in response to the state change of the reproduced analog-waveform signal. Therefore, the decoding-resultant binary signal was accurate.

Figure 52:
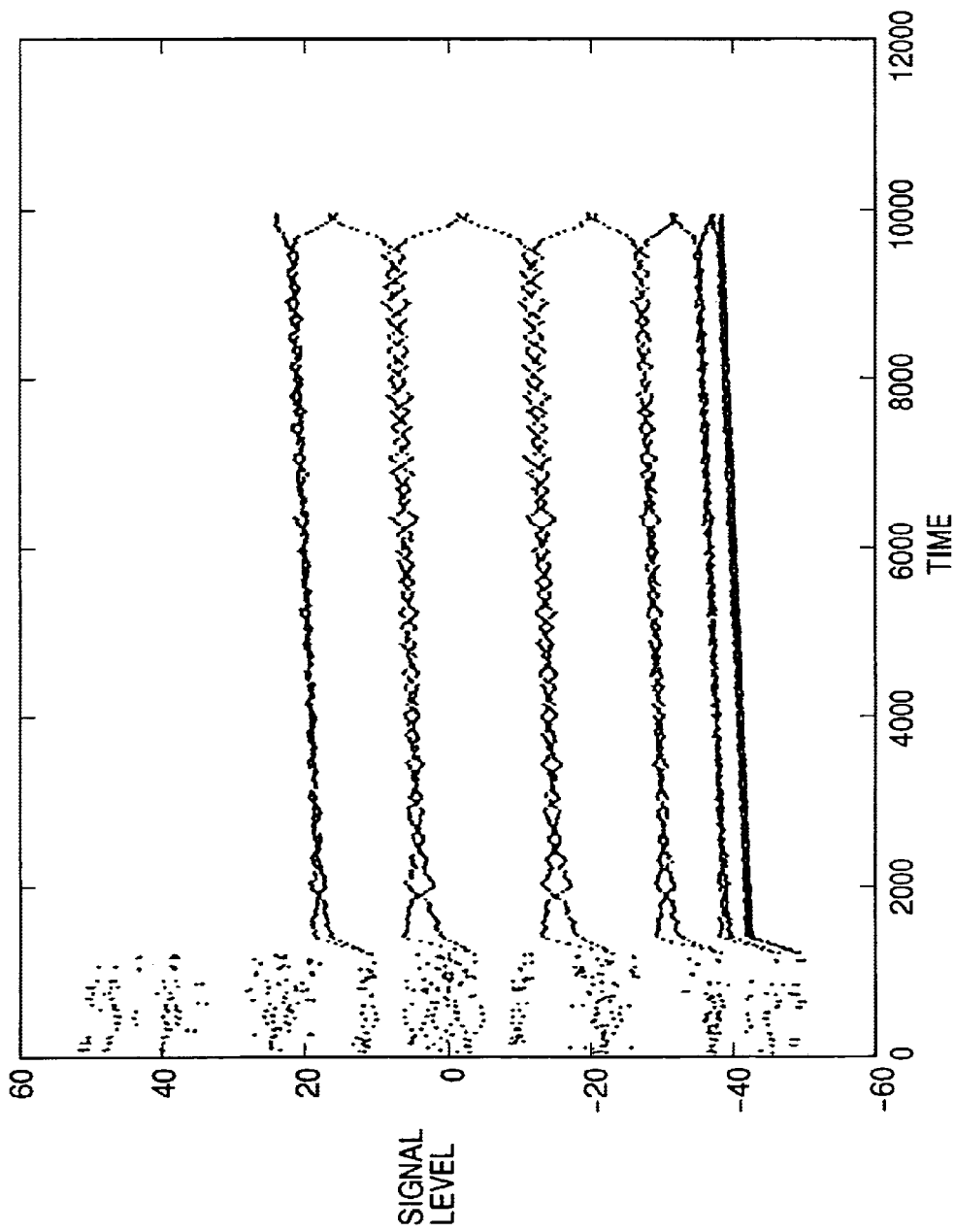
FIG. 52 is a time-domain diagram of a second example of the eye pattern formed by the output signal from the DPLL circuit.
Figure 53:
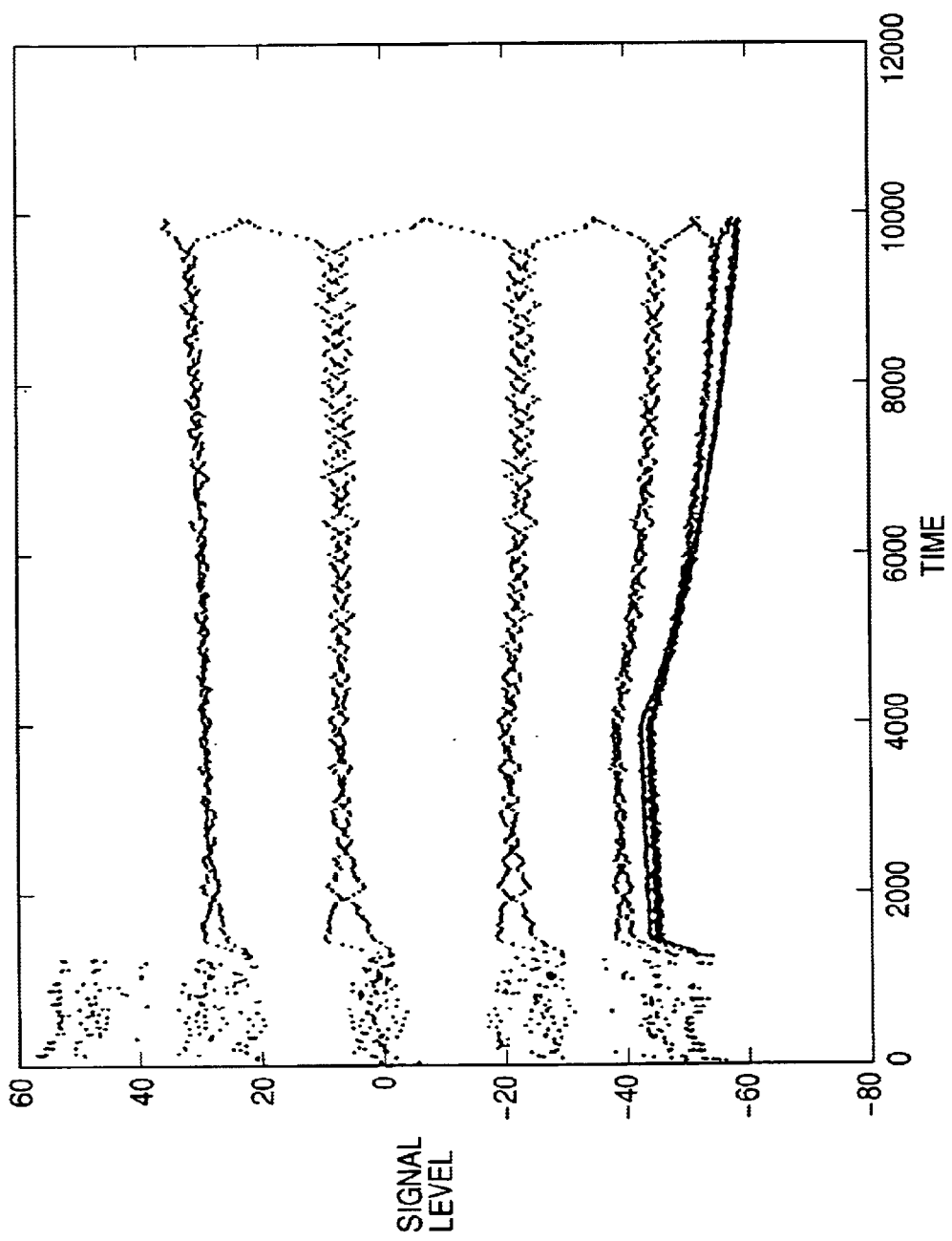
FIG. 53 is a time-domain diagram of a second example of the eye pattern formed by the output signal from the equalizer.

Simulation was made as to conditions where a reproduced analog-waveform signal representative of a binary digital signal was inputted into the apparatus of FIG. 43, and where the reproduced analog-waveform signal was changed from a state corresponding to the eye pattern of FIG. 2 to a state corresponding to the eye pattern of FIG. 5 at a time point of 2400 time units. FIG. 52 shows an example of the eye pattern formed by the output signal from the DPLL circuit 286 under the condition that the output signal of the code offset detector 73 in the error detector 6a was set to its ON state (its effective state). The eye pattern of FIG. 52 indicates that a variation in the signal DC level was suppressed and the PLL was in its locked-up state. FIG. 53 shows an example of the eye pattern formed by the output signal from the equalizer 281 under the condition that the output signal of the code offset detector 73 was set to its ON state. The eye pattern of FIG. 53 indicates that a variation in the signal DC level was suppressed and the PLL was in its locked-up state.

Figure 54:
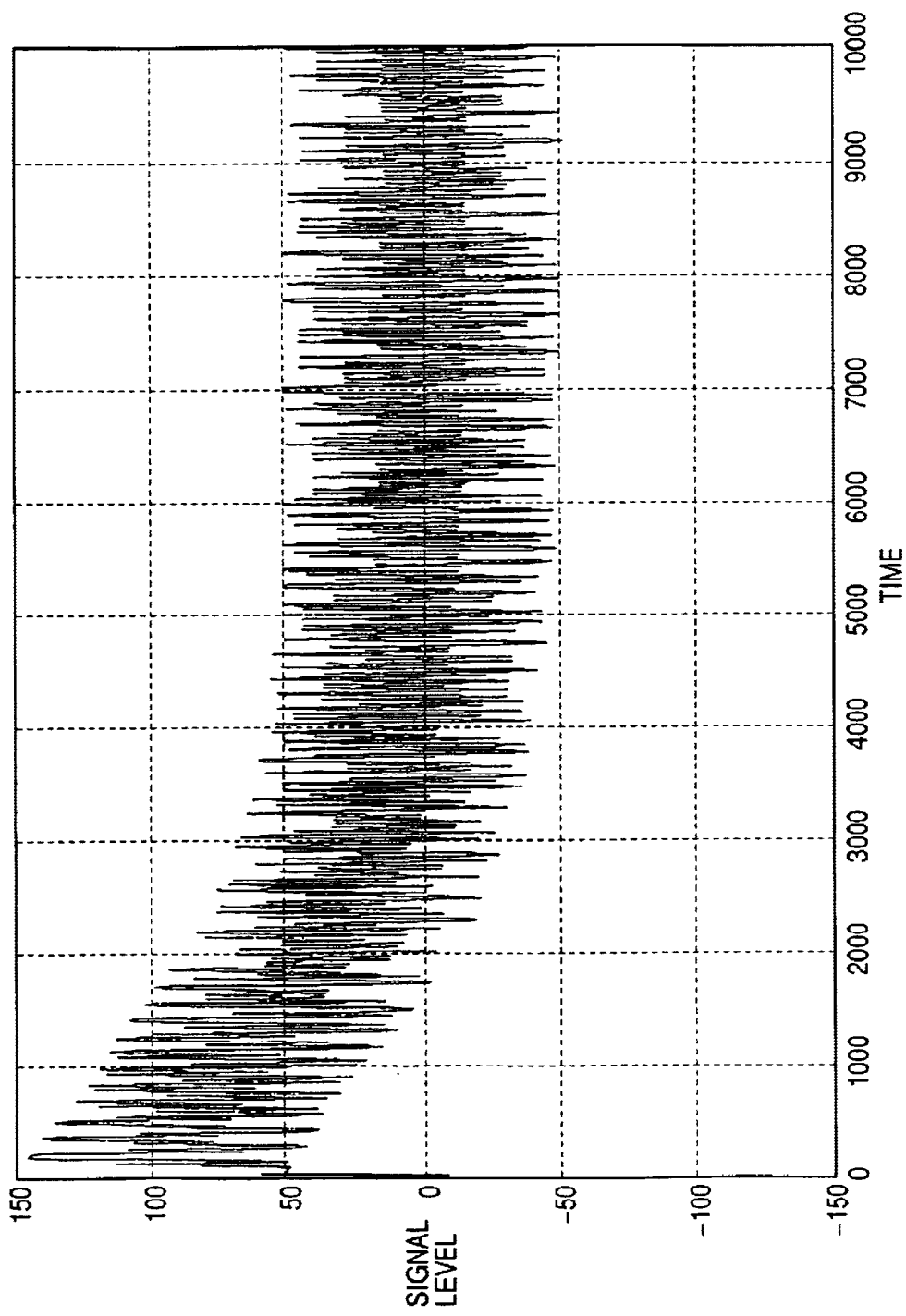
FIG. 54 is a time-domain diagram of an example of the output signal of a DC controller.
Figure 55:
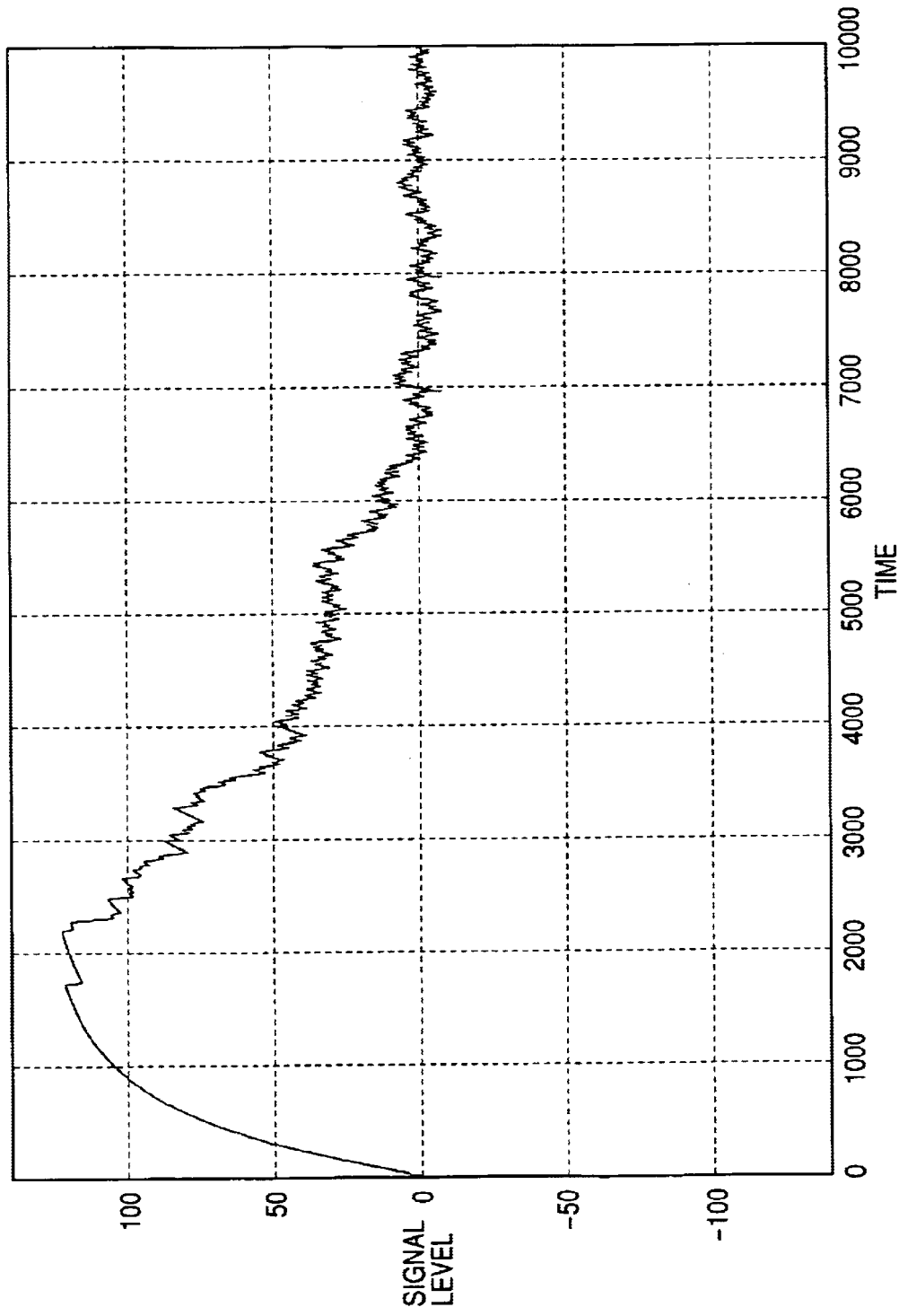
FIG. 55 is a time-domain diagram of a second example of the output signal of the D flip-flop in the error detector.
Figure 56:
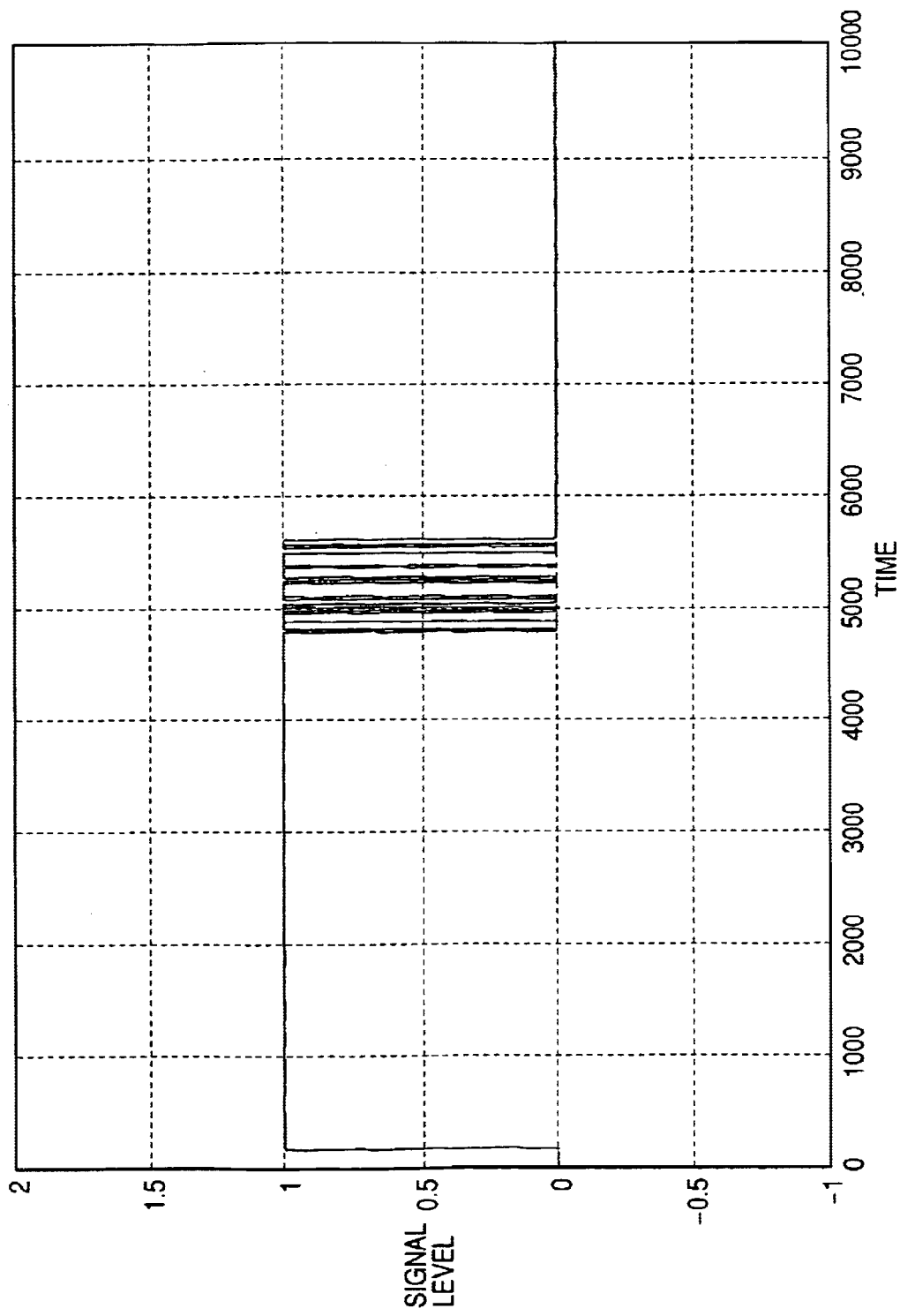
FIG. 56 is a time-domain diagram of a second example of the code pattern offset information.
Figure 57:
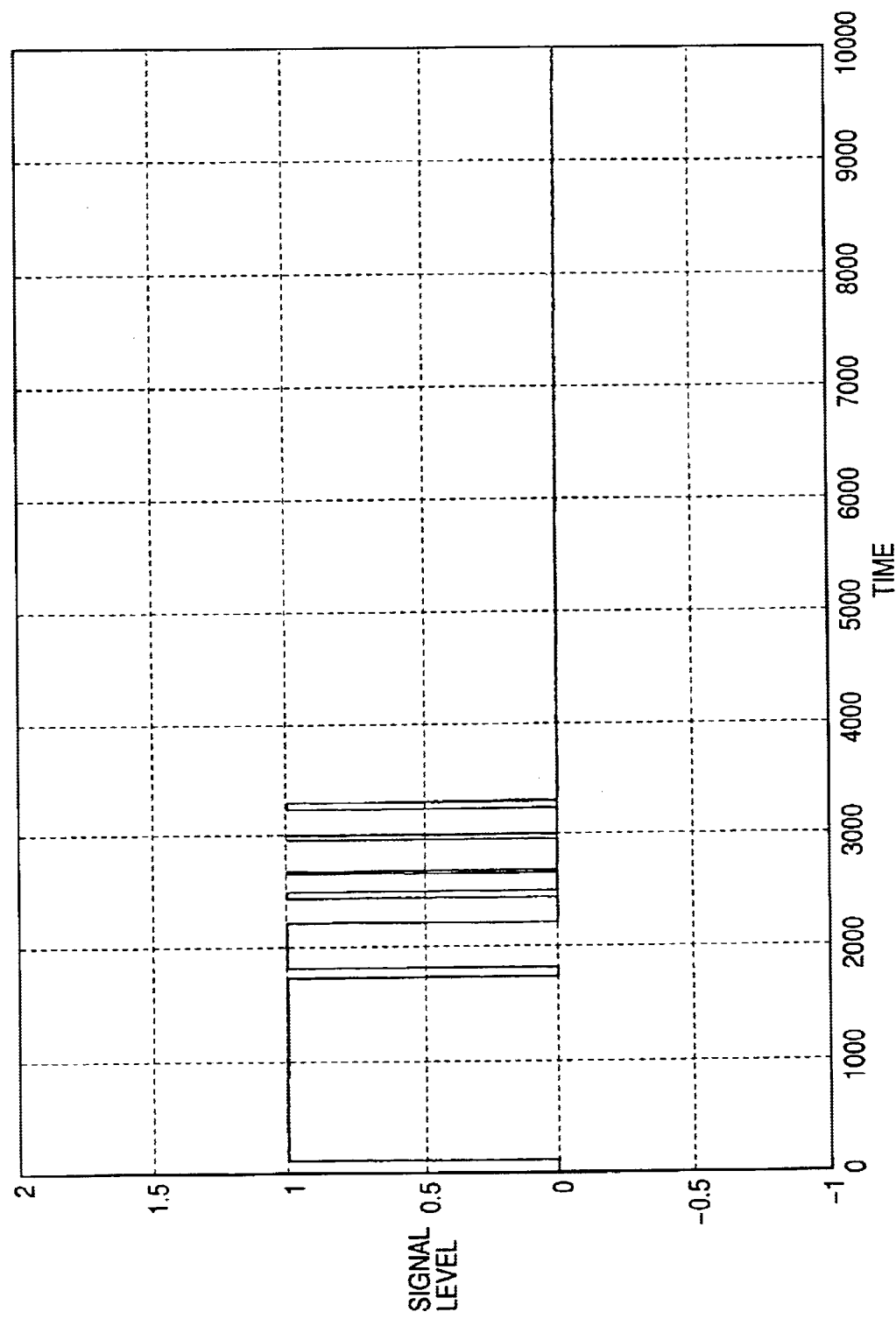
FIG. 57 is a time-domain diagram of an example of non-cross information.
Figure 58:
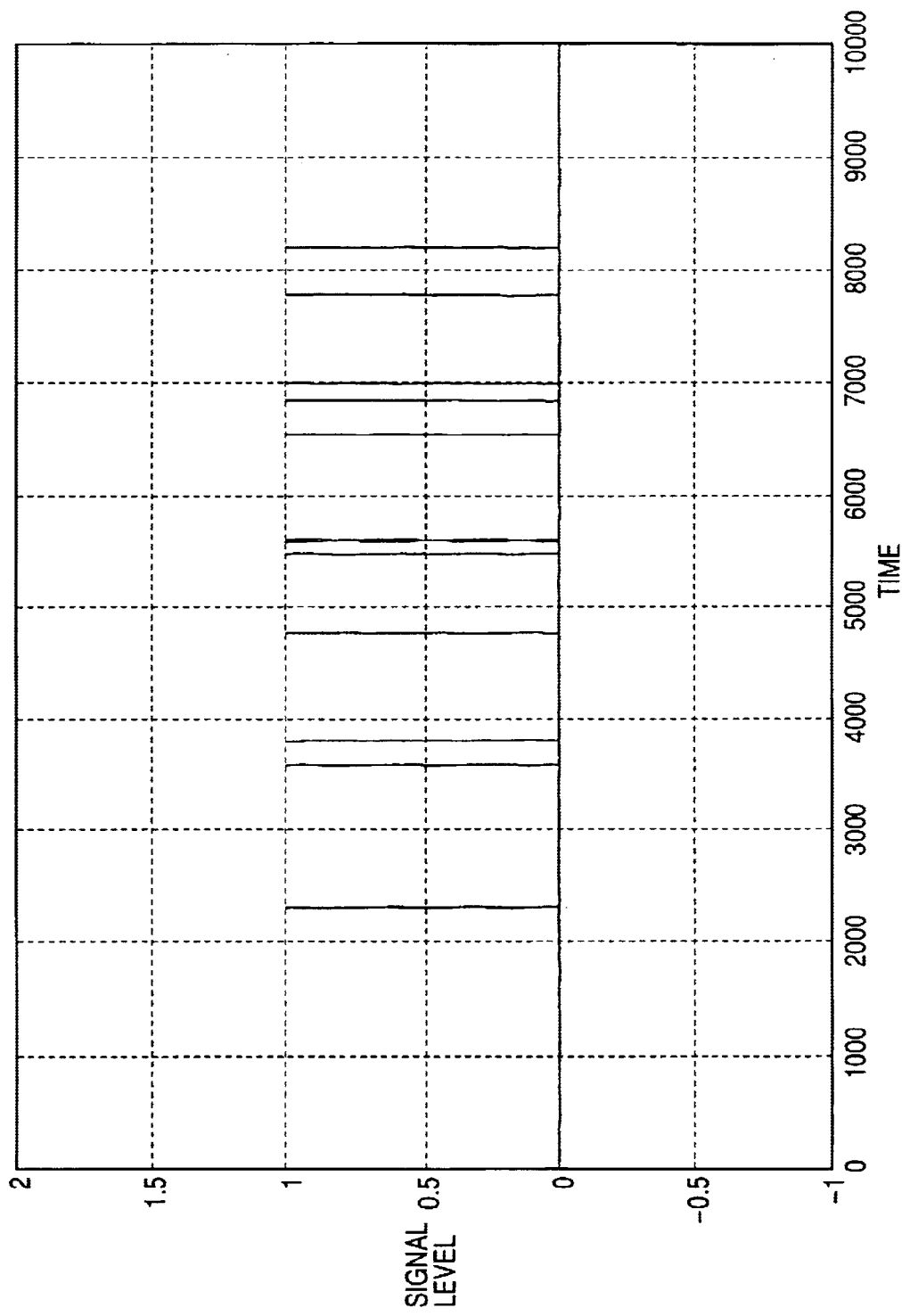
FIG. 58 is a time-domain diagram of an example of randomness information.
Figure 59:
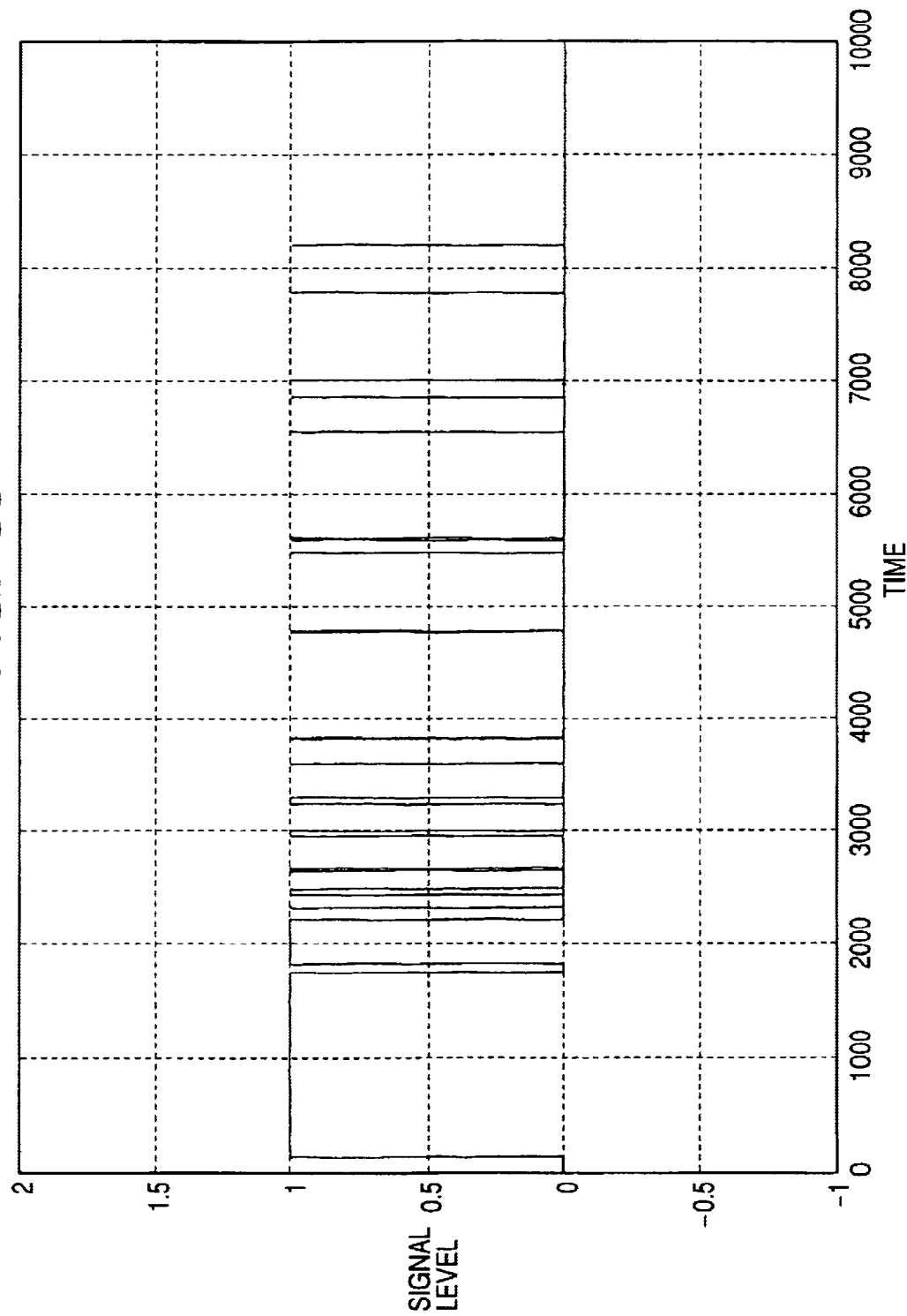
FIG. 59 is a time-domain diagram of the result of OR operation between the non-cross information in FIG. 57 and the randomness information in FIG. 58.
Figure 60:
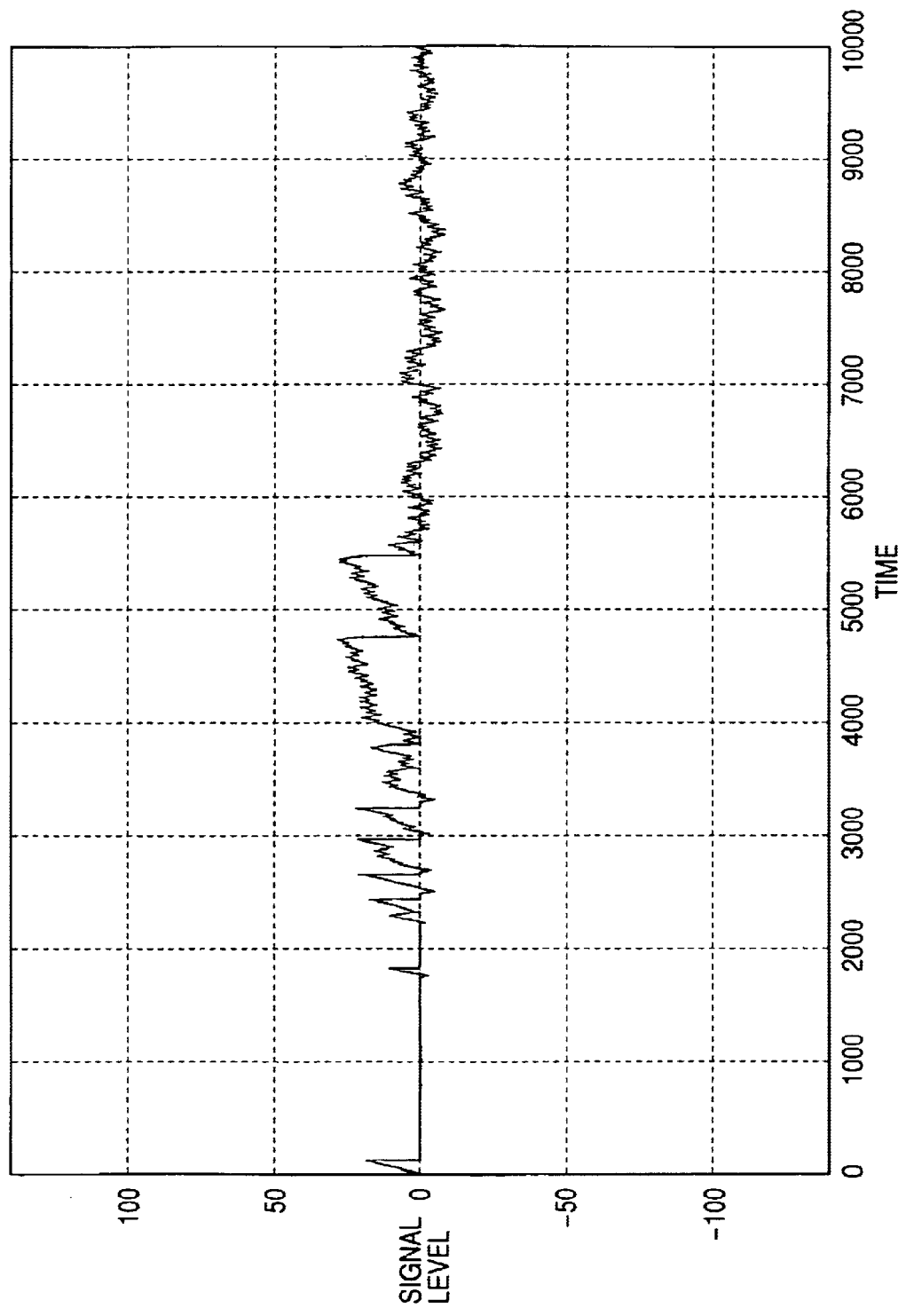
FIG. 60 is a time-domain diagram of a third example of the output signal of the D flip-flop in the error detector.

Simulation was made as to conditions where a reproduced analog-waveform signal representative of a binary digital signal of a modulation-resultant-code pattern having an appreciable positive offset (see FIG. 3) was inputted into the apparatus of FIG. 43. FIG. 54 shows an example of a time-domain variation in the output signal of the DC controller 1 which occurred when the output signal of the code offset detector 73 was fixed to its OFF state. The DC level of the output signal of the DC controller 1 converged on a proper value (that is, 0) at a time point of 6000 time units. FIG. 55 shows an example of a time-domain variation in the output signal of the D flip-flop 7312 (see FIG. 11) in the error detector 6a which occurred when the non-cross detector 733 and the randomness detector 734 (see FIG. 10) in the error detector 6a were set to their OFF states. The absolute value represented by the output signal of the D flip-flop 7312 peaked to a relatively large value before converging on a suitable value. FIG. 56 shows an example of a time-domain variation in the code pattern offset information generated by the code offset detector 73. The code pattern offset information in FIG. 56 indicates that the reproduced-signal state corresponding to the eye pattern of FIG. 3 was mistaken for that corresponding to the eye pattern of FIG. 5. FIG. 57 shows an example of a time-domain variation in the non-cross information generated by the non-cross detector 733 being in its ON state. The non-cross information in FIG. 57 indicates that non-cross states were detected in the time range from a time point of 0 time unit to a time point of 3300 time units. FIG. 58 shows an example of a time-domain variation in the randomness information generated by the randomness detector 734 being in its ON state. The randomness information in FIG. 58 indicates that random states were intermittently detected in the time range from a time point of 2300 time units to a time point of 8200 time units. FIG. 59 shows a time-domain variation in the result of OR operation between the non-cross information in FIG. 57 and the randomness information in FIG. 58. The OR operation result corresponds to the reset signal outputted from the OR circuit 7311 in FIG. 11. The OR operation result of FIG. 59 indicates that effective reset signals were intermittently generated in the time range from a time point of 0 time unit to a time point of 8200 time units, and hence the reproduced-signal state corresponding to the eye pattern of FIG. 3 was prevented from being mistaken for that corresponding to the eye pattern of FIG. 5. FIG. 60 shows an example of a time-domain variation in the output signal of the D flip-flop 7312 which occurred when the non-cross detector 733 and the randomness detector 734 were set to their ON states. The absolute value represented by the output signal of the D flip-flop 7312 remained relatively small. FIG. 61 shows an example of a time-domain variation in the code pattern offset information generated by the code offset detector 73 under the condition that the non-cross detector 733 and the randomness detector 734 were set to their ON states. The code pattern offset information in FIG. 61 remained "0", and hence the reproduced-signal state corresponding to the eye pattern of FIG. 3 was prevented from being mistaken for that corresponding to the eye pattern of FIG. 5. Accordingly, the decoding-resultant binary signal was accurate.

What is claimed is:

1. A digital signal reproducing apparatus comprising:

DC controlling means for controlling a DC level of a reproduced signal in response to a DC level control signal;

sampling means for sampling an output signal from the DC controlling means to generate a sampling-resultant signal;

filtering means for filtering the sampling-resultant signal into a filtering-resultant signal;

binarizing means for converting one of (1) the sampling-resultant signal and (2) the filtering-resultant signal into a binary signal;

DC level control signal generating means for generating the DC level control signal in response to the binary signal, and for outputting the DC level control signal to the DC controlling means;

code offset detecting means for detecting an offset in a modulation-resultant-code pattern in response to the binary signal, and for generating code pattern offset information in response to the detected offset in the modulation-resultant-code pattern;

offset-responsive controlling means for implementing one of (1) changing a response characteristic of a loop formed by the DC controlling means, the sampling means, the binarizing means, and the DC level control signal generating means and (2) suspending the DC level control by the DC controlling means in response to the code pattern offset information;

subtracting means for subtracting a DC offset signal from one of (1) the reproduced signal, (2) the sampling-resultant signal, and (3) the filtering-resultant signal to generate a subtraction-resultant signal; and DC offset extracting means for extracting low-frequency components from one of (1) the sampling-resultant signal, (2) the filtering-resultant signal, and (3) the subtraction-resultant signal as the DC offset signal, the low-frequency components corresponding to zero-cross sampling points.

2. A digital signal reproducing apparatus comprising:

first means for controlling a DC level of a reproduced signal to generate a DC-level-controlled signal in response to a DC level control signal;

second means for generating a binary signal in response to the DC-level-controlled signal generated by the first means, the binary signal representing a stream of bits each being "0" or "1";

third means for generating the DC level control signal in response to the binary signal generated by the second means, and for feeding the DC level control signal to the first means; and fourth means for suppressing a variation in the DC level control signal which responds to a difference in number between bits of "0" and bits of "1" in the bit stream represented by the binary signal.

* * * * *